United States Patent
Park et al.

(10) Patent No.: US 10,062,841 B2
(45) Date of Patent: Aug. 28, 2018

(54) MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Il-mok Park, Seoul (KR); Gwan-hyeob Koh, Seoul (KR); Dae-hwan Kang, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/362,906

(22) Filed: Nov. 29, 2016

(65) Prior Publication Data

US 2017/0244030 A1    Aug. 24, 2017

(30) Foreign Application Priority Data

Feb. 23, 2016   (KR) .................. 10-2016-0021318

(51) Int. Cl.
*H01L 45/00* (2006.01)
*H01L 27/24* (2006.01)

(52) U.S. Cl.
CPC ...... *H01L 45/1233* (2013.01); *H01L 27/2427* (2013.01); *H01L 27/2481* (2013.01); *H01L 45/06* (2013.01); *H01L 45/126* (2013.01); *H01L 45/1253* (2013.01); *H01L 45/141* (2013.01); *H01L 45/144* (2013.01); *H01L 45/1675* (2013.01); *H01L 45/1683* (2013.01)

(58) Field of Classification Search
CPC .................................................. H01L 45/1233
USPC .............................................................. 257/4
See application file for complete search history.

(56) References Cited

U.S. PATENT DOCUMENTS

| 8,404,514 | B2 | 3/2013 | Lee et al. | |
|---|---|---|---|---|
| 8,716,098 | B1 * | 5/2014 | Herner | H01L 45/085 257/324 |
| 9,153,777 | B2 | 10/2015 | Boniardi et al. | |
| 9,166,158 | B2 | 10/2015 | Lengade et al. | |
| 2012/0009758 | A1 | 1/2012 | Chang | |

(Continued)

FOREIGN PATENT DOCUMENTS

| KR | 10-2012-0133679 A | 12/2012 |
|---|---|---|
| KR | 10-2013-0135603 A | 12/2013 |

*Primary Examiner* — Moazzam Hossain
*Assistant Examiner* — Warren H Kilpatrick
(74) *Attorney, Agent, or Firm* — Lee & Morse, P.C.

(57) ABSTRACT

A memory device including first conductive lines spaced apart from each other and extending in a first direction; second conductive lines spaced apart from each other and extending in a second direction that is different from the first direction; first memory cells having a structure that includes a selection device layer, a middle electrode layer, a variable resistance layer, and a top electrode layer; and insulating structures arranged alternately with the first memory cells in the second direction under the second conductive lines, wherein the first insulating structures have a top surface that is higher than a top surface of the first top electrode layer, and the second conductive lines have a structure that includes convex and concave portions, the convex portions being connected to the top surface of the top electrode layer and the concave portions accommodating the insulating structures between the convex portions.

27 Claims, 46 Drawing Sheets

(56) References Cited

U.S. PATENT DOCUMENTS

| | | | |
|---|---|---|---|
| 2013/0171741 A1* | 7/2013 | Hwang | .................. H01L 43/12 438/3 |
| 2013/0320290 A1 | 12/2013 | Park et al. | |
| 2014/0374686 A1 | 12/2014 | Pangal et al. | |
| 2015/0162532 A1 | 6/2015 | Lim et al. | |
| 2015/0179932 A1 | 6/2015 | Brightsky et al. | |
| 2015/0280117 A1 | 10/2015 | Boniardi et al. | |
| 2016/0020393 A1 | 1/2016 | Park et al. | |

\* cited by examiner

MEMORY DEVICE AND METHOD OF MANUFACTURING THE SAME

CROSS-REFERENCE TO RELATED APPLICATION

Korean Patent Application No. 10-2016-0021318, filed on Feb. 23, 2016, in the Korean Intellectual Property Office, and entitled: "Memory Device and Method of Manufacturing the Same," is incorporated by reference herein in its entirety.

BACKGROUND

1. Field

Embodiments relate to a memory device and a method of manufacturing the same.

2. Description of the Related Art

To meet the increasing demand for lightweight and small electronic products, it may be desirable to realize a highly-integrated semiconductor device. A 3D cross-point stack memory device in which a memory cell is located at a cross point between two intersecting electrodes has been considered.

SUMMARY

The embodiments may be realized by providing a memory device including a plurality of first conductive lines on a substrate, the first conductive lines being spaced apart from each other and extending in a first direction; a plurality of second conductive lines on the plurality of first conductive lines, the second conductive lines being spaced apart from each other and extending in a second direction that is different from the first direction; a plurality of first memory cells respectively arranged at a plurality of cross points between the plurality of first conductive lines and the plurality of second conductive lines, each of the first memory cells having a structure that includes a first selection device layer, a first middle electrode layer, a first variable resistance layer, and a first top electrode layer sequentially stacked in this stated order; and a plurality of first insulating structures arranged alternately with the plurality of first memory cells in the second direction under the plurality of second conductive lines, wherein each of the first insulating structures has a top surface that is higher than a top surface of the first top electrode layer, and each of the second conductive lines has a structure that includes a plurality of convex portions and a plurality of concave portions, the plurality of convex portions being connected to the top surface of the first top electrode layer and the plurality of concave portions accommodating the first insulating structures between the plurality of convex portions.

The embodiments may be realized by providing a memory device including a plurality of first conductive lines on a substrate, the first conductive lines being spaced apart from each other and extending in a first direction; a plurality of second conductive lines on the plurality of first conductive lines, the second conductive lines being spaced apart from each other and extending in a second direction different from the first direction; and a plurality of first memory cells respectively arranged at a plurality of cross points between the plurality of first conductive lines and the plurality of second conductive lines, each of the plurality of first memory cells having a structure that includes a first selection device layer, a first middle electrode layer, a first variable resistance layer, and a first top electrode layer sequentially stacked in this stated order, wherein a thickness of the first top electrode layer is greater than a thickness of the first middle electrode layer.

The embodiments may be realized by providing a method of manufacturing a memory device, the method including forming a first electrode layer on a substrate; forming a first memory cell stack structure on the first electrode layer such that the first memory cell stack structure includes a first selection device layer, a first middle electrode layer, a first variable resistance layer, and a first top electrode layer; forming a plurality of first memory cell stack lines and a plurality of first conductive lines by patterning the first memory cell stack structure and the first electrode layer such that the plurality of first memory cell stack lines and the plurality of first conductive lines extend in a first direction with a plurality of first gaps respectively formed between every two adjacent first memory cell stack lines and first conductive lines; forming a plurality of first insulation lines filling the plurality of first gaps such that the plurality of first insulation lines have top surfaces that are higher than top surfaces of the plurality of first memory cell stack lines; forming a second electrode layer on the plurality of first memory cell stack lines and the plurality of first insulation lines; and forming a plurality of second conductive lines, a plurality of first memory cells, and a plurality of first insulating structures by patterning the second electrode layer, the plurality of first memory cell stack lines, and the plurality of first insulation lines such that the plurality of second conductive lines extend in a second direction different from the first direction, the plurality of first memory cells are respectively arranged at a plurality of cross points between the plurality of first conductive lines and the plurality of second conductive lines, and the plurality of first insulating structures are arranged alternately with the plurality of first memory cells under the plurality of second conductive lines, wherein top surfaces of the plurality of first insulating structures are higher than top surfaces of the plurality of first memory cells.

The embodiments may be realized by providing a memory device including a plurality of first conductive lines on a substrate, the first conductive lines being spaced apart from each other and extending in a first direction; a plurality of second conductive lines on the plurality of first conductive lines, the second conductive lines being spaced apart from each other and extending in a second direction that is different from the first direction; a plurality of first memory cells respectively arranged at a plurality of cross points between the plurality of first conductive lines and the plurality of second conductive lines, each of the first memory cells having a structure that includes a first selection device layer, a first middle electrode layer, a first variable resistance layer, and a first top electrode layer sequentially stacked in this stated order; and a plurality of first insulating structures arranged alternately with the plurality of first memory cells in the second direction under the plurality of second conductive lines, wherein a distance, in a third direction, from the substrate to distal surfaces of the first insulating structures is greater than a distance from the substrate to an interface between the first variable resistance layer and the first top electrode layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
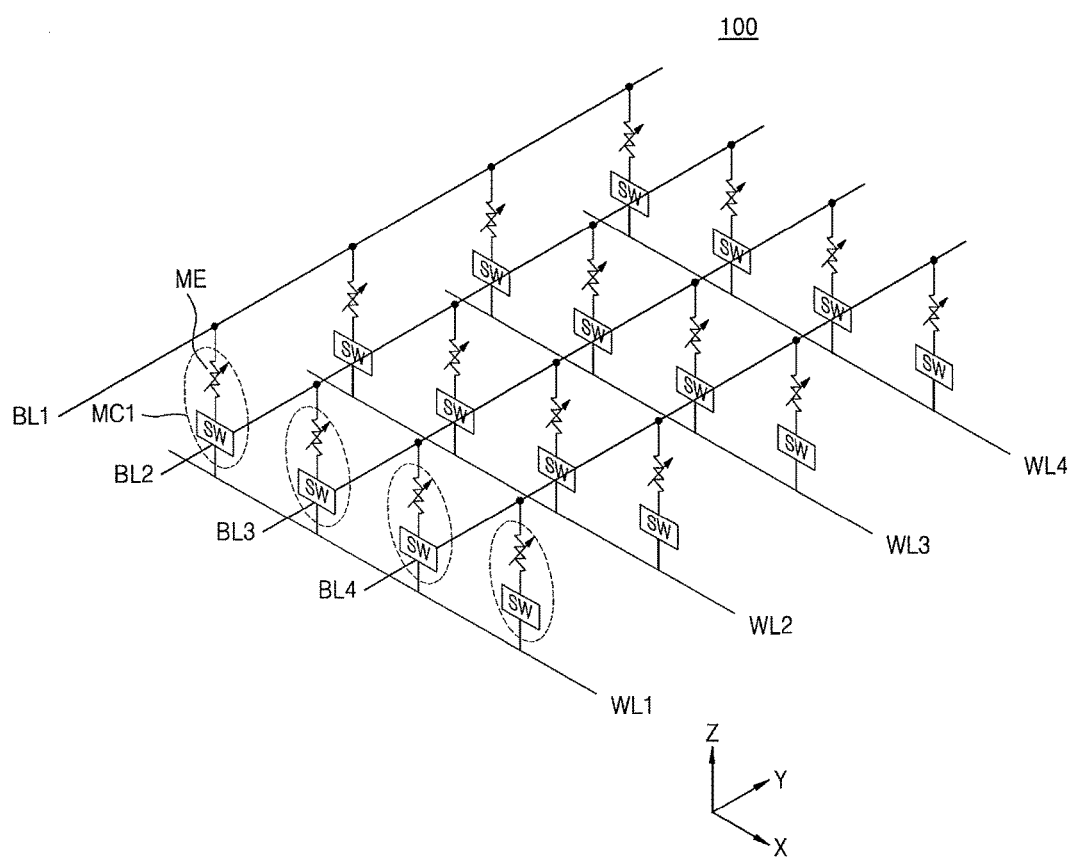
FIG. 1 illustrates an equivalent circuit diagram of a memory device according to an embodiment.

FIG. 1 illustrates an equivalent circuit diagram of a memory device 100 according to an embodiment. Referring to FIG. 1, the memory device 100 may include word lines WL1, WL2, WL3, and WL4, which extend in a first direction X and are spaced apart from each other in a second direction Y perpendicular to the first direction X, and bit lines BL1, BL2, BL3, and BL4, which are spaced apart from the word lines WL1, WL2, WL3, and WL4 in a third direction Z perpendicular to the first direction X and extend in the second direction Y.

A memory cell MC1 may be disposed between the bit lines BL1, BL2, BL3, and BL4 and the word lines WL1, WL2, WL3, and WL4, respectively. For example, a plurality of memory cells MC1 may be respectively disposed at a plurality of cross points between the bit lines BL1, BL2, BL3, and BL4 and the word lines WL1, WL2, WL3, and WL4, and thus, the memory cells MC1 may form a cross-point array structure. The memory cell MC1 may include a variable resistance layer ME for storing information and a selection device layer SW for selecting a memory cell. The selection device layer SW may be referred to as a switching device layer or an access device layer. The selection device layer SW may be electrically connected to the word line WL1, the variable resistance layer ME may be electrically connected to the bit line BL1, and the variable resistance layer ME and the selection device layer SW may be serially connected to each other.

Hereinafter, a method of driving the memory device 100 will be briefly described. A voltage may be applied to the variable resistance layer ME of the memory cell MC1 through the bit lines BL1, BL2, BL3, and BL4, and thus, a current may flow in the variable resistance layer ME. For example, the variable resistance layer ME may include a phase change material layer which may be reversibly shifted between a first state and a second state. In an implementation, the variable resistance layer ME may include a variable resistor whose resistance value varies according to a voltage applied thereto. For example, in the memory cell MC1 that is selected, a resistance of the variable resistance layer ME may be reversibly shifted between the first state and the second state according to a voltage applied to the variable resistance layer ME.

Based on a resistance change of the variable resistance layer ME, the memory cell MC1 may store digital information such as 0 or 1, and the digital information may be erased from the memory cell MC1. For example, data may be written as a high resistance state "0" and a low resistance state "1" in the memory cell MC1. Here, writing from the high resistance state "0" to the low resistance state "1" may be referred to as a set operation, and writing from the low resistance state "1" to the high resistance state "0" may be referred to as a reset operation. In an implementation, the memory cell MC1 according to embodiments may store various resistance states.

Any memory cell MC1 may be addressed by selecting the word lines WL1, WL2, WL3, and WL4 and the bit lines BL1, BL2, BL3, and BL4 and may be programmed by applying certain signals between the word lines WL11, WL12, WL21 and WL22 and the bit lines BL1, BL2, BL3, and BL4. In addition, information based on a resistance value of a variable resistance layer ME of the addressed memory cell MC1, that is, information programmed in the addressed memory cell MC1, may be read out by measuring a current value through the bit lines BL1, BL2, BL3, and BL4.

Figure 2:
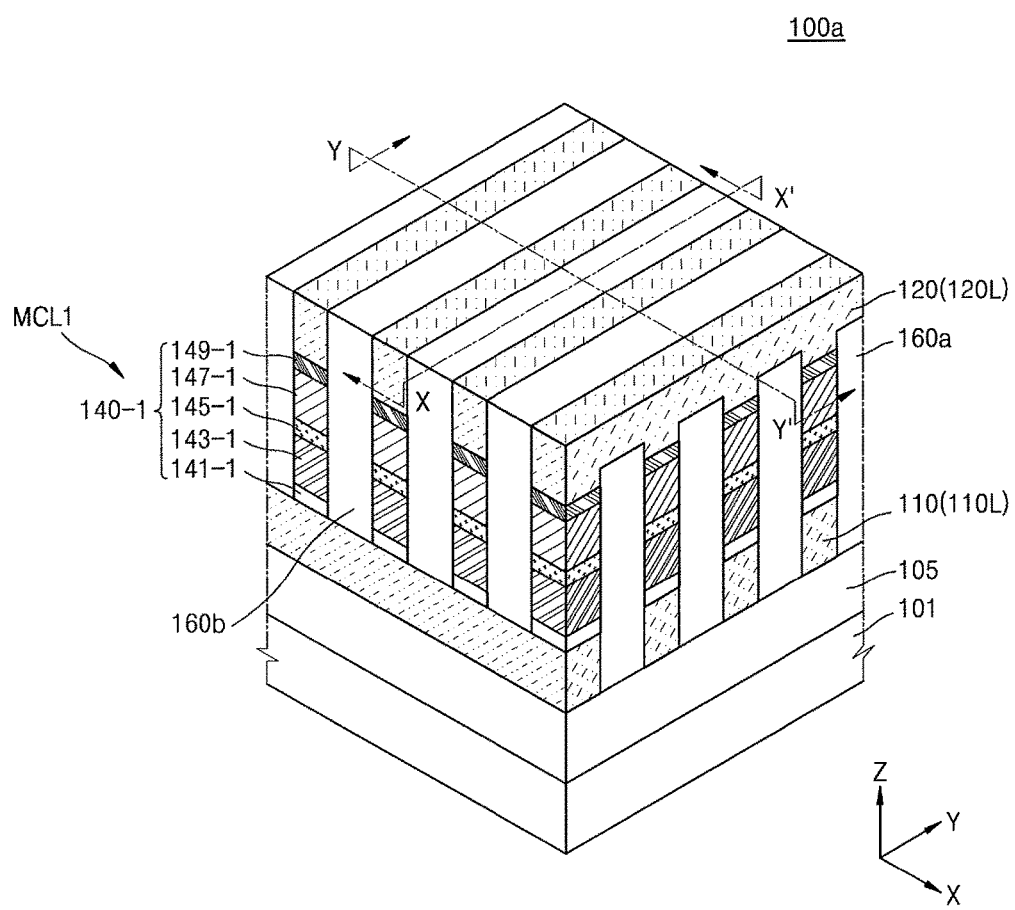
FIG. 2 illustrates a perspective view of a memory device according to an embodiment.

FIG. 2 illustrates a perspective view of a memory device 100a according to an embodiment.

Figure 3:
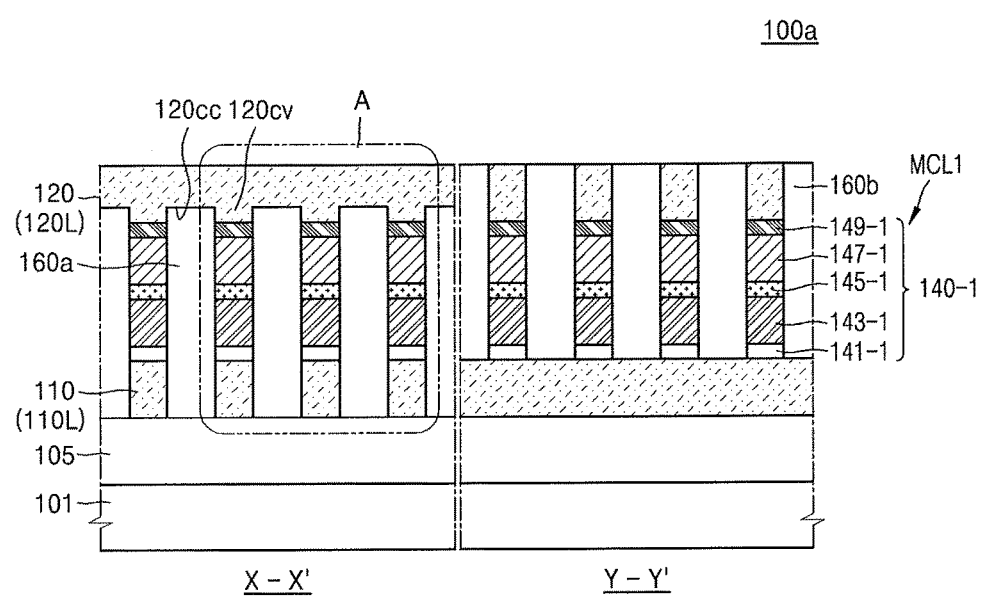
FIG. 3 illustrates a cross-sectional view taken along line X-X' and line Y-Y' of FIG. 2.

FIG. 3 illustrates a cross-sectional view taken along line X-X' and line Y-Y' of FIG. 2. Referring to FIGS. 2 and 3, the memory device 100a may include a first conductive line layer 110L on a substrate 101, a second conductive line layer 120L on the first conductive line layer 110L, a memory cell layer MCL1 between the first conductive line layer 110L and the second conductive line layer 120L, and insulation structures 160a and 160b between, e.g., laterally adjacent to, a plurality of memory cells 140-1 forming the memory cell layer MCL1.

In an implementation, an interlayer insulation layer 105 may be disposed on the substrate 101. The interlayer insulation layer 105 may electrically insulate the first conductive line layer 110L from the substrate 101. In an implementation, an integrated circuit layer may be disposed on the substrate 101, and memory cells may be disposed on the integrated circuit layer. For example, the memory device 100a may have a Cell On Peripheral (COP) structure in which an integrated circuit layer including a peripheral circuit and/or a core circuit is disposed on a substrate and memory cells are disposed on the integrated circuit layer. The interlayer insulation layer 105 may include an oxide, e.g., silicon oxide or the like, or a nitride, e.g., silicon nitride or the like.

The first conductive line layer 110L may be formed on the interlayer insulation layer 105 or on the substrate 101. The first conductive line layer 110L may include a plurality of first conductive lines 110 that extend in parallel in a first direction (the X direction) and are spaced apart from each other (e.g., in a second, Y, direction). The second conductive line layer 120L may include a plurality of second conductive lines 120 that extend in parallel in the second direction (the Y direction) perpendicular to the first direction and are spaced apart from each other (e.g., in the first, X, direction). The plurality of first conductive lines 110 and the plurality of second conductive lines 120 may intersect each other, e.g., in a plan view. The plurality of second conductive lines 120 may have a structure in which a plurality of convex portions 120cv and a plurality of concave portions 120cc are alternately arranged. Details will be described below.

In terms of driving of the memory device 100a, in an implementation, the first conductive lines 110 may correspond to the word lines WL1, WL2, WL3, WL4 of FIG. 1, and the second conductive lines 120 may correspond to the bit lines BL1, BL2, BL3, and BL4 of FIG. 1. In an implementation, the first conductive lines 110 may correspond to the bit lines BL1, BL2, BL3, and BL4 of FIG. 1, and the second conductive lines 120 may correspond to the word lines WL1, WL2, WL3, and WL4 of FIG. 1.

The first conductive lines 110 and the second conductive lines 120 may each independently include, e.g., a metal, a conductive metal nitride, a conductive metal oxide, or a combination thereof. In an implementation, the first conductive lines 110 and the second conductive lines 120 may each independently include, e.g., tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof, or a combination thereof. In an implementation, the first conductive lines 110 and the second conductive lines 120 may each include a metal layer and a conductive barrier layer covering at least a portion of the metal layer. The conductive barrier layer may include, e.g., titanium (Ti), titanium nitride (TiN), tantalum (Ta), tantalum nitride (TaN), or a combination thereof.

The memory cell layer MCL1 may include the plurality of memory cells 140-1 that are spaced apart from each other in the first direction and the second direction. The memory cells 140-1 may be respectively disposed at cross points between the first conductive lines 110 and the second conductive lines 120. The plurality of memory cells 140-1 may form a cross-point array structure. The memory cells 140-1 may be formed in a pillar structure having a tetragonal pillar shape. In an implementation, the memory cells 140-1 may have various pillar shapes such as a circular pillar, an elliptical pillar, a polygonal pillar, and the like. In an implementation, depending on a forming method, the memory cells 140-1 may have a structure where a lower portion is wider than an upper portion, or may have a structure where an upper portion is wider than a lower portion. For example, when the memory cells 140-1 is formed through a positive etching process, the memory cells 140-1 may have a structure where a lower portion is wider than an upper portion. When the memory cells 140-1 is formed by a damascene process, the memory cells 140-1 may have a structure where an upper portion is wider than a lower portion. In the embossment etching process or the damascene process, by precisely controlling etching, material layers may be etched in order for a side surface of the structure to be approximately perpendicular to a top surface of the substrate 101, and there may be hardly a width difference between an upper portion and a lower portion of the structure. In an implementation, the side surface of the structure may be perpendicular to the top surface of the substrate 101 as illustrated in FIGS. 2 and 3. In an implementation, the memory cells 140-1 may have a structure where a lower portion is wider than an upper portion, or may have a structure where an upper portion is wider than a lower portion.

The memory cells 140-1 may each have a structure in which a bottom electrode layer 141-1, a selection device layer 143-1, a middle electrode layer 145-1, a variable resistance layer 147-1, and a top electrode layer 149-1 are stacked in this stated order. The top electrode layer 149-1 may be a heating electrode layer. The bottom electrode layer 141-1 and the middle electrode layer 145-1 may each be a layer that functions as a current path, and may each include a conductive material. In an implementation, the bottom electrode layer 141-1 and the middle electrode layer 145-1 may each independently include, e.g., a metal, a conductive metal nitride, a conductive metal oxide, or a combination thereof. In an implementation, the bottom electrode layer 141-1 and the middle electrode layer 145-1 may each include, e.g., a TiN layer. In an implementation, the bottom electrode layer 141-1 and the middle electrode layer 145-1 may each include a conductive layer, including metal or conductive metal nitride, and at least one conductive barrier layer covering at least a portion of the conductive layer. In an implementation, the conductive barrier layer may include, e.g., a metal oxide, a metal nitride, or a combination thereof.

The top electrode layer 149-1 may be disposed on the variable resistance layer 147-1 and thus may function as a heating electrode layer. For example, the top electrode layer 149-1 may heat the variable resistance layer 147-1 in a set operation or a reset operation. The top electrode layer 149-1 may include a conductive material that generates heat sufficient to phase-change the variable resistance layer 147-1 without reacting with the variable resistance layer 147-1. In an implementation, the top electrode layer 149-1 may include a refractory metal, e.g., TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), silicon carbide (SiC), silicon carbon nitride (SiCN), carbon nitride (CN), titanium carbon nitride (TiCN), tantalum carbon nitride (TaCN), or a combination thereof, or a nitride thereof.

The selection device layer 143-1 may be a current control layer for controlling a flow of a current. The selection device layer 143-1 may correspond to the selection device layer SW of FIG. 1. The selection device layer 143-1 may include a material layer having a resistance that varies according to a level of a voltage applied across both ends of the selection device layer 143-1. For example, the selection device layer 143-1 may include a material layer having Ovonic threshold switching (OTS) characteristics. To briefly describe a function of the selection device layer 143-1 based on an OTS material layer, when a voltage lower than a threshold voltage Vt is applied to the selection device layer 143-1, the selection device layer 143-1 may be in the high resistance state where a current hardly flows, and when a voltage higher than the threshold voltage Vt is applied to the selection device layer 143-1, the selection device layer 133 may be in the low resistance state and thus a current may start to flow. Also, when the current flowing through the selection device layer 143-1 becomes lower than a holding current, the selection device layer 143-1 may be changed to the high resistance state.

The selection device layer 143-1 may include a chalcogenide material as an OTS material layer. A representative example of the chalcogenide material may include one or more elements from periodic table Group VI and may optionally include one or more chemical modifiers from Group III, IV or V. The most general examples of chalcogen elements capable of being included in the selection device layer 143-1 may include sulfur (S), selenium (Se), and tellurium (Te). The chalcogen elements are characterized by including a divalent bonding and a lone pair electron. The divalent bonding leads to forming of a chain and ring structure by bonding chalcogen elements for forming a chalcogenide material, and the lone pair electron provides an electron source for forming a conductive filament. For example, trivalent and tetravalent modifiers such as aluminium (Al), gallium (Ga), indium (In), germanium (Ge), tin (Sn), silicon (Si), phosphorus (P), arsenic (As), and antimony (Sb) may be added into a chain and ring structure of a chalcogen element to determine a structural rigidity of a chalcogenide material and may classify the chalcogenide material into a switching material and a phase change material, based on a capability to perform crystallization or other structural rearrangement.

In an implementation, the selection device layer 143-1 may include, e.g., Si, Te, As, Ge, In, or a combination thereof. In an implementation, a composition of the selection device layer 143-1 may include about 14% Si, about 39% Te, about 37% As, about 9% Ge, and about 1% In. Here, a percentage ratio denotes an atomic percentage ratio where an atomic element is a total of 100%, and the same hereinafter. In an implementation, the selection device layer 143-1 may include, e.g., Si, Te, As, Ge, S, Se, or a combination thereof. In an implementation, a composition of the selection device layer 143-1 may include about 5% Si, about 34% Te, about 28% As, about 11% Ge, about 21% S, and about 1% Se.

In an implementation, the selection device layer 143-1 may include, e.g., Si, Te, As, Ge, S, Se, Sb, or a combination thereof. In an implementation, a composition of the selection device layer 143-1 may include about 21% Te, about 10% As, about 15% Ge, about 2% S, about 50% Se, and about 2% Sb. In an implementation, the selection device layer 143-1 may include, e.g., at least two of Si, Ge, Sb, Te, Se, In, and Sn, based on As (e.g., may include As plus at least two of Si, Ge, Sb, Te, Se, In, and Sn). In an implementation, the selection device layer 143-1 may include, e.g., may include at least two of Si, Ge, Sb, Te, As, In, and Sn, based on Se (e.g., may include Se plus at least two of Si, Ge, Sb, Te, As, In, and Sn).

In an implementation, the selection device layer 143-1 may include various suitable material layers having a function of selecting a device other than the OTS material layer. For example, the selection device layer 143-1 may include a diode, a tunnel junction, a PNP diode or a bipolar junction transistor (BJT), mixed ionic-electronic conduction (MIEC), etc. The variable resistance layer 147-1 may have a resistance that varies depending on an electric field, and may store actual data. The variable resistance layer 147-1 may correspond to the variable resistance layer ME of FIG. 1.

The variable resistance layer 147-1 may include various materials having resistances that vary depending on an electric field. For example, when the variable resistance layer 147-1 includes a material having a resistance that varies depending on a phase change caused by a voltage applied across both ends of the variable resistance layer 147-1, the memory device 100a may be a phase-change random access memory (PRAM). A phase of the variable resistance layer 147-1 may be reversibly changed by Joule heat that is generated by the voltage applied across both ends of the variable resistance layer 147-1. A phase change material may be put in a high resistance state in an amorphous phase and may be put in a low resistance state in a crystalline phase. The high resistance state may be defined as 0, and the low resistance state may be defined as 1, whereby data may be stored in the variable resistance layer 147-1.

In an implementation, the variable resistance layer 147-1 may include one or more elements from periodic table Group VI and may optionally include one or more chemical modifiers from Group III, IV or V. For example, the variable resistance layer 147-1 may include Ge-Sb-Te. Here, a chemical composition mark including hyphens (-) may represent a certain compound or an element included in a compound and may represent all chemical formula structures including a represented element. For example, Ge-Sb-Te may be a material such as $Ge_2Sb_2Te_5$, $Ge_2Sb_2Te_7$, $GeSb_2Te_4$, $Ge_1Sb_4Te_7$, or the like.

The variable resistance layer 147-1 may include various phase change materials in addition to Ge—Sb—Te. In an implementation, the variable resistance layer 147-1 may include at least one selected from, e.g., Ge—Te, Sb—Te, In—Se, Ga—Sb, In—Sb, As—Te, Al—Te, Bi—Sb—Te (BST), In—Sb—Te (IST), Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, In—Sn—Sb—Te, and As—Ge—Sb—Te or a combination thereof. Each of elements included in the variable resistance layer 147-1 may have various stoichiometry ratios. A crystallization temperature, a melting temperature, a phase change speed based on crystallization energy, and data retention characteristic of the variable resistance layer 147-1 may be adjusted based on the stoichiometry ratio of each element.

In an implementation, the variable resistance layer 147-1 may further include at least one impurity selected from carbon (C), nitrogen (N), silicon (Si), oxygen (O), bismuth (Bi), and tin (Sn). A driving current of the memory device 100a may be changed by the at least one impurity. In an implementation, the variable resistance layer 147-1 may further include a metal. For example, the variable resistance layer 147-1 may include at least one selected from aluminium (Al), gallium (Ga), tin (Sn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), lead (Pb), titanium (Ti), palladium (Pd), and polonium (Po). Such metal materials may help increase the electrical conductivity and thermal conductivity of the variable resistance layer 147-1 to increase a crystallization speed, thereby increasing a set speed. Also, the metal materials may help enhance the data retention characteristics of the variable resistance layer 147-1.

The variable resistance layer 147-1 may have a multilayer structure where two or more layers having different physical properties are stacked. The number or thickness of layers may be freely selected. A barrier layer may be further formed between the layers. The barrier layer may help reduce and/or prevent materials from being diffused between the layers. For example, the barrier layer may help decrease diffusion of a preceding layer when forming a subsequent layer among the layers.

In an implementation, the variable resistance layer 147-1 may have a super-lattice structure where a plurality of layers including different materials are alternately stacked. For example, the variable resistance layer 147-1 may include a structure where a first layer including Ge-Te and a second layer including Sb—Te are alternately stacked. The first and second layers may each include the above-described various materials.

In an implementation, the variable resistance layer 147-1 may include a phase change material. In an implementation, the variable resistance layer 147-1 of the memory device 100a may include various materials having resistance-change characteristics. In an implementation, when the variable resistance layer 147-1 includes transition metal oxide, the memory device 100a may be a resistive random access memory (ReRAM). In the variable resistance layer 147-1 including transition metal oxide, at least one electrical path may be formed or depleted in the variable resistance layer 147-1 through a program operation. When the electrical path is formed, the variable resistance layer 147-1 may have a low resistance value, and when the electrical path is depleted, the variable resistance layer 147-1 may have a high resistance value. The memory device 100 may store data by using a resistance value difference of the variable resistance layer 147-1.

When the variable resistance layer 147-1 includes transition metal oxide, the transition metal oxide may include at least one metal selected from among Ta, Zr, Ti, Hf, Mn, Y, Ni, Co, Zn, Nb, Cu, Fe, and Cr. For example, the transition metal oxide may be formed of a single layer or a multilayer including at least one material selected from among $Ta_2O_{5-x}$, $ZrO_2$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the above-described materials, x may be selected within a range of $0 \leq x \leq 1.5$, and y may be selected within a range of $0 \leq y \leq 0.5$. In an implementation, when the variable resistance layer 147-1 has a magnetic tunnel junction (MJT) structure which includes two electrodes including a magnetic material and a dielectric disposed between the two magnetic electrodes, the memory device 100a may be a magnetic random access random (MRAM).

The two electrodes may respectively be a magnetization fixed layer and a magnetization free layer, and the dielectric disposed therebetween may be a tunnel barrier layer. The magnetization fixed layer may have a magnetization direction which is fixed in one direction, and the magnetization free layer may have a magnetization direction which is changeable to be parallel or antiparallel to the magnetization direction of the magnetization fixed layer. In an implementation, the magnetization directions of the magnetization fixed layer and the magnetization free layer may be parallel to one surface of the tunnel barrier layer. In an implementation, the magnetization directions of the magnetization fixed layer and the magnetization free layer may be perpendicular to the one surface of the tunnel barrier layer.

When the magnetization direction of the magnetization free layer is parallel to the magnetization direction of the magnetization fixed layer, the variable resistance layer 147-1 may have a first resistance value. When the magnetization direction of the magnetization free layer is antiparallel to the magnetization direction of the magnetization fixed layer, the variable resistance layer 147-1 may have a second resistance value. By using such a resistance value difference, the memory device 100a may store data. The magnetization direction of the magnetization free layer may be changed by a spin torque of electrons included in a program current.

The magnetization fixed layer and the magnetization free layer may each include a magnetic material. In this case, the magnetization fixed layer may further include an antiferromagnetic material that fixes a magnetization direction of a ferromagnetic material included in the magnetization fixed layer. In an implementation, the tunnel barrier layer may include oxide of at least one material selected from among Mg, Ti, Al, MgZn, and MgB.

First and second insulating structures 160a and 160b may be arranged between the plurality of first conductive lines 110, between the plurality of second conductive lines 120, and between the plurality of first memory cells 140-1. The first and second insulating structures 160a and 160b may maintain an electrical insulation state between the first conductive lines 110, between the second conductive lines 120, and between the first memory cells 140-1. For example, the first insulating structures 160a may be arranged alternately with the memory cells 140-1 in the second direction under the second conductive lines 120. The first insulating structures 160a may be between the memory cells 140-1 and may overlap side walls of the memory cells 140-1, and may extend from a top surface of the interlayer insulation layer 105 to bottom surfaces of the second conductive lines 120. In an implementation, the first insulating structures 160a may each have a tetragonal pillar shape.

The first insulating structures 160a may have top surfaces that are higher than top surfaces of the memory cells 140-1. For example, a top, distal, or outer surface of the first insulating structures 160a may be a greater distance from the substrate than a top or outer surface of the memory cells 140-1. Accordingly, levels of bottom surfaces of the second conductive lines 120 contacting the first insulating structures 160a may be higher than levels of bottom surfaces of the second conductive lines 120 contacting the memory cells 140-1. For example, a distance from the substrate to a region of the second conductive line 120 that contacts the top surface of the first insulating structure 160a (in the Z direction) may be greater than a distance from the substrate of a region of the second conductive line 120 that contacts the top surface of the memory cells 140-1. The second conductive lines 120 may have a structure in which the plurality of convex portions 120cv, which are connected to the top surfaces of the memory cells 140-1, and the plurality of concave portions 120cc, which accommodate the first insulating structures 160a between the plurality of convex portions 120cv, are alternately arranged. In an implementation, a width of each of the convex portions 120cv may be substantially the same as a width of the first top electrode layer 149-1.

The first insulating structures 160a may protrude upwardly between adjacent memory cells 140-1, and thus may extend a heat transmission path from heat generated in the insides of memory cells 140-1 to adjacent memory cells. Details will be described below with reference to FIGS. 4 to 6. The second insulating structures 160b may be in spaces defined by the memory cells 140-1, the first insulating structures 160a, and the second conductive lines 120. For example, the second insulating structures 160b may contact side walls of the memory cells 140-1, side walls of the first insulating structures 160a, and side walls of the second conductive lines 120, and may extend from top surfaces of the first conductive lines 110 up to levels that are equal to those of top surfaces of the second conductive lines 120, e.g., to be coplanar with the top surfaces of the second conductive lines 120.

The first and second insulating structures 160a and 160b may include, e.g., an oxide, a nitride, or a combination thereof. For example, the first and second insulating structures 160a and 160b may include silicon oxide, silicon nitride, or aluminum oxide.

Figure 4A:
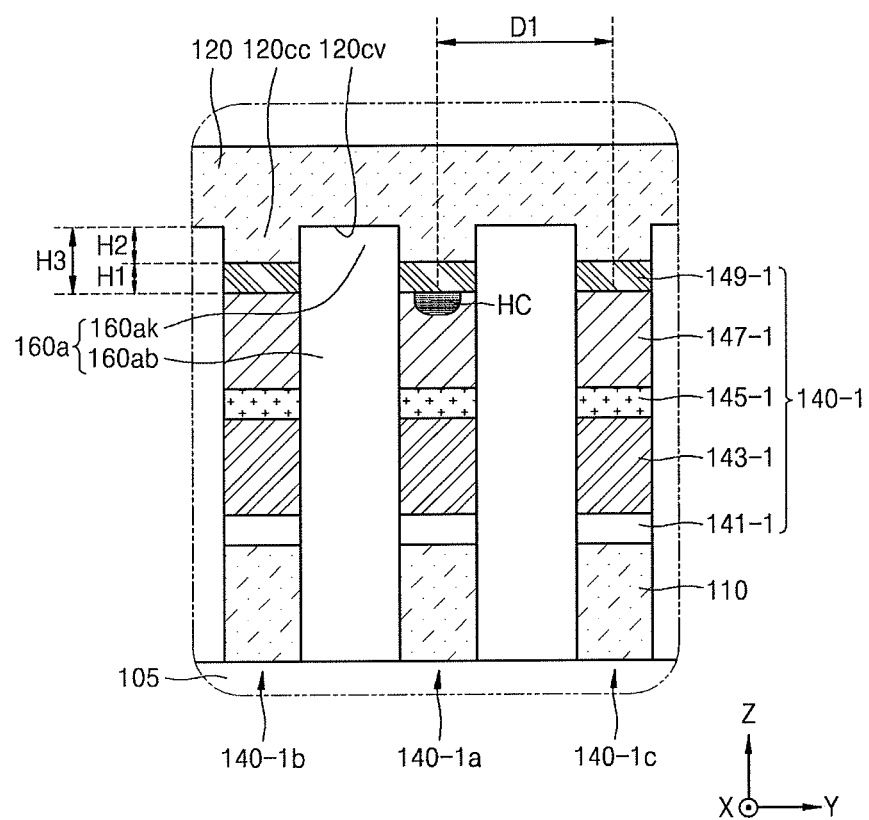
FIG. 4A illustrates an enlarged view of a portion A of FIG. 3.

FIG. 4A illustrates an enlarged view of a portion A of FIG. 3. Referring to FIG. 4A, first to third memory cells 140-1a, 140-1b, and 140-1c may be arranged to be adjacent to each other on the first conductive lines 110. The second and third memory cells 140-1b and 140-1c may be arranged at a cell pitch D1 of a predetermined value from the first memory cell 140-1.

When a voltage for a write operation is applied to the first memory cell 140-1a, an interface between the top electrode layer 149-1, the interface between the variable resistance layer 147-1, and the top electrode layer 149-1 (functioning as a heating electrode layer) may generate Joule heat, and thus may function as a heat source HC. The Joule heat may change a phase of the variable resistance layer 147-1 of the memory cell 140-1a to which the voltage has been applied, thereby making the memory cell 140-1 enter a set or reset state.

Heat generated by the heat source HC could be transmitted to the second and third memory cells 140-1b and 140-1c, adjacent to the first memory cell 140-1a, through the second conductive lines 120 directly connected to the top electrode layer 149-1 of the first memory cell 140-1a. If heat transmitted to the second and third memory cells 140-1b and 140-1c were not appropriately controlled, the temperatures of the second and third memory cells 140-1b and 140-1c could rise due to the heat transmitted from the first memory cell 140-1a. For example, if the temperature of the variable resistance layer 147-1 of each of the second and third memory cells 140-1b and 140-1c were to become equal to or greater than a crystallization temperature due to the heat transmitted from the first memory cell 140-1a, the phase of the variable resistance layer 147-1 could be changed, and thus, states of the first and second memory cells 140-1b and 140-1c could be changed to a set state. In this case, data stored in the memory device 100a could be unintentionally changed and thus the reliability of the memory device 100a could be deteriorated. As the integration density of memory devices increases, thermal cross-talk between adjacent memory cells could further deepen.

In the memory device 100a according to the present embodiment, the first insulating structures 160a having top surfaces higher than top surfaces of the first to third memory cells 140-1a, 140-1b, and 140-1c may be between the first memory cell 140-1a and the second memory cell 140-1b and between the first memory cell 140-1a and the third memory cell 140-1c. Thus, a heat transmission path between the memory cells 140-1a, 140-1b, and 140-1c adjacent to each other may extend. For example, due to the first insulating structure 160a that protrudes upwardly, heat generated from the heat source HC may be transmitted along the convex portions 120cv and the concave portions 120cc formed in the second conductive lines 120 (e.g., undesirable heat transfer from the heat source HC to other memory cells may be interrupted).

Each of the first insulating structures 160a may be divided into a base portion 160ab and a hill portion 160ak, based on a positional relation with the heat source HC. The base portion 160ab may be a portion of the first insulation structure 160a, which is lower than the level of the interface between the first variable resistance layer 147-1 and the first top electrode layer 149-1, e.g., closer to the substrate 101 that the interface between the first variable resistance layer 147-1 and the first top electrode layer 149-1. The hill portion 160ak may be a portion of the first insulation structure 160a, which is higher than the level of the interface between the first variable resistance layer 147-1 and the first top electrode layer 149-1, e.g., farther from the substrate than the interface between the first variable resistance layer 147-1 and the first top electrode layer 149-1. For example, the base portion 160ab may overlap the side surface of the first variable resistance layer 147-1, the side surface of the middle electrode layer 145-1, the side surface of the selection device layer 143-1, and the side surface of the bottom electrode layer 141-1, and the hill portion 160ak may overlap the side surface of the first top electrode layer 149-1 and the side surface of the convex portion 120cv of the second conductive line 120 and may extend up to the inside of the concave portion 120cc.

A heat transmission path in a third direction (the Z direction) may be induced by the hill portion 160ak, e.g., may go over or around the hill portion 160ak, and the height H3 of the hill portion 160ak (e.g., in the third direction) may correspond to the length of a vertical axis path of the heat transmission path. The height H3 of the hill portion 160ak may be about equal to a sum of the thickness H1 (e.g., in the third direction) of the top electrode layer 149-1 and the thickness H2 (e.g., in the third direction) of the convex portion 120cv of the second conductive line 120. In an implementation, the height H3 of the hill portion 160ak of the first insulating structure 160a may be about 50 Å to about 500 Å. A cell pitch D1 between the first to third memory cells 140-1a, 140-1b, and 140-1c in the first direction (the X direction) may correspond to a length of a horizontal axis path of the heat transmission path.

The heat transmission path from the heat source HC of the memory device 100a according to the present embodiment may include an extending vertical axis path as well as a horizontal axis path. Accordingly, the cell pitch D1 between the first to third memory cells 140-1a, 140-1b, and 140-1c may be maintained, and thermal cross-talk between the first to third memory cells 140-1*a*, 140-1*b*, and 140-1*c* may be suppressed (e.g., due to the increased length of the heat transmission path due to the extended height of the hill portion 160*ak* of the first insulation structure 160*a*.

Figure 4B:
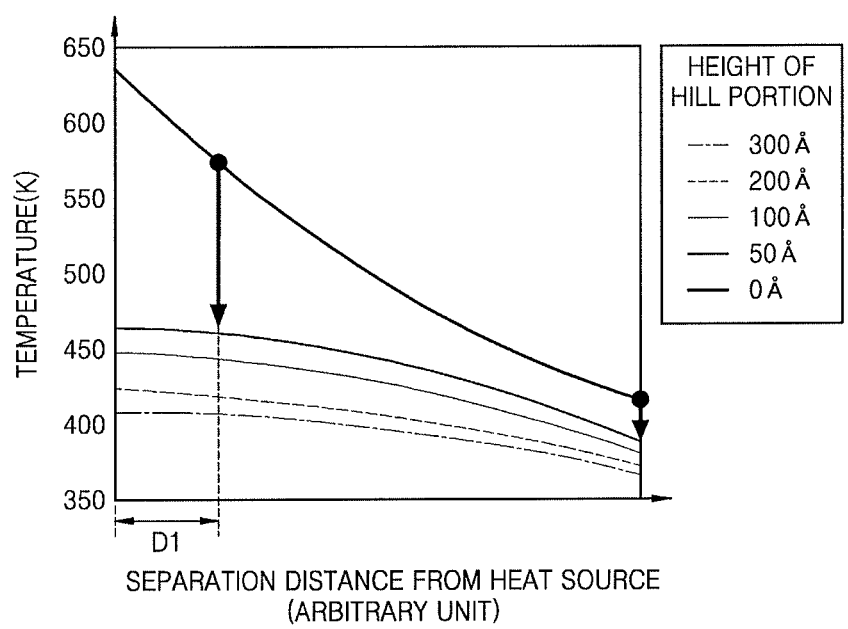
FIG. 4B illustrates a graph of temperature versus separation distance from a heat source in a horizontal direction.

FIG. 4B illustrates a graph of temperature versus separation distance from the heat source HC in a cell pitch direction with respect to the height H3 of the hill portion 160*ak*.

Referring to FIGS. 4A and 4B, when the height H3 of the hill portion 160*ak* is 0 Å, e.g., when the hill portion 160*ak* does not exist, the temperature may be very high with respect to all separation distances, compared to when the height 1-13 of the hill portion 160*ak* is equal to or greater than 50 Å.

For example, when the temperature is measured based on a position spaced apart from the heat source HC by the cell pitch D1 in a horizontal direction, the temperature may be about 575 K when the hill portion 160*ak* does not exist, and is about 465 K when the height H3 of the hill portion 160*ak* is 50 Å. Accordingly, when the hill portion 160*ak* having the height H3 of 50 Å is introduced, there may be about 110 K temperature reduction in the second and third memory cells 140-1*b* and 140-1*c* adjacent to the first memory cell 140-1*a* (that includes the heat source HC). Also, when the height H3 of the hill portion 160*ak* increases to 100 Å, 200 Å, or 300 Å, there may be an additional or further temperature reduction (e.g., beyond the 110K temperature reduction).

As described above, the height H3 of the hill portion 160*ak* may be about 50 Å or more. Accordingly, a heat transmission path may be extended and thus heat transmission from the first memory cell 140-1 to the second and third memory cells 140-1*b* and 140-1*c* adjacent thereto may be suppressed, thereby improving the reliability of the memory device 100*a*. In an implementation, the height H3 of the hill portion 160*ak* may be equal to or less than about 500 A in consideration of the thickness of the second conductive line 120 that accommodates the hill portion 160*ak*.

Figure 4C:
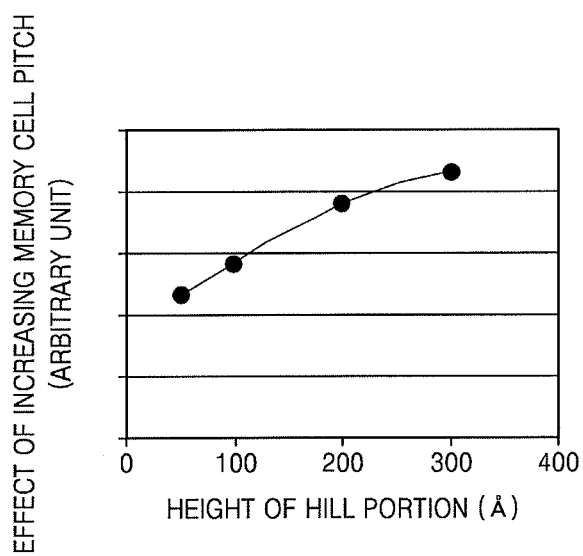
FIG. 4C illustrates a graph of an effect of increasing a cell pitch of memory cells, based on the height of a hill portion of an insulating structure disposed between the memory cells.

FIG. 4C illustrates a graph showing an effect of increasing a cell pitch of the memory cells 140-1, based on the height of the hill portion 160*ak* of the first insulating structure 160*a* disposed between the memory cells 140-1.

Referring to FIGS. 4A to 4C, a heat transmission path from the heat source HC of the memory device 100*a* according to the present embodiment may include a vertical axis path in the third direction (the Z direction) as well as a horizontal axis path in the first direction (the X direction). In the memory device 100*a*, the length of the vertical axis path may be the height H3 of the hill portion 160*ak*, and the length of the horizontal axis path may be a distance corresponding to the cell pitch D1.

In the memory device 100A, the length of the horizontal axis path may be maintained by maintaining the cell pitch D1 between the memory cells 140-1, and the length of the vertical axis path may be increased due to the hill portion 160*ak*. Accordingly, thermal cross-talk between the memory cells 140-1 may be reduced, thereby obtaining an effect of increasing the cell pitch D1.

Figure 5A:
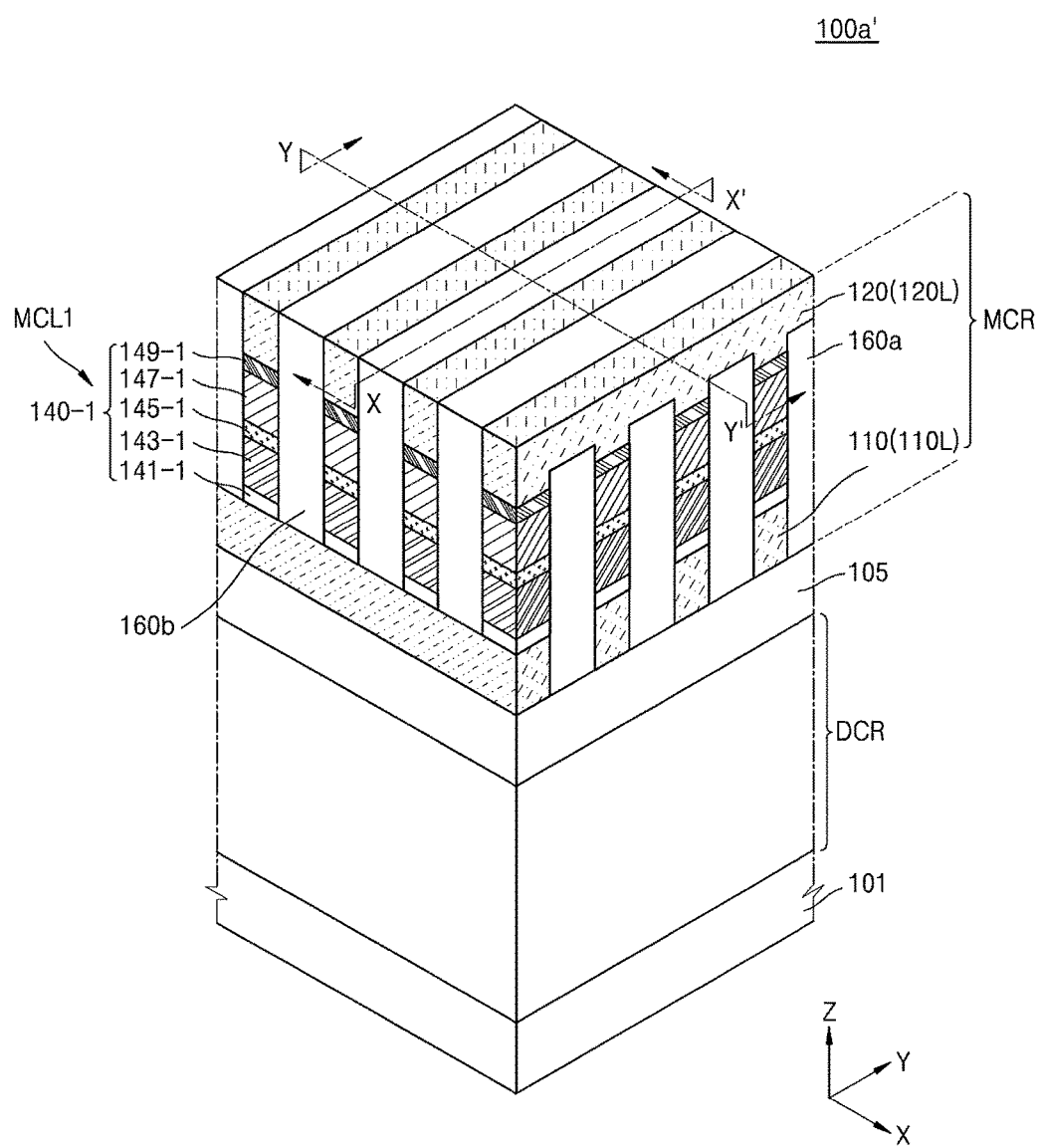
FIG. 5A illustrates a perspective view of a memory device according to another embodiment.
Figure 5B:
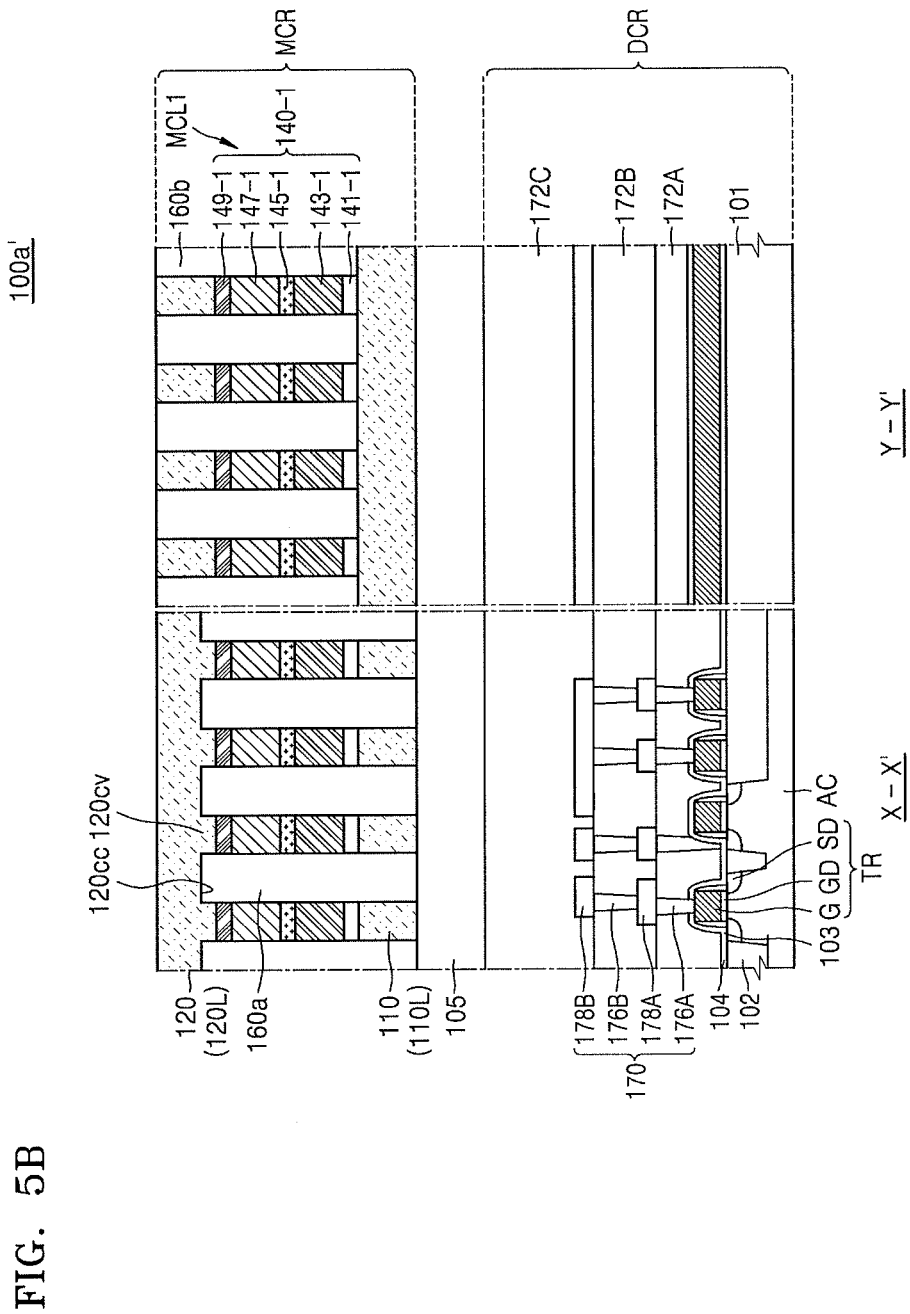
FIG. 5B illustrates a cross-sectional view of the memory device of FIG. 5A.

FIG. 5A illustrates a perspective view of a memory device 100*a*' according to another embodiment, and FIG. 5B illustrates a cross-sectional view of the memory device 100*a*' of FIG. 5A.

Referring to FIGS. 5A and 5B, the memory device 100*a*' according to the present embodiment may include a driving circuit region DCR, provided in a first level on a substrate 101, and a memory cell region MCR provided in a second level on the substrate 101. Here, the term "level" denotes a height or distance in a vertical direction (a Z direction) from the substrate 101. The first level on the substrate 101 may be closer to the substrate 101 than the second level.

The driving circuit region DCR may be regions where peripheral circuits or driving circuits for driving memory cells in the memory cell region MCR are disposed, and may correspond to an integrated circuit layer. For example, the peripheral circuits in the driving circuit region DCR may be circuits for processing data input/output to/from the memory cell region MCR at a high speed. For example, the peripheral circuits may be a page buffer, a latch circuit, a cache circuit, a column decoder, a sense amplifier, a data in/out circuit, a row decoder, and/or the like.

An active area AC for driving circuits may be defined in the substrate 101 by an isolation layer 102. A plurality of transistors TR configuring the driving circuit region DCR may be formed on the active area AC of the substrate 101. The plurality of transistors TR may each include a gate G, a gate insulation layer GD, and a source/drain region SD. Both side walls of the gate G may be covered by an insulation spacer 103, and an etch stopper 104 may be formed on the gate G and the insulation spacer 103. The etch stopper 104 may include an insulating material such as silicon nitride, silicon oxynitride, or the like.

A plurality of bottom interlayer insulation layers 172A to 172C may be sequentially stacked on the etch stopper 104. The plurality of bottom interlayer insulation layers 172A to 172C may each include silicon oxide, silicon oxynitride, silicon nitride, and/or the like.

The driving circuit region DCR may include a multilayer wiring structure 170 electrically connected to the plurality of transistors TR. The multilayer wiring structure 170 may be insulated by the plurality of bottom interlayer insulation layers 172A to 172C.

The multilayer wiring structure 170 may include a first contact 176A, a first wiring layer 178A, a second contact 176B, and a second wiring layer 178B which are sequentially stacked on the substrate 101 and are electrically connected to each other. In an implementation, the first wiring layer 178A and the second wiring layer 178B may each include metal, conductive metal nitride, metal silicide, or a combination thereof. For example, the first wiring layer 178A and the second wiring layer 178B may each include a conductive material such as tungsten (W), molybdenum (Mo), titanium (Ti), cobalt (Co), tantalum (Ta), nickel (Ni), tungsten silicide, titanium silicide, cobalt silicide, nickel silicide, and the like.

In the memory device 100*a*' according to the present embodiment, the multilayer wiring structure 170 is exemplarily illustrated as having a two-layer wiring structure including the first wiring layer 178A and the second wiring layer 178B. In an implementation, the multilayer wiring structure 170 may have a multilayer wiring structure including three or more layers, based on a layout of the driving circuit region DCR and the kind and arrangement of the gate G.

An interlayer insulation layer 105 may be formed on the plurality of bottom interlayer insulation layers 172A to 172C. The memory cell region MCR may be disposed on the interlayer insulation layer 105. The interlayer insulation layer 105 and the memory cell region MCR are as described on the memory device 100 of FIGS. 2 and 3. For example, the memory cell region MCR may include a first electrode line layer 110L, a memory cell layer MCL, and a second electrode layer 120L. In an implementation, the structure of each of the memory devices 100*a*1, 100*a*2, 100*b*, 100*c*, 200*a*, 200*b*, and 200*c* of FIGS. 6A to 19 may be applied to the memory cell region MCR.

A wiring structure connected between the memory cell region MCR and the driving circuit region DCR may pass through the interlayer insulation layer 105. The memory device 100a' according to the present embodiment may have a structure where the memory cell region MCR is on the driving circuit region DCR, and thus, a degree of integration of a memory device may be greatly enhanced.

Figure 6A:
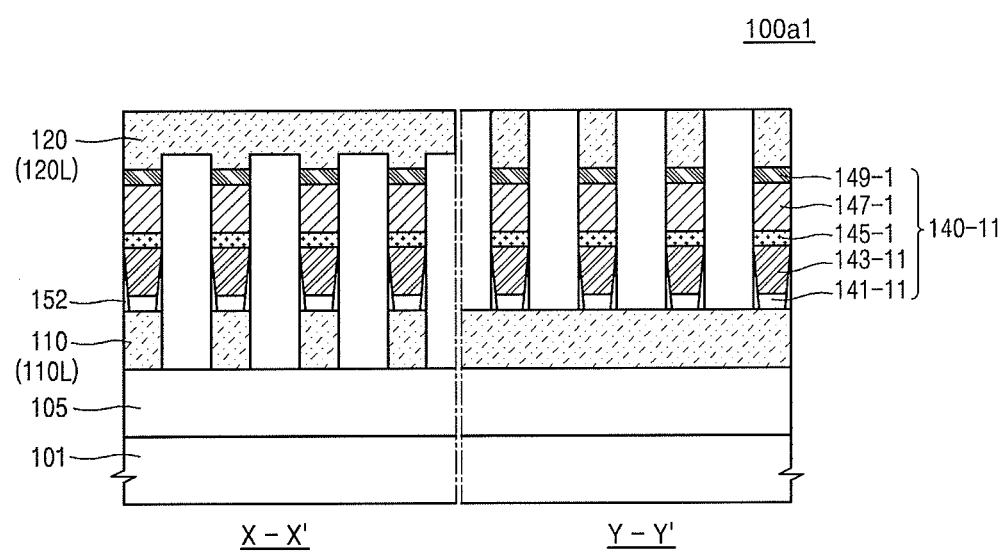
FIGS. 6A to 6D illustrate cross-sectional views of memory devices according to other embodiments, which show portions corresponding to a cross section taken along the line X-X' of FIG. 2 and a cross section taken along the line Y-Y' of FIG. 2.

FIGS. 6A illustrates a cross-sectional view of a memory device 100a1 according to another embodiment, which illustrates portions corresponding to a cross section taken along the line X-X' of FIG. 2 and a cross section taken along the line Y-Y' of FIG. 2. The memory device 100a1 is similar to the memory device 100a of FIGS. 2 to 4A, but a memory cell 140-11 of the memory device 100a1 is different from the memory cell 140-1 of the memory device 100a. A bottom electrode layer 141-11 and a selection device layer 143-11 of the memory device 100a1 may have damascene structures. Also, the memory device 100a1 may further include a lower spacer 152, and thus, the shapes of the bottom electrode layer 141-11 and the selection device layer 143-11 of the memory device 100a1 may be different from those of the bottom electrode layer 141-1 and the selection device layer 143-1 of the memory device 100a of FIGS. 2 to 4A.

Referring to FIG. 6A, the bottom electrode layer 141-11 and the selection device layer 143-11 may be formed by a damascene process, and a middle electrode layer 145-1, a variable resistance layer 147-1, and a top electrode layer 149-1 may be formed through a positive etching process. Accordingly, the bottom electrode layer 141-11 and the selection device layer 143-11 may each have a structure in which the width thereof gradually narrows toward the bottom thereof.

Also, in the memory device 100a1 according to the present embodiment, the lower spacer 152 may be formed on side surfaces of the bottom electrode layer 141-11 and the selection device layer 143-11. When the bottom electrode layer 141-11 and the selection device layer 143-11 are formed through the damascene process, a spacer may be formed in a side wall in a trench in advance, and then, the bottom electrode layer 141-11 and the selection device layer 143-11 may be formed.

Figure 6B:
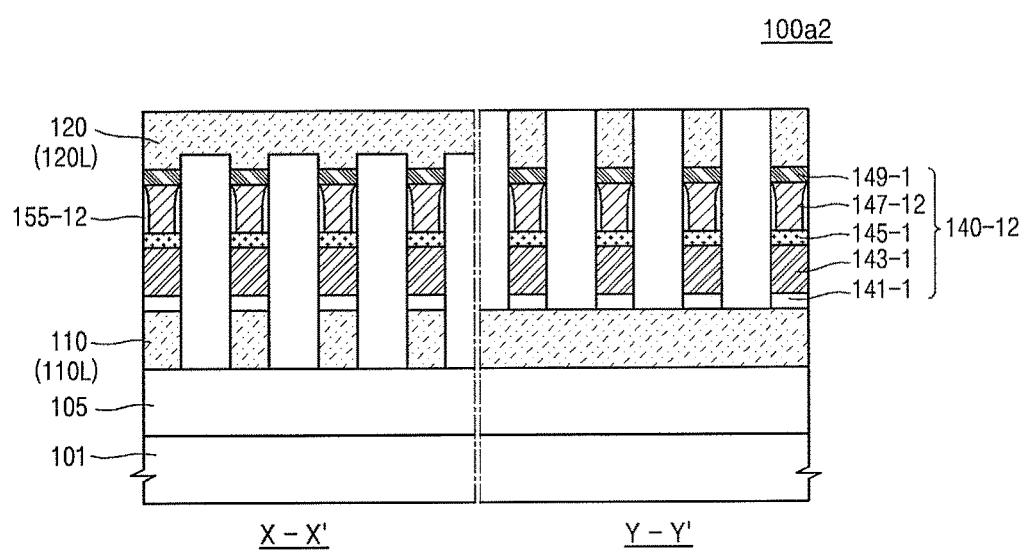

FIGS. 6B illustrates a cross-sectional view of a memory device 100a2 according to another embodiment, which illustrates portions corresponding to a cross section taken along the line X-X' of FIG. 2 and a cross section taken along the line Y-Y' of FIG. 2. The memory device 100a2 is similar to the memory device 100a of FIGS. 2 to 4A, but a memory cell 140-12 of the memory device 100a2 is different from the memory cell 140-1 of the memory device 100a. A variable resistance layer 147-12 of the memory device 100a2 may have a damascene structure.

Referring to FIG. 6B, a bottom electrode layer 141-1, a selection device layer 143-1, and a middle electrode layer 145-1 may be foinied by a positive etching process, and the variable resistance layer 147-12 may be formed by a damascene process.

An upper spacer 155-12 may be formed on a side surface of the variable resistance layer 147-12. The upper spacer 155-12 may be formed by using the same method as that of forming the lower spacer 152 of the memory device 100a1 of FIG. 6A . For example, trenches may be formed on an insulating layer, the upper spacer 155-12 may be formed on side walls in the trenches, and then, the material of the variable resistance layer 147-12 may fill remaining spaces of the trenches. In an implementation, the upper spacer 155-12 may be omitted.

Figure 6C:
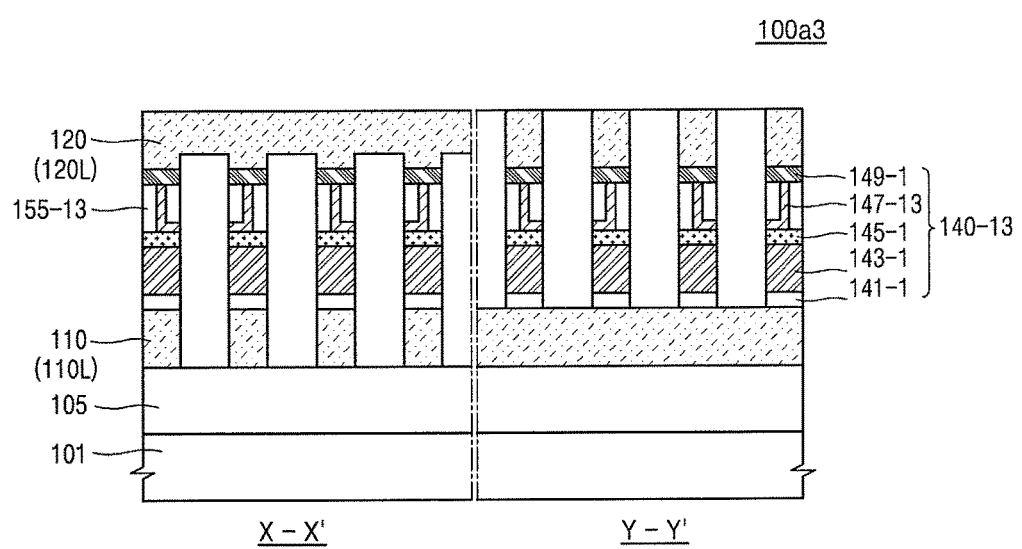

FIGS. 6C illustrates a cross-sectional view of a memory device 100a3 according to another embodiment, which illustrates portions corresponding to a cross section taken along the line X-X' of FIG. 2 and a cross section taken along the line Y-Y' of FIG. 2. The memory device 100a3 is similar to the memory device 100a of FIGS. 2 to 4A, but a memory cell 140-13 of the memory device 100a3 is different from the memory cell 140-1 of the memory device 100a. A variable resistance layer 147-13 of the memory device 100a3 may have a damascene structure and an L-type structure.

Referring to FIG. 6C, a bottom electrode layer 141-1, a selection device layer 143-1, and a middle electrode layer 145-1 may be formed by a positive etching process, and the variable resistance layer 147-13 may be formed by a damascene process.

An upper spacer 155-13 may be formed on a side surface of the variable resistance layer 147-13. However, as the variable resistance layer 147-13 has an L-type structure, the upper spacer 155-13 may have an asymmetrical structure.

The variable resistance layer 147-13 having an L-type structure may be manufactured by a process that is described below.

First, an insulating layer is formed on a middle electrode layer, and a trench may be formed in the insulating layer. The trench may be formed to be wide so that top surfaces of two adjacent middle electrode layers 145-1 formed by subsequent processes are exposed by the trench. A remaining portion of the insulating layer may form a portion of the upper spacer 155-13.

Next, after a first material layer to form the variable resistance layer 147-13 is formed in the trench and on the insulating layer, a second material layer to form a portion of the upper spacer 155-13 is formed on the first material layer. Then, planarization may be performed through a chemical mechanical polishing (CMP) process to expose an upper surface of the insulating layer.

Next, the variable resistance layer 147-13 having an L-type structure and the upper spacer 155-13 may be formed by forming a mask pattern covering the memory cells 140-13 and etching the first material and the second material by using the mask pattern.

Figure 6D:
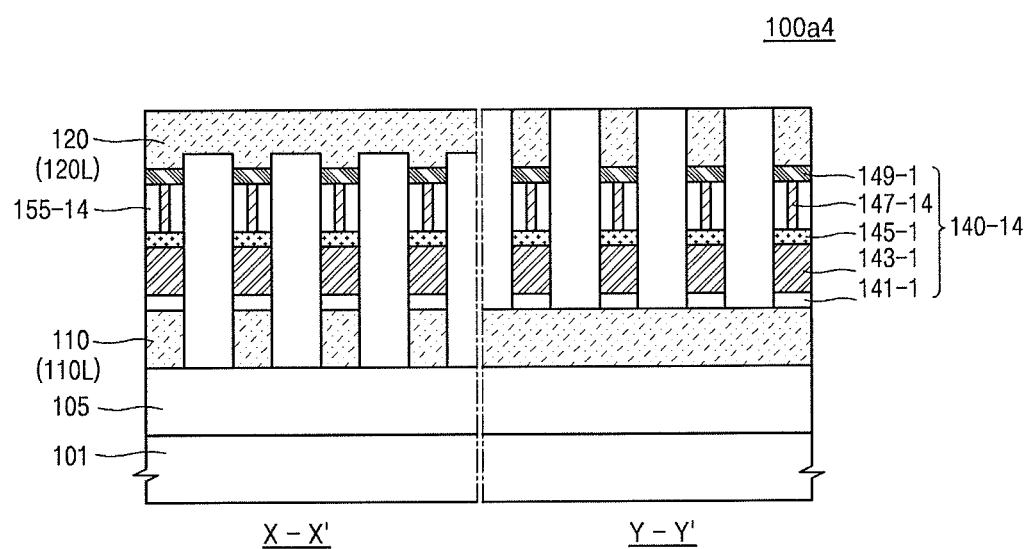

FIGS. 6D illustrates a cross-sectional view of a memory device 100a4 according to another embodiment, which illustrates portions corresponding to a cross section taken along the line X-X' of FIG. 2 and a cross section taken along the line Y-Y' of FIG. 2. The memory device 100a4 is similar to the memory device 100a of FIGS. 2 to 4A, but a memory cell 140-14 of the memory device 100a4 is different from the memory cell 140-1 of the memory device 100a. A variable resistance layer 147-14 of the memory device 100a4 has a dash structure.

Referring to FIG. 6D, the variable resistance layer 147-14 having a dash structure may be formed by using a method similar to that of forming the variable resistance layer 147-13 of FIG. 6C. For example, after a first material layer to form the variable resistance layer 147-14 is formed in a trench and on an insulating layer, an anisotropic etching process may be performed on the first material layer, and thus, the first material layer may remain only on a side wall of the trench. Next, a second material layer may cover the remaining first material layer. Then, planarization may be performed through a CMP process to expose an upper surface of the insulating layer. The variable resistance layer 147-14 and the upper spacer 155-14 may be formed by forming a mask pattern, which is aligned to memory cells 140-14, after the planarization and then etching the second material layer by using the mask pattern.

Structures of the memory cells 140-11, 140-12, 140-13, and 140-14 shown in FIGS. 6A to 6D may be applied to memory devices 100b, 100c, 200a, 200b, and 200c of FIGS. 7 to 19 to be described below.

Figure 7:
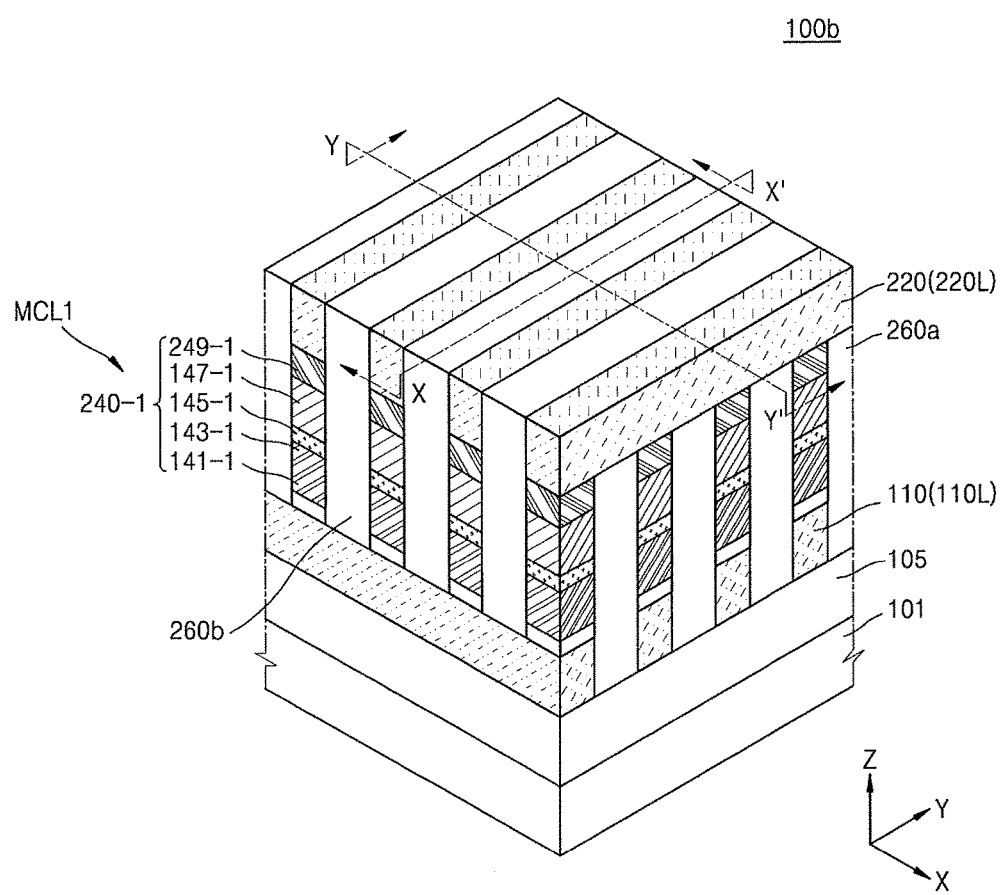
FIG. 7 illustrates a perspective view of a memory device according to another embodiment.
Figure 8:
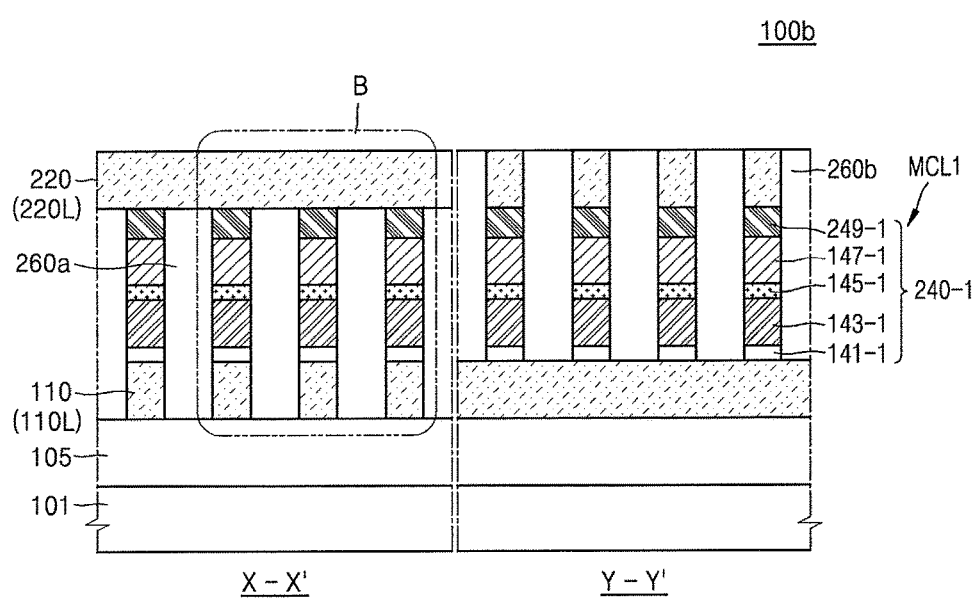
FIG. 8 illustrates a cross-sectional view taken along line X-X' and line Y-Y' of FIG. 7.
Figure 9:
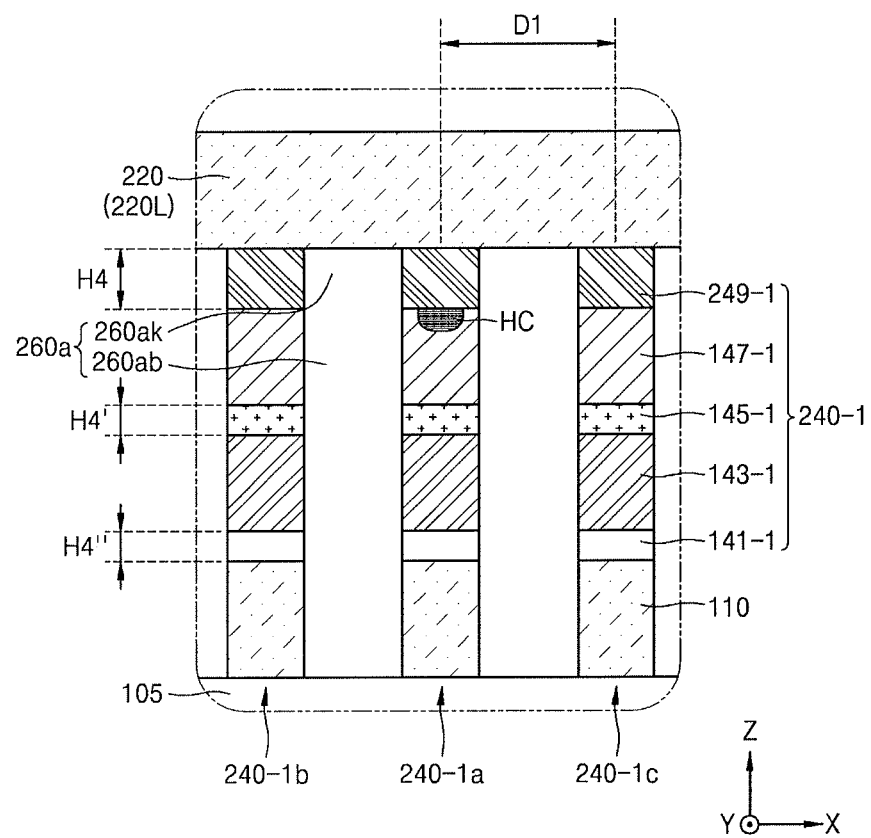
FIG. 9 illustrates an enlarged view of a portion B of FIG. 8.

FIG. 7 illustrates a perspective view of a memory device 100b according to another embodiment. FIG. 8 illustrates a cross-sectional view taken along line X-X' and line Y-Y' of FIG. 7. FIG. 9 illustrates an enlarged view of a portion B of FIG. 8. The memory device 100b is similar to the memory device 100a of FIGS. 2 to 4A, but is different from the memory device 100a in that the height H4 of a hill portion 260ak, e.g., a vertical axis path of a heat transmission path, may be increased by increasing a thickness of a top electrode layer 249-1. Like reference numerals denote like elements in the drawings, and overlapping descriptions will be briefly described.

Referring to FIGS. 7 and 8, the memory device 100b may include a first conductive line layer 110L on a substrate 101, a second conductive line layer 220L on the first conductive line layer 110L, a memory cell layer MCL1 between the first conductive line layer 110L and the second conductive line layer 220L, and a plurality of insulation structures 260a and 260b between a plurality of memory cells 240-1 forming the memory cell layer MCL1.

The first conductive line layer 110L may include a plurality of first conductive lines 110 that extend in parallel in a first direction (the X direction) and are spaced apart from each other. The second conductive line layer 220L may include a plurality of second conductive lines 220 that extend in parallel in a second direction (the Y direction) perpendicular to the first direction and are spaced apart from each other. The second conductive lines 220 may each have a flat bottom surface, unlike the second conductive line 120 of FIGS. 2 to 4A.

The memory cell layer MCL1 may include the plurality of memory cells 240-1 respectively disposed at a plurality of cross points between the first conductive lines 110 and the second conductive lines 220. The memory cells 240-1 may each have a structure in which a bottom electrode layer 141-1, a selection device layer 143-1, a middle electrode layer 145-1, a variable resistance layer 147-1, and a top electrode layer 249-1 are stacked in this stated order. The top electrode layer 249-1 may be a heating electrode layer.

The thickness H4 of the top electrode layer 249-1 may be greater than the thickness H4' of the middle electrode layer 145-1 and/or the thickness H4" of the bottom electrode layer 141-1. The thickness H4 of the top electrode layer 249-1 may be relatively large, and the length of a vertical axis path from a heat source HC up to the second conductive lines 220 may increase and a heat transmission path may be extended.

The plurality of insulation structures 260a and 260b, e.g., first and second insulation structures 260a and 260b, may be between the plurality of first conductive lines 110, between the plurality of second conductive lines 220, and between the plurality of memory cells 240-1. The first insulating structures 260a may be arranged alternately with the memory cells 240-1 in the second direction under the second conductive lines 220. Levels of top surfaces of the first insulating structures 260a may be the same as those of top surfaces of the memory cells 240-1, e.g., the top surfaces may be coplanar. For example, bottom surfaces of the second conductive lines 220 may be flat. The second insulating structures 260b may be in spaces defined by the memory cells 240-1, the first insulating structures 260a, and the second conductive lines 220.

Referring to FIG. 9, each of the first insulating structures 260a may include a base portion 260ab and a hill portion 260ak, based on a positional relation with the heat source HC. The base portion 260ab may be a portion of the first insulation structure 260a that is lower than the level of the interface between the first variable resistance layer 147-1 and the first top electrode layer 249-1, e.g., is closer to the substrate than the interface. The hill portion 260ak may be a portion of the first insulation structure 260a, which is higher than the level of the interface between the first variable resistance layer 147-1 and the first top electrode layer 249-1, e.g., is farther from the substrate than the interface.

A heat transmission path in a third direction (the Z direction) may be induced by the hill portion 260ak, e.g., may go over or around the hill portion 260ak, and the height H4 of the hill portion 260ak (e.g., in the Z direction) may correspond to the length of a vertical axis path of the heat transmission path. The height H4 of the hill portion 260ak may correspond to the thickness of the top electrode layer 149-1 (e.g., in the Z direction). A cell pitch D1 between adjacent memory cells 240-1a, 240-1b, and 240-1c in the first direction (the X direction) may correspond to the length of a horizontal axis path of the heat transmission path.

In the memory device 100b according to the present embodiment, a vertical axis path of the heat transmission path from the heat source HC may be extend due to the thickness H4 of the top electrode layer 249-1 being greater than the thickness H4' of the middle electrode layer 145-1 and the thickness H4" of the bottom electrode layer 141-1. Accordingly, the cell pitch D1 between the memory cells 240-1a, 240-1b, and 240-1c may be maintained, and thermal cross-talk between the memory cells 240-1a, 240-1b, and 240-1c may be advantageously suppressed.

As described with reference to FIG. 4B, when a hill portion having a height of 50 Å is introduced, there may be a rapid temperature reduction in the memory cells 240-1b and 240-1c adjacent to the first memory cell 240-1a including the heat source HC. Accordingly, the thickness H4 of the hill portion 260ak, e.g., the thickness H4 of the top electrode layer 249-1, may be equal to or greater than about 50 Å. In an implementation, the height H4 of the hill portion 260ak may be equal to or less than about 500 Å.

Figure 10:
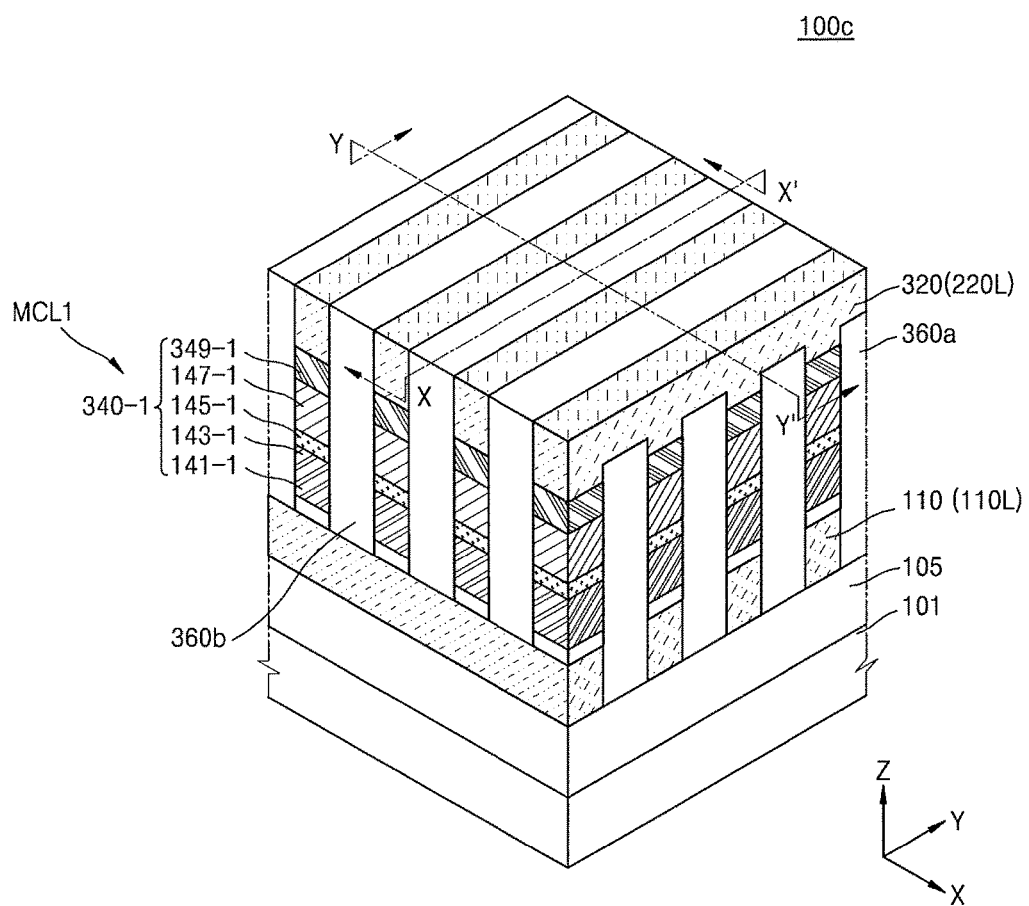
FIG. 10 illustrates a perspective view of a memory device according to another embodiment.
Figure 11:
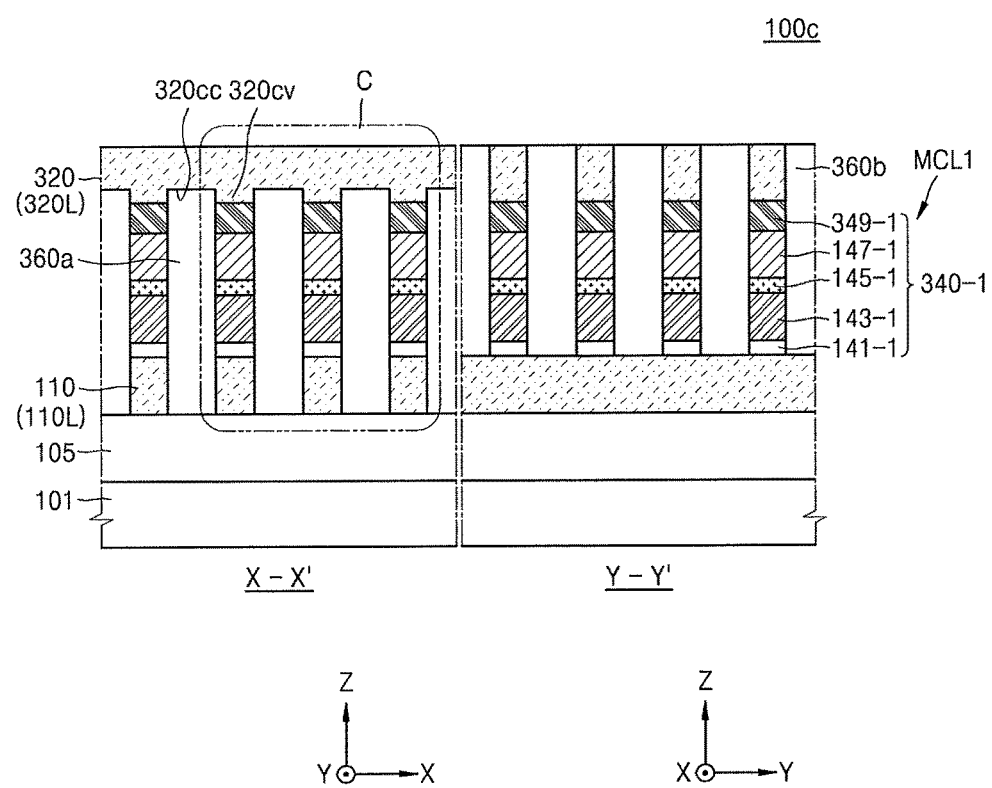
FIG. 11 illustrates a cross-sectional view taken along line X-X' and line Y-Y' of FIG. 10.
Figure 12:
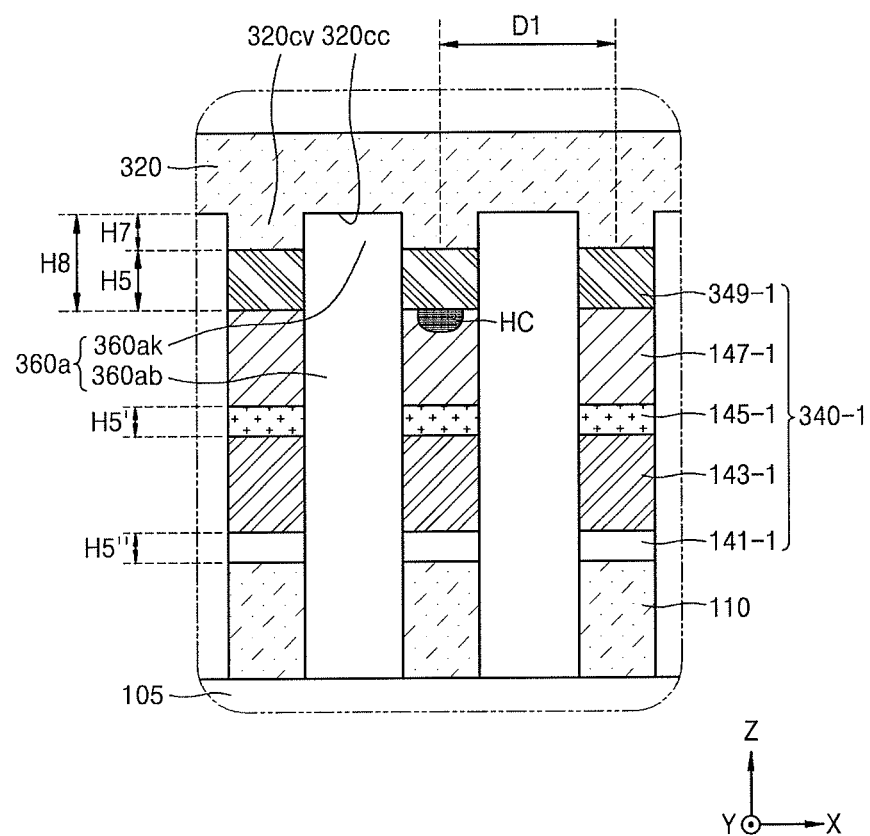
FIG. 12 illustrates an enlarged view of a portion C of FIG. 10.

FIG. 10 illustrates a perspective view of a memory device 100c according to another embodiment. FIG. 11 illustrates a cross-sectional view taken along line X-X' and line Y-Y' of FIG. 10. FIG. 12 illustrates an enlarged view of a portion C of FIG. 10. The memory device 100c may include a first insulating structure 360a having a top surface higher than that of a variable resistance layer 147-1, like the memory device 100a of FIGS. 2 to 4A, and may include a top electrode layer 349-1 having a thickness larger than those of lower and middle electrode layers 141-1 and 145-1, like the memory device 100b of FIGS. 7 to 9.

Referring to FIGS. 10 and 11, the memory device 100c may include a first conductive line layer 110L on a substrate 101, a second conductive line layer 320L on the first conductive line layer 110L, a memory cell layer MCL1 between the first conductive line layer 110L and the second conductive line layer 320L, and a plurality of insulation structures 360a and 360b between a plurality of memory cells 340-1 forming the memory cell layer MCL1.

The first conductive line layer 110L may include a plurality of first conductive lines 110 that extend in parallel in a first direction (the X direction) and are spaced apart from each other. The second conductive line layer 320L may include a plurality of second conductive lines 320 that extend in parallel in a second direction (the Y direction) perpendicular to the first direction and are spaced apart from each other. The second conductive lines 320 may have a bottom surface including convex portions 320cv and concave portions 320cc, due to a level difference between top surfaces of the memory cells 340-1 and top surfaces of the first insulating structures 360a, e.g., due to different distances from the substrate to the surfaces of the memory cells 340-1 and from the substrate to the surfaces of the first insulating structures 360a.

The memory cell layer MCL1 may include the plurality of memory cells 340-1 respectively disposed at a plurality of cross points between the first conductive lines 110 and the second conductive lines 320. The memory cells 340-1 may each have a structure in which a bottom electrode layer 141-1, a selection device layer 143-1, a middle electrode layer 145-1, a variable resistance layer 147-1, and a top electrode layer 349-1 are stacked in this stated order. The top electrode layer 349-1 may be a heating electrode layer.

The thickness H5 of the top electrode layer 349-1 may be greater than the thickness H5' of the middle electrode layer 145-1 and/or the thickness H5" of the bottom electrode layer 141-1. The thickness H5 of the top electrode layer 349-1 may be relatively large, and the length of a vertical axis path from a heat source HC up to the second conductive lines 320 may increase and thus a heat transmission path may be advantageously extended.

The plurality of insulation structures 360a and 360b, e.g., first and second insulation structures 360a and 360b, may be between the plurality of first conductive lines 110, between the plurality of second conductive lines 320, and between the plurality of memory cells 340-1. The first insulating structures 360a may be arranged alternately with the memory cells 340-1 in the second direction under the second conductive lines 320. Levels of top surfaces of the first insulating structures 360a may be higher than those of top surfaces of the memory cells 340-1, e.g., a distance from top surfaces of the first insulating structures 360a to the substrate 101 may be greater than a distance from the substrate 101 to top surfaces of the memory cells 340-1. For example, bottom surfaces of the second conductive lines 320 may have the convex portions 320cv and the concave portions 320cc. The second insulating structures 360b may be in spaces defined by the memory cells 340-1, the first insulating structures 360a, and the second conductive lines 320.

Referring to FIG. 12, each of the first insulating structures 360a may include a base portion 360ab and a hill portion 360ak, based on a positional relation with the heat source HC. The base portion 360ab may be a portion of the first insulation structure 360a that is lower than the level of the interface between the first variable resistance layer 147-1 and the first top electrode layer 349-1, e.g., a distance from the base portion 360ab to the substrate 101 may be less than a distance from the substrate to the interface. The hill portion 360ak may be a portion of the first insulation structure 360a that is higher than the level of the interface between the first variable resistance layer 147-1 and the first top electrode layer 349-1, e.g., a distance from the hill portion 360ak to the substrate 101 may be greater than a distance from the substrate 101 to the interface.

A heat transmission path in a third direction (the Z direction) may be induced by the hill portion 360ak, e.g., may go over or around the hill portion 360ak, and the height H8 of the hill portion 360ak may correspond to the length of a vertical axis path of the heat transmission path. The height H8 of the hill portion 360ak may correspond to a sum of the thickness H5 of the top electrode layer 349-1 and the thickness H7 of each convex portion 320cv of each second conductive line 320. A cell pitch D1 between adjacent memory cells 340-1a, 340-1b, and 340-1c in the first direction (the X direction) may correspond to the length of a horizontal axis path of the heat transmission path.

In the memory device 100c according to the present embodiment, a vertical axis path of the heat transmission path from the heat source HC may be extended due to the increased relative thickness H5 of the top electrode layer 349-1 relative to the thickness H5' of the middle electrode layer 145-1 and the thickness H5" of the bottom electrode layer 141-1. Accordingly, the cell pitch D1 between the memory cells 340-1a, 340-1b, and 340-1c may be maintained, and undesirable thermal cross-talk between the memory cells 340-1a, 340-1b, and 340-1c may be suppressed.

As described with reference to FIG. 4B, the thickness H8 of the hill portion 360ak in the Z direction, e.g., the sum of the thickness H5 of the top electrode layer 349-1 and the thickness H7 of the convex portion 320cv of the second conductive line 320, may be equal to or greater than about 50 Å. In an implementation, the sum of the thickness H5 of the top electrode layer 349-1 and the thickness H7 of the convex portion 320cv of the second conductive line 320 may be equal to or less than about 1000 Å.

Figure 13:
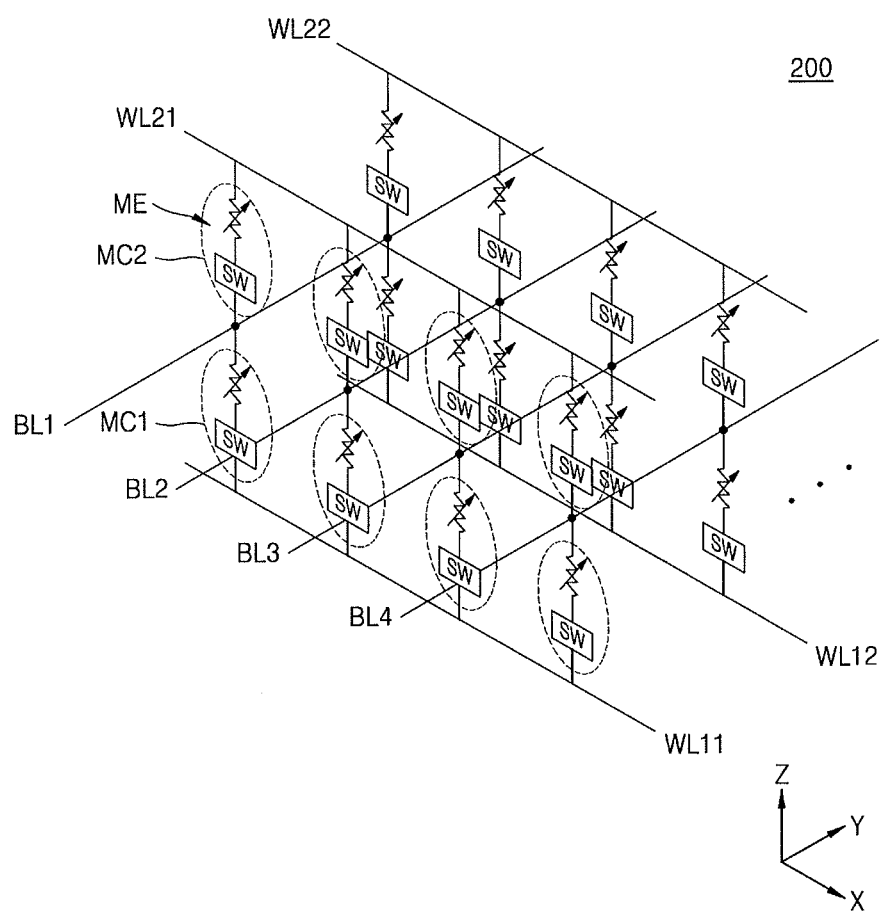
FIG. 13 illustrates an equivalent circuit diagram of a memory device according to another embodiment.

FIG. 13 illustrates an equivalent circuit diagram of a memory device 200 according to another embodiment.

The memory device 200 is similar to the memory device 100 of FIG. 1, but is different from the memory device 100 in that lower word lines WL11 and WL12 and upper word lines WL21 and WL22 may be disposed with common bit lines BL1 to BL4 therebetween. Overlapping or repeated descriptions may be only briefly described.

Referring to FIG. 13, the memory device 200 may include the lower word lines WL11 and WL12, the common bit lines BL1 to BL4, and the upper word lines WL21 and WL22. The lower word lines WL11 and WL12 may extend in a first direction X and may be spaced apart from each other in a second direction Y perpendicular to the first direction X. The common bit lines BL1 to BL4 may be spaced apart from the lower word lines WL11 and WL12 in a third direction Z perpendicular to the first direction X and may extend in the second direction Y. The upper word lines WL21 and WL22 may be spaced apart from the common bit lines BL1 to BL4 in the third direction Z and may extend in the first direction.

A first memory cell MC1 and a second memory cell MC2 may be between the common bit lines BL1 to BL4 and the lower word lines WL11 and WL12 and between the common bit lines BL1 to BL4 and the upper word lines WL21 and WL22, respectively. For example, a plurality of the first memory cells MC1 may be respectively disposed at a plurality of cross points between the common bit lines BL1 to BL4 and the lower word lines WL11 and WL12, and a plurality of the second memory cells MC2 may be respectively disposed at a plurality of cross points between the common bit lines BL1 to BL4 and the upper word lines WL21 and WL22. Each of the first and second memory cells MC1 and MC2 may include a variable resistance layer ME for storing information and a selection device layer SW for selecting a memory cell.

The first memory cell MCI and the second memory cell MC2 may be disposed in the same structure in the third direction. For example, in the first memory cell MC1 disposed between the lower word line WL11 and the common bit line BL1, the selection device layer SW may be electrically connected to the lower word line WL11, the variable resistance layer ME may be electrically connected to the common bit line BL1, and the variable resistance layer ME and the selection device layer SW may be serially connected to each other. In an implementation, in the second memory cell MC2 disposed between the upper word line WL21 and the common bit line BL1, the variable resistance layer ME may be electrically connected to the upper word line WL21, the selection device layer SW may be electrically connected to the common bit line BL1, and the variable resistance layer ME and the selection device layer SW may be serially connected to each other.

In an implementation, unlike illustrated FIG. 1, in each of the first memory cell MC1 and the second memory cell MC2, the selection device layer SW and the variable resistance layer ME may be switched in their disposed positions. In an implementation, the first memory cell MC1 and the second memory cell MC2 may be disposed in a symmetrical structure with respect to the common bit lines BL1 to BL4 along the third direction. For example, in the first memory cell MC1, the variable resistance layer ME may be connected to the lower word line WL11 and the selection device layer SW may be connected to the common bit line BL1, and in the second memory cell MC2, the variable resistance layer ME may be connected to the upper word line WL21 and the selection device layer SW may be connected to the common bit line BL2, whereby the first memory cell MC1 and the second memory cell MC2 may be disposed symmetrical about the common bit line BL1.

Hereinafter, a method of driving the memory device 200 will be briefly described.

A voltage may be applied to the variable resistance layer ME of the first memory cell MCI or the second memory cell MC2 through the word lines WL11, WL12, WL21 and WL22 and the common bit lines BL1 to BL4. A resistance of the variable resistance layer ME may be reversibly shifted between a first state and a second state according to the applied voltage.

Any memory cells MC1 and MC2 may be addressed by selecting the word lines WL11, WL12, WL21 and WL22 and the common bit lines BL1 to BL4 and may be programmed by applying a certain signal between the word lines WL11, WL12, WL21 and WL22 and the common bit lines BL1 to BL4. In addition, information (e.g., programmed information) based on a resistance value of a variable resistor layer configuring each of the addressed memory cells MC1 and MC2 may be read out by measuring a current value through the common bit lines BL1 to BL4. Detailed descriptions are substantially the same as those provided with reference to FIG. 1.

Figure 14:
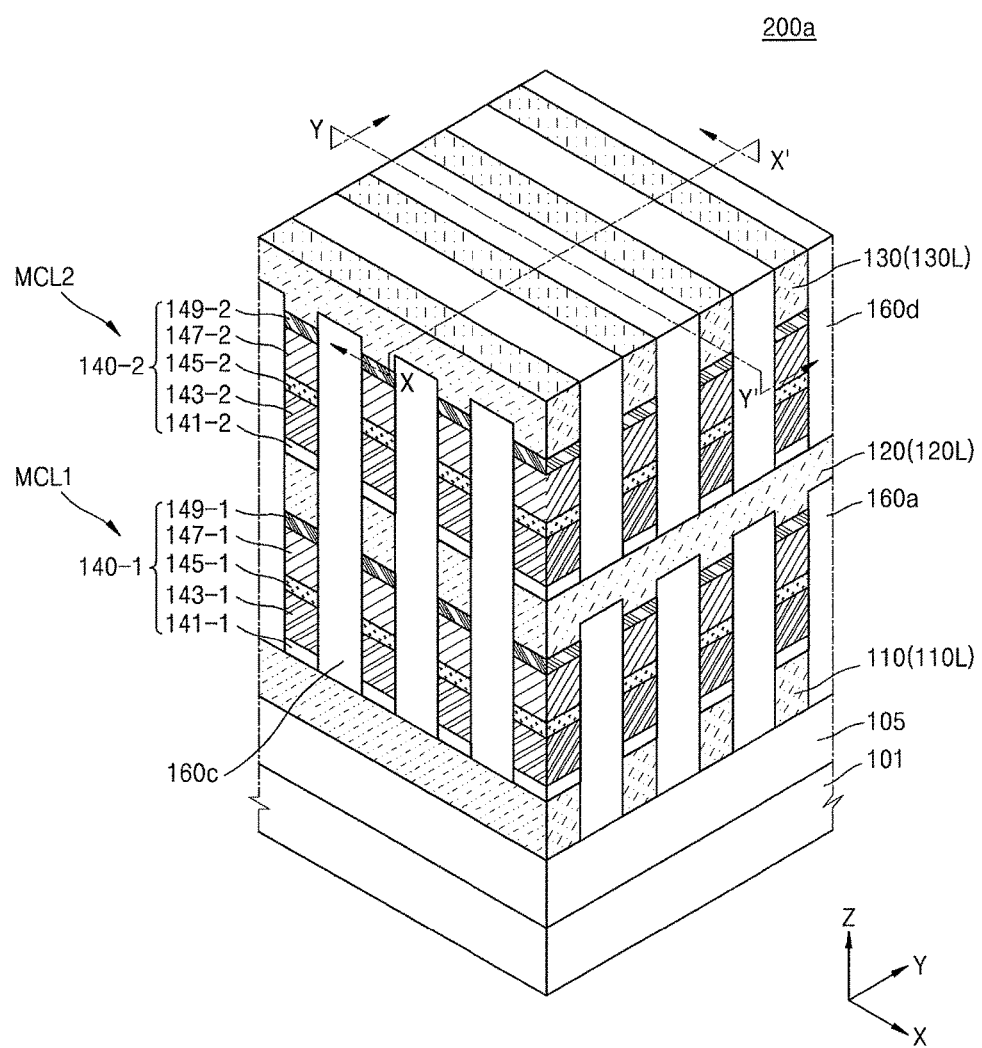
FIG. 14 illustrates a perspective view of a memory device according to another embodiment.
Figure 15:
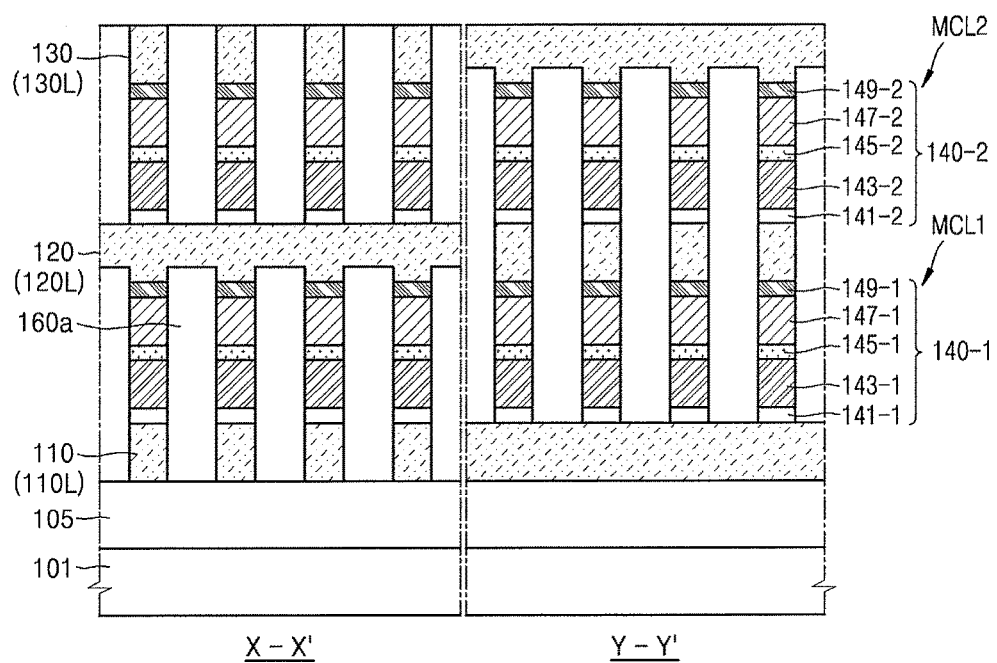
FIG. 15 illustrates a cross-sectional view taken along line X-X' and line Y-Y' of FIG. 14.

FIG. 14 illustrates a perspective view of a memory device 200a according to another embodiment. FIG. 15 is a cross-sectional view taken along line X-X' and line Y-Y' of FIG. 14. The memory device 200a has a structure for increasing a heat transmission path between adjacent memory cells, and is similar to the memory device 100a of FIGS. 2 to 4A in that the memory device 200a includes insulating structures 160a and 160c having top surfaces higher than those of memory cells 140-1 and 140-2. The memory device 200a is different from the memory device 100a of FIGS. 2 to 4A in that the memory device 200a has a two-layer structure where a second memory cell layer MCL2 is disposed on a first memory cell layer MCL1.

Referring to FIGS. 14 and 15, the memory device 200a may include first to third conductive line layer 110L, 120L, and 130L, spaced apart from each other in a third direction (the Z direction) and sequentially disposed on a substrate 101, the first memory cell layer MCL1 between the first and second conductive line layers 110L and 120L, the second memory cell layer MCL2 between the second and third conductive line layers 120L and 130L, and first to third insulating structures 160a, 160c, and 160d between a plurality of memory cells 140-1 and 140-2 forming the first and second memory cell layers MCL1 and MCL2.

The first conductive line layer 110L may include a plurality of first conductive lines 110 that extend in parallel in a first direction (the X direction) and are spaced apart from each other. The second conductive line layer 120L may include a plurality of second conductive lines 120 that extend in parallel in a second direction (the Y direction) perpendicular to the first direction and are spaced apart from each other. The third conductive line layer 130L may include a plurality of third conductive lines 130 that extend in parallel in the first direction (the X direction).

Bottom surfaces of the second and third conductive lines 120 and 130 may each have a structure in which a plurality of convex portions and a plurality of concave portions are alternately arranged. The structures of the second and third conductive lines 120 and 130 may be the same as those of the second conductive lines 120 shown in FIGS. 2 to 4A.

In terms of driving of the memory device 200a, the first conductive lines 110 may correspond to the lower word lines WL11 and WL12 of FIG. 13, the third conductive lines 130 may correspond to the upper word lines WL21 and WL22 of FIG. 13, and the second conductive lines 120 may correspond to the common bit lines BL1 to BL4 of FIG. 13. On the contrary, the first conductive lines 110 and the third conductive lines 130 may correspond to the common bit lines BL1 to BL4 of FIG. 13, and the second conductive lines 120 may correspond to the lower and upper word lines WL11, WL12, WL21, and WL22 of FIG. 13.

The first conductive lines 110 may intersect the second conductive lines 120, and the second conductive lines may intersect the third conductive lines. The first memory cells 140-1 may be respectively disposed in areas where the first conductive lines 110 and the second conductive lines 120 between the first conductive line layer 110L and the second conductive line layer 120L intersect each other. The second memory cells 140-2 may be respectively disposed in areas where the second conductive lines 120 and the third conductive lines 130 between the second conductive line layer 120L and the third conductive line layer 130L intersect each other.

The first memory cells 140-1 may each include a bottom electrode layer 141-1, a selection device layer 143-1, a middle electrode layer 145-1, a variable resistance layer 147-1, and a top electrode layer 149-1, and the second memory cells 140-2 may each include a bottom electrode layer 141-2, a selection device layer 143-2, a middle electrode layer 145-2, a variable resistance layer 147-2, and a top electrode layer 149-2. The top electrode layers 149-1 and 149-2 may be heating electrode layers. The structures of the first memory cells 140-1 may be substantially the same as those of the second memory cells 140-2.

The selection device layer 143-1 may be a current control layer for controlling a flow of a current. The selection device layer 143-1 may correspond to the selection device layer SW of FIG. 13.

The variable resistance layer 147-1 may have a resistance that varies depending on an electric field, and may store actual data. The variable resistance layer 147-1 may correspond to the variable resistance layer ME of FIG. 13.

First to third insulating structures 160a, 160c, and 160d may be arranged between the plurality of first conductive lines 110, between the plurality of second conductive lines 120, between the plurality of third conductive lines 130, and between the plurality of first memory cells 140-1.

For example, the first insulating structures 160a may be arranged alternately with the memory cells 140-1, arranged in a line in the second direction, under the second conductive lines 120. The first insulating structures 160a may have top surfaces that are higher than top surfaces of the first memory cells 140-1. Accordingly, bottom surfaces of the second conductive lines 120 may each have a structure in which a plurality of convex portions, which are connected to the top surfaces of the first memory cells 140-1, and a plurality of concave portions, which accommodate the first insulating structures 160a between the plurality of convex portions, are alternately arranged.

The second insulating structures 160c may be formed in spaces defined by the first memory cells 140-1, the first insulating structures 160a, and the second conductive lines 120, and spaces arranged alternately with the second memory cells 140-2, arranged in a line in the first direction (the X direction), under the third conductive lines 130. The second insulating structures 160c may have top surfaces higher than those of the second memory cells 140-2, e.g., may have top surfaces farther from the substrate 101 than those of the second memory cells 140-2. Accordingly, bottom surfaces of the third conductive lines 130 may each have a structure in which a plurality of convex portions, which are connected to the top surfaces of the second memory cells 140-2, and a plurality of concave portions, which accommodate the second insulating structures 160c between the plurality of convex portions, are alternately arranged.

The third insulating structures 160d may be formed in spaces defined by the second memory cells 140-2, the second insulating structures 160c, and the third conductive lines 130. For example, the third insulating structures 160d may contact side walls of the second memory cells 140-2, side walls of the second insulating structures 160c, and side walls of the third conductive lines 130, and may extend from top surfaces of the second conductive lines 120 up to levels that are equal to those of top surfaces of the third conductive lines 130.

As described above, the memory device 200a according to the present embodiment may include the first and second insulating structures 160a and 160a having top surfaces higher than those of the first and second memory cells 140-1 and 140-2, and a heat transmission path between adjacent memory cells may be extended, and thus, thermal cross-talk may be suppressed, thereby improving the reliability of the memory device 200a.

Figure 16:
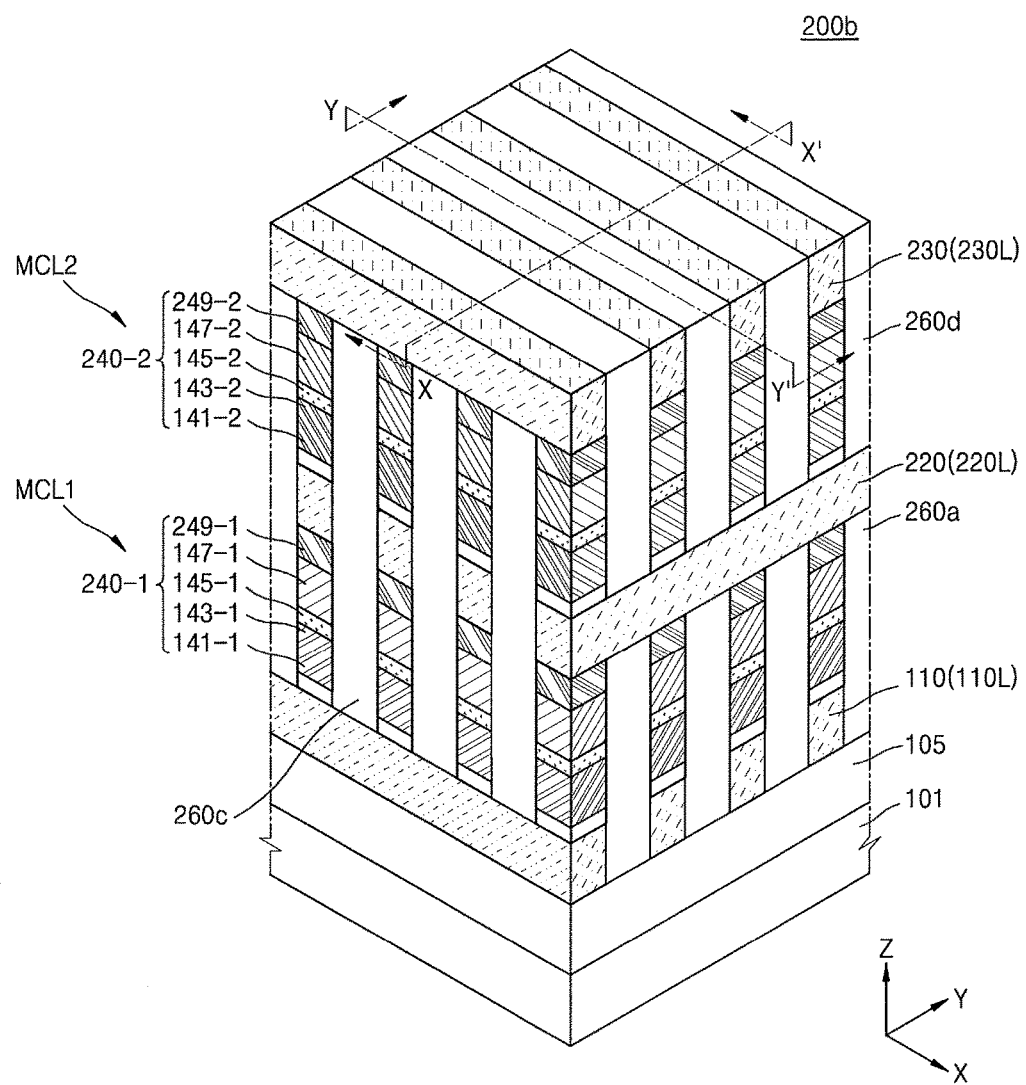
FIG. 16 illustrates a perspective view of a memory device according to another embodiment.
Figure 17:
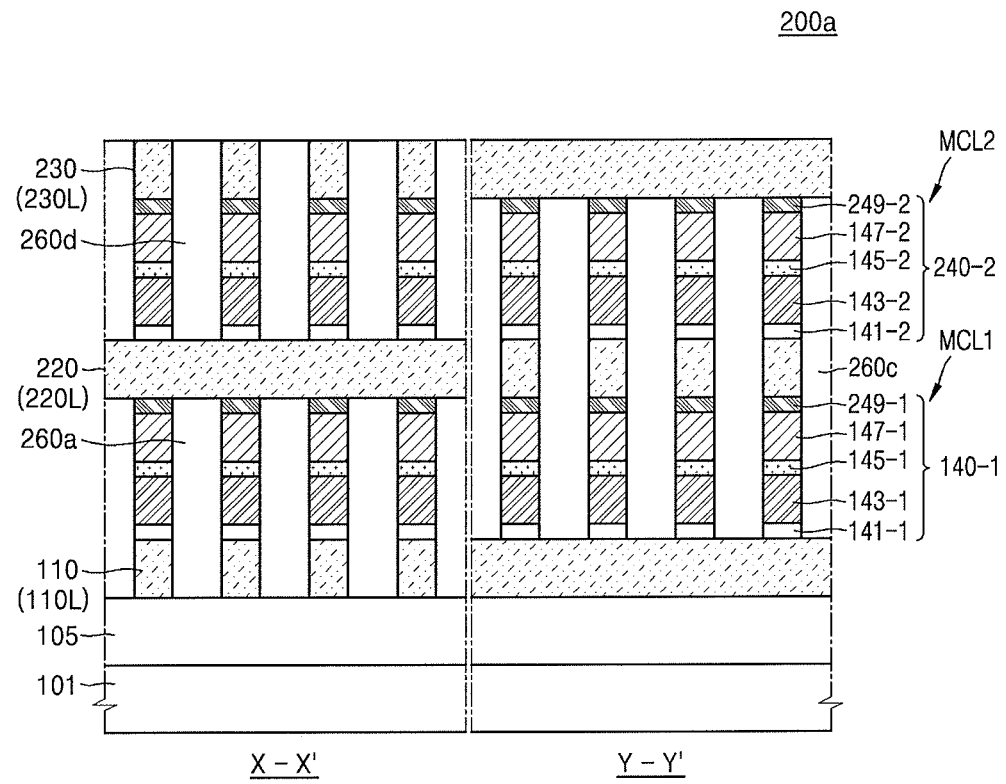
FIG. 17 illustrates a cross-sectional view taken along line X-X' and line Y-Y' of FIG. 16.

FIG. 16 illustrates a perspective view of a memory device 200b according to another embodiment. FIG. 17 illustrates a cross-sectional view taken along line X-X' and line Y-Y' of FIG. 16. The memory device 200b may have a structure for increasing a heat transmission path between adjacent memory cells, and is similar to the memory device 100b of FIGS. 7 to 9 in that the thicknesses of top electrode layers 249-1 and 249-2 in memory cells 240-1 and 240-2 of the memory device 200b are larger than those of bottom and/or middle electrode layers 141-1, 141-2, 143-1, and 143-2 in the memory cells 240-1 and 240-2. Also, the memory device 200b is similar to the memory device 200a of FIGS. 14 and 15 in that the memory device 200b has a two-layer structure where a second memory cell layer MCL2 is disposed on a first memory cell layer MCL1.

Referring to FIGS. 16 and 17, the thicknesses of the top electrode layers 249-1 and 249-2 in the first and second memory cells 240-1 and 240-2 of the first and second memory cell layers MCL1 and MCL2 may be larger than those of the bottom electrode layers 141-1 and 141-2 and the middle electrode layers 143-1 and 143-2 in the first and second memory cells 240-1 and 240-2. In an implementation, the thicknesses of the top electrode layers 249-1 and 249-2 may be about 50 Å to about 500 Å.

First and second insulating structures 260a and 260c may be formed between the first memory cells 240-1 and 240-2 and first to third conductive lines 110, 220, and 230. The first insulating structure 260a may have a top surface having a level that is equal to that of a top surface of the first memory cell 240-1, and the second insulating structure 260c may have a top surface having a level that is equal to that of a top surface of the second memory cell 240-2.

In the memory device 200b, a heat transmission distance from a heat source increases due to the thicknesses of the top electrode layers 249-1 and 249-2, and thus, thermal cross-talk between adjacent memory cells may be suppressed. Detailed descriptions are the same as those provided with reference to FIGS. 7 to 9, 14, and 15.

Figure 18:
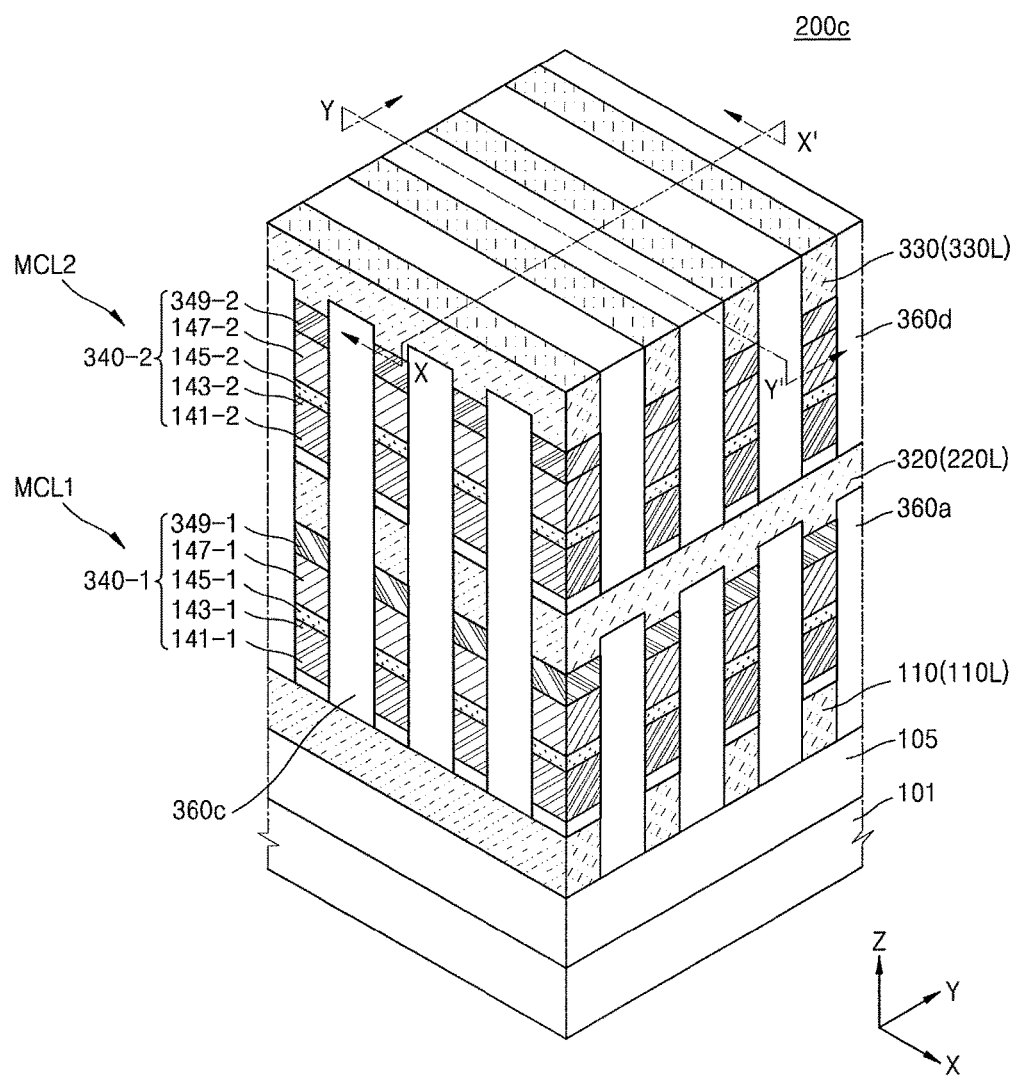
FIG. 18 illustrates a perspective view of a memory device according to another embodiment.
Figure 19:
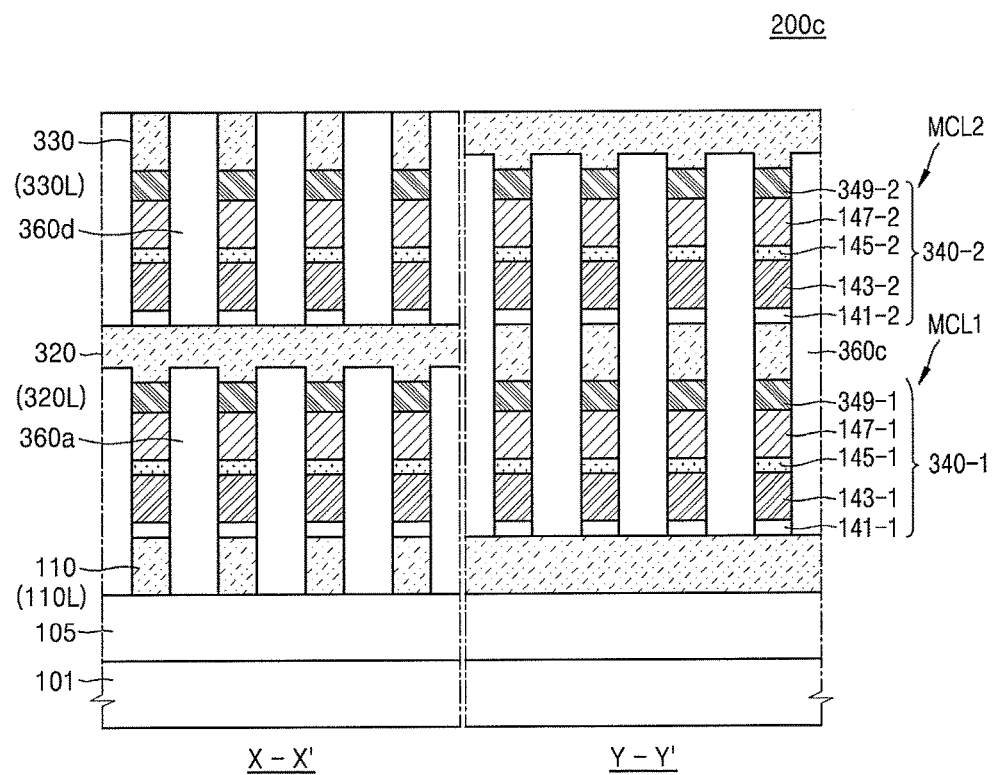
FIG. 19 illustrates a cross-sectional view taken along line X-X' and line Y-Y' of FIG. 18.

FIG. 18 illustrates a perspective view of a memory device 200c according to another embodiment. FIG. 19 illustrates a cross-sectional view taken along line X-X' and line Y-Y' of FIG. 18. The memory device 200c has a structure for increasing a heat transmission path between adjacent memory cells, and is similar to the memory device 200a of FIGS. 14 and 15 and the memory device 200b of FIGS. 16 and 17 in that the memory device 200c includes first and second insulating structures 360a and 360c having top surfaces higher than those of first and second memory cells 340-1 and 340-2 and the thicknesses of top electrode layers 349-1 and 349-2 in the memory cells 340-1 and 340-2 are larger than those of bottom and/or middle electrode layers 141-1, 141-2, 143-1, and 143-2 in the memory cells 340-1 and 340-2.

The first and second insulating structures 360a and 360c may have top surfaces higher than those of the first and second memory cells 340-1 and 340-2, respectively, e.g., the first and second insulating structures 360a and 360c may have top surfaces that are farther from the substrate 101 than those of the first and second memory cells 340-1 and 340-2. Accordingly, bottom surfaces of second and third conductive lines 320 and 330 may each have a structure in which a plurality of convex portions and a plurality of concave portions are alternately arranged.

The thicknesses of the top electrode layers 349-1 and 349-2 in the first and second memory cells 340-1 and 340-2 of first and second memory cell layers MCL1 and MCL2 may be larger than those of the bottom electrode layers 141-1 and 141-2 and the middle electrode layers 143-1 and 143-2 in the first and second memory cells 340-1 and 340-2.

The thicknesses of the top electrode layers 249-1 and 249-2 may be about 50 Å to about 500 Å.

In an implementation, a level difference between the first memory cell 340-1 and the first insulating structure 360a, a level difference between the second memory cell 340-2 and the second insulating structure 360c, and the thicknesses of the top electrode layers 349-1 and 349-2 may be equal to or greater than about 50 Å.

In the memory device 200c, a heat transmission distance from a heat source may be increased due to the level difference between the first memory cell 340-1 and the first insulating structure 360a, the level difference between the second memory cell 340-2 and the second insulating structure 360c, and the thicknesses of the top electrode layers 349-1 and 349-2, and thus, thermal cross-talk between adjacent memory cells may be suppressed. Detailed descriptions are the same as those provided with reference to FIGS. 14 to 17.

FIGS. 20A to 20H illustrate cross-sectional views illustrated according to a process sequence to describe a method of manufacturing the memory device 100a, according to an embodiment.

Figure 20A:
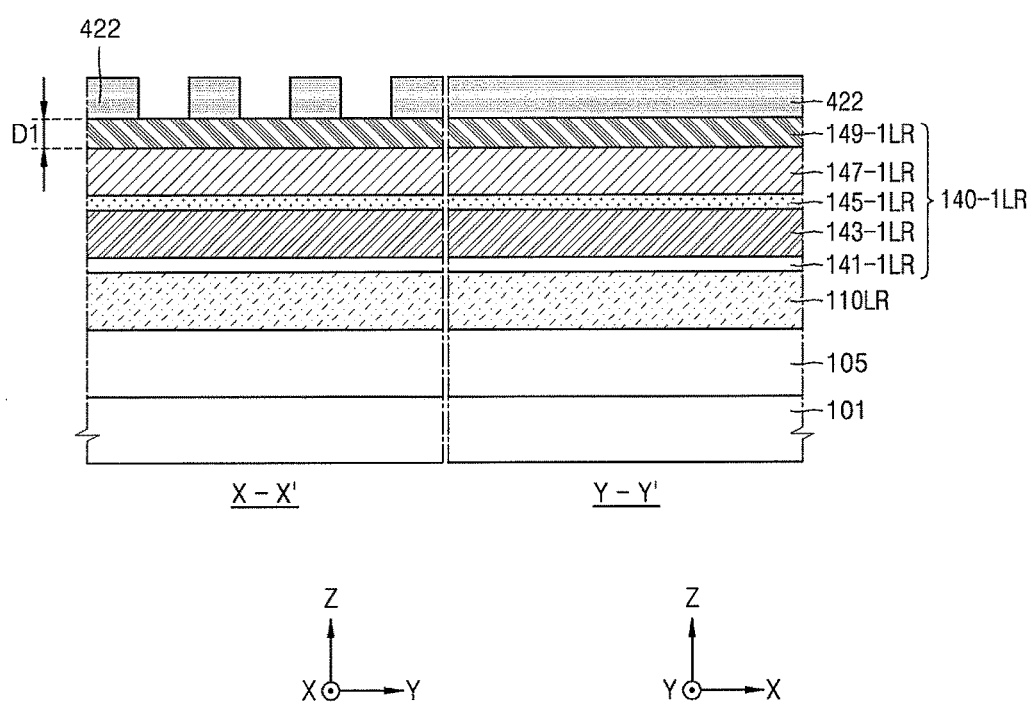
FIGS. 20A to 20H illustrate cross-sectional views of stages in a method of manufacturing a memory device according to a process sequence, according to an embodiment.

Referring to FIG. 20A, an interlayer insulation layer 105 may be formed on a substrate 102. In an implementation, an integrated circuit layer may be formed on the substrate 101 and memory cells may be formed on the integrated circuit layer.

A first conductive layer 110LR is formed on the interlayer insulation layer 105, and a memory cell stack structure 140-1LR for forming a cross-point array is formed by sequentially stacking a preliminary bottom electrode layer 141-1LR, a preliminary selection device layer 143-1LR, a preliminary middle electrode layer 145-1LR, a preliminary variable device layer 147-1LR, and a preliminary top electrode layer 149-1LR on the first conductive layer 110LR in this stated order.

The thickness T1 of the preliminary top electrode layer 149-1LR may be determined by taking into consideration that a portion of the preliminary top electrode layer 149-1LR is consumed to generate a difference between a top surface of a top electrode layer 149-1 and a top surface of an insulating structure 160a, as in FIGS. 2 to 4A. For example, the preliminary top electrode layer 149-1LR may be formed to be thick than the preliminary bottom electrode layer 141-1LR and the preliminary middle electrode layer 145-1LR. The first conductive layer 110LR may be an element for forming the first conductive lines 110 of FIGS. 2 to 4A.

Next, a first mask pattern 422 is formed on the memory cell stack structure 140-1LR. The first mask pattern 422 may include a plurality of line patterns that extend in parallel in a first direction (the X direction). The first mask pattern 422 may include a single layer or a multilayer where a plurality of layers are stacked. For example, the first mask pattern 422 may include a photoresist pattern, a silicon oxide pattern, a silicon nitride pattern, a silicon oxynitride pattern, a polysilicon pattern, or a combination thereof. The first mask pattern 422 may be formed by using various materials.

Figure 20B:
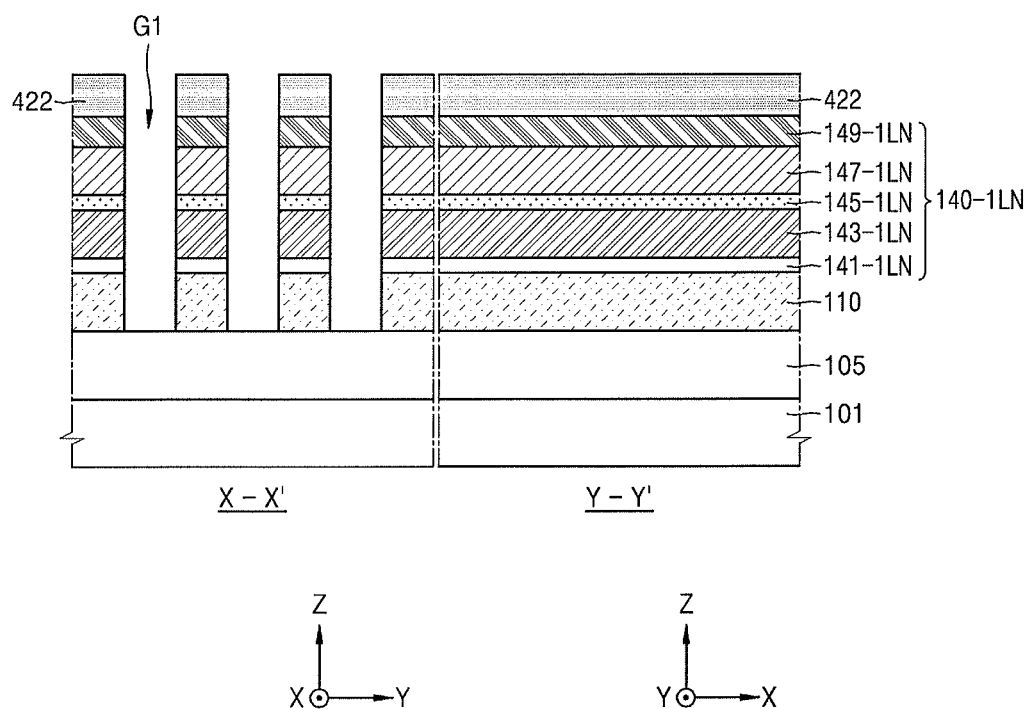

Referring to FIG. 20B, the memory cell stack structure 140-1LR and the first conductive layer 110LR of FIG. 20A may be sequentially etched by using the first mask pattern 422 as an etch mask. As a result, the memory cell stack structure 140-1LR of FIG. 20A may be divided into a plurality of memory cell stack lines 140-1LN that extend in parallel in the first direction (the X direction), and the first conductive layer 110LR of FIG. 20A may be divided into a plurality of first conductive lines 110. Accordingly, a plurality of first gaps G1 extending in parallel in the first direction (the X direction) may be respectively formed between every two adjacent first conductive lines 110 from among the plurality of first conductive lines 110 and also respectively formed between every two adjacent memory cell stack line 140-1LN from among the plurality of memory cell stack lines 140-1LN. Each of the plurality of memory cell stack lines 140-1LN may have a structure where a bottom electrode line 141-1LN, a selection device line 143-1LN, a middle electrode line 145-1LN, a variable device line 147-1LN, and a top electrode line 149-1LN are stacked.

Figure 20C:
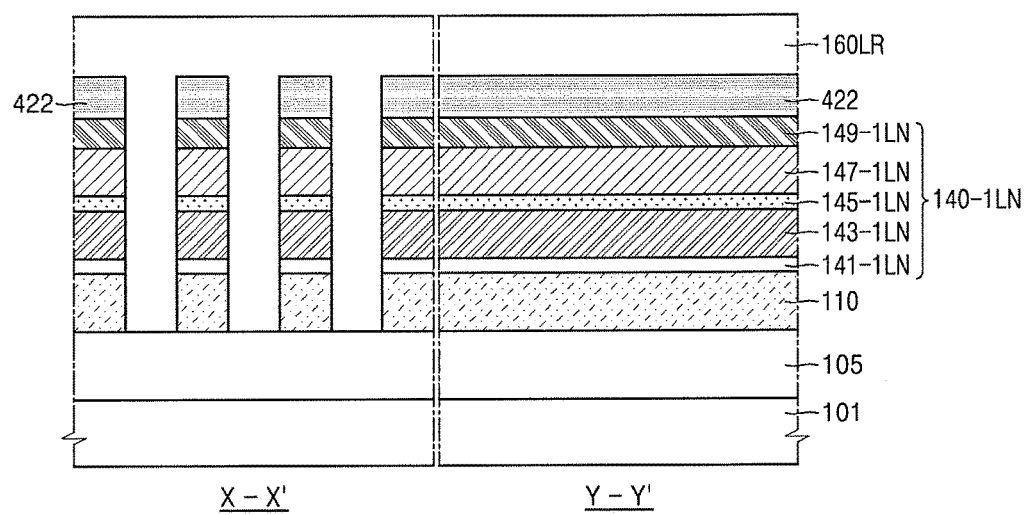
Figure 20D:
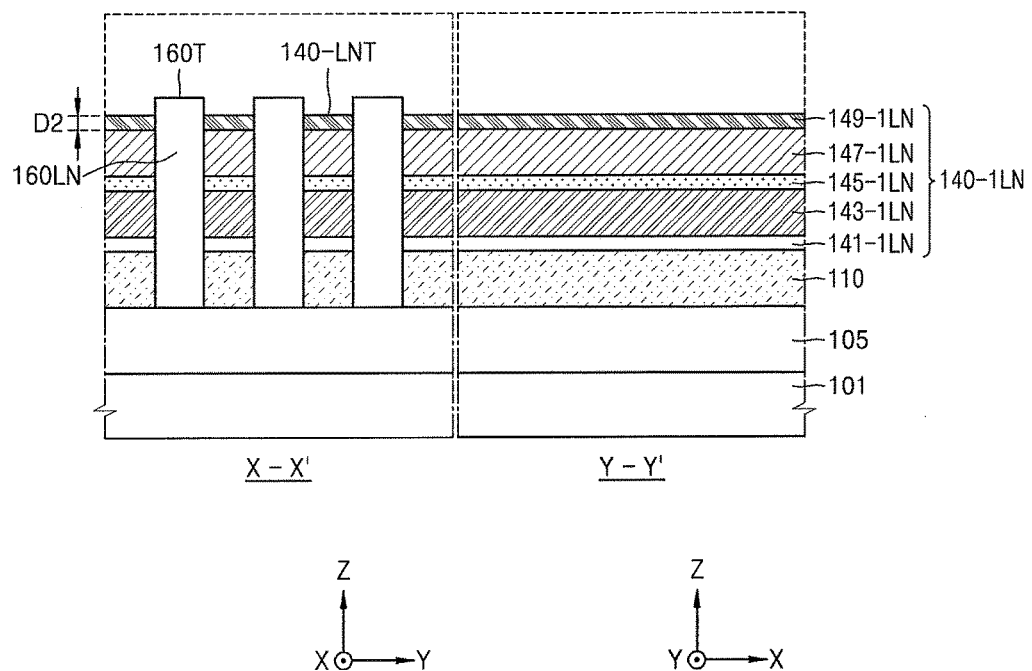

Referring to FIG. 20C, a gap-fill insulation layer 160LR may be formed to fill the plurality of first gaps G1 of FIG. 20B and cover the first mask pattern 422. The gap-fill insulation layer 160LR may correspond to a preceding structure of the insulating structure 160a of FIGS. 2 to 4A. Referring to FIG. 20D, the gap-fill insulation layer 160LR and the first mask pattern 422 of FIG. 20C may be planarized by using a chemical mechanical polishing (CMP) process until the gap-fill insulation layer 160LR is divided into a plurality of insulation lines 160LN by the plurality of first gaps G1. A polishing condition for the CMP process may be selected to be suitable for removal of the first mask pattern 422 to prevent a residual of the first mask pattern 422. In this case, a top surface 140-LNT of the top electrode line 149-1LN formed of a conductive material may be lower than top surfaces 160T of the insulation lines 160LN, due to a dishing phenomenon. The thickness T2 of the top electrode line 149-1LN of FIG. 20D may decrease compared to the thickness T1 of the top electrode layer 149-1LR of FIG. 20A before the planarization.

Figure 20E:
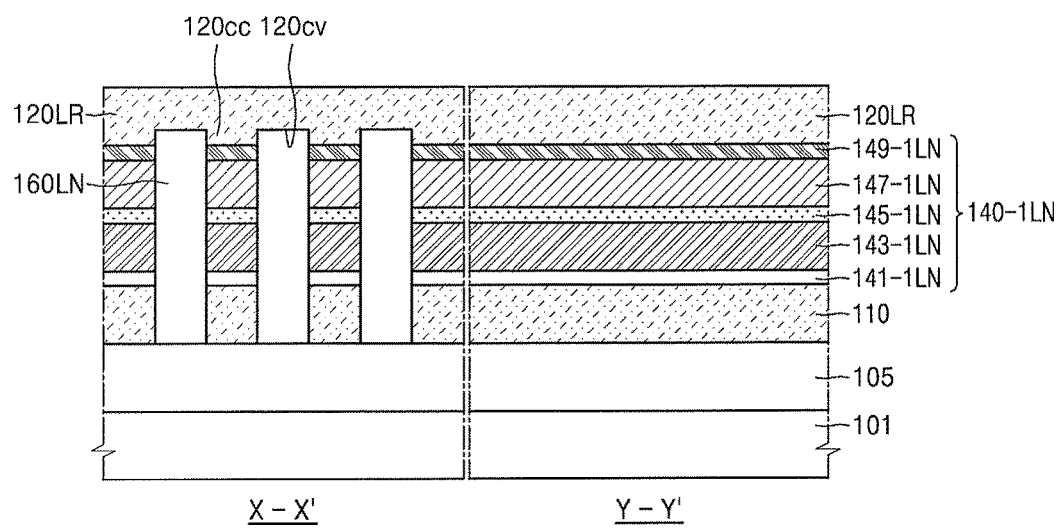

Referring to FIG. 20E, a second conductive layer 120LR may be formed on an exposed top surface of the top electrode line 149-1LN and protruding top surfaces 160T of the plurality of insulation lines 160LN. In this case, the top surface 140-LNT of the top electrode line 149-1LN may be lower than the top surfaces 160T of the insulation lines 160LN, and a bottom surface of the second conductive layer 120LR may include a plurality of convex portions 120ev and a plurality of concave portions 120cc. For example, the top surface 140-LNT of the top electrode line 149-1LN may be connected to the convex portions 120cv of the bottom surface of the second conductive layer 120LR. The top surfaces 160T of the insulation lines 160LN may be connected to the concave portions 120cc of the bottom surface of the second conductive layer 120LR. A level difference between the top surface 140-LNT of the top electrode line 149-1LN and the top surfaces 160T of the insulation lines 160LN may be used as a vertical axis path of the heat transmission path described with reference to FIGS. 2 to 4A.

Figure 20F:
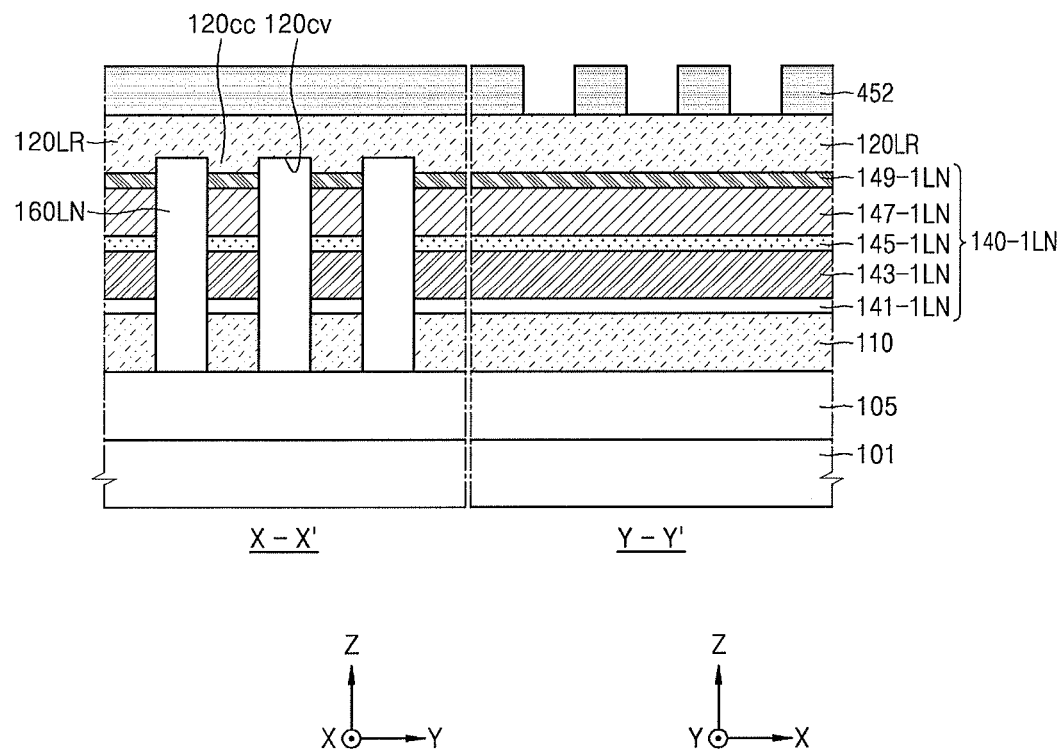

Referring to FIG. 20F, a second mask pattern 452 is formed on the second conductive layer 120LR. The second mask pattern 452 may include a plurality of line patterns that extend in parallel in the first direction (the X direction). The second mask pattern 452 may include a single layer or a multilayer where a plurality of layers are stacked. For example, the second mask pattern 452 may include a photoresist pattern, a silicon oxide pattern, a silicon nitride pattern, a silicon oxynitride pattern, a polysilicon pattern, or a combination thereof. The second mask pattern 452 may be formed by using various materials.

Figure 20G:
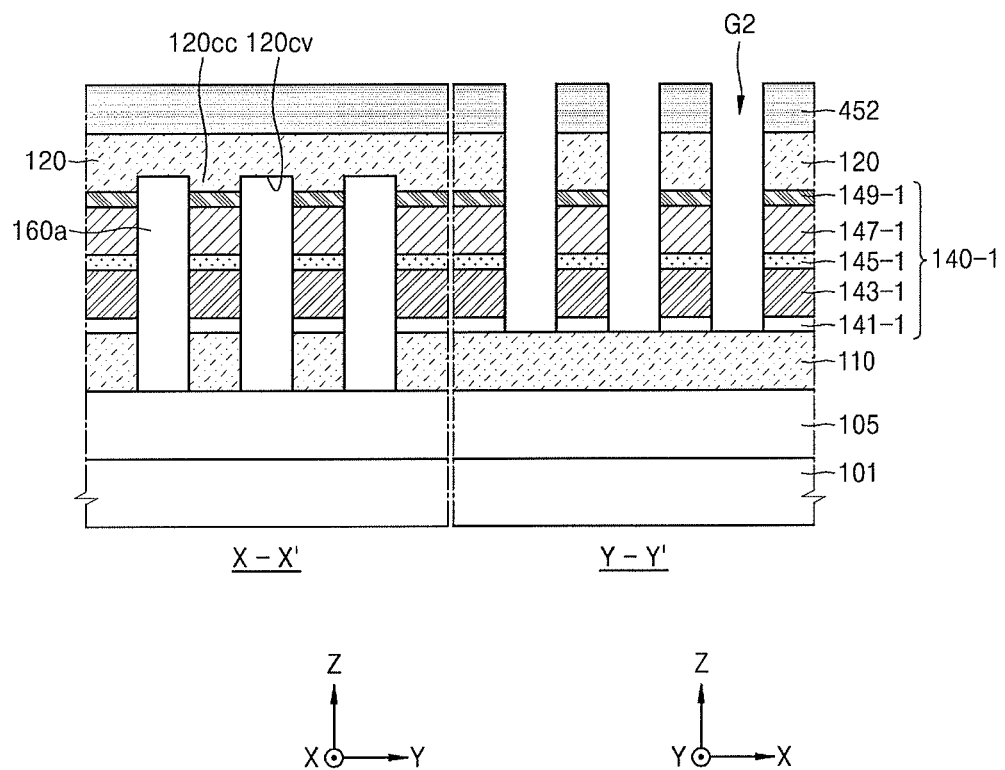

Referring to FIG. 20G, the second conductive layer 120LR, the plurality of memory cell stack lines 140-1LN, and the plurality of insulation lines LN may be etched by using the second mask pattern 452 as an etch mask so that the second conductive layer 120LR of FIG. 20F is divided into a plurality of second conductive lines 120 and each of the plurality of memory cell stack lines 140-1LN is divided into a plurality of memory cells 140-1. As a result, the plurality of memory cells 140-1, which are arranged at a plurality of cross points between the plurality of first conductive lines 110 and the plurality of second conductive lines 120, may be formed.

The plurality of second conductive lines 120 may each include a plurality of concave portions that accommodate top surfaces of a plurality of insulating structures 160a, and a plurality of convex portions that define the plurality of concave portions. A plurality of second gaps G2 may be respectively formed between every two adjacent memory cells 140-1 from among the plurality of memory cells 140-1 arranged in a line in the first direction (the X direction) and also respectively formed between every two adjacent second conductive lines 120 from among the plurality of second conductive lines 120 arranged in a line in the first direction (the X direction).

Figure 20H:
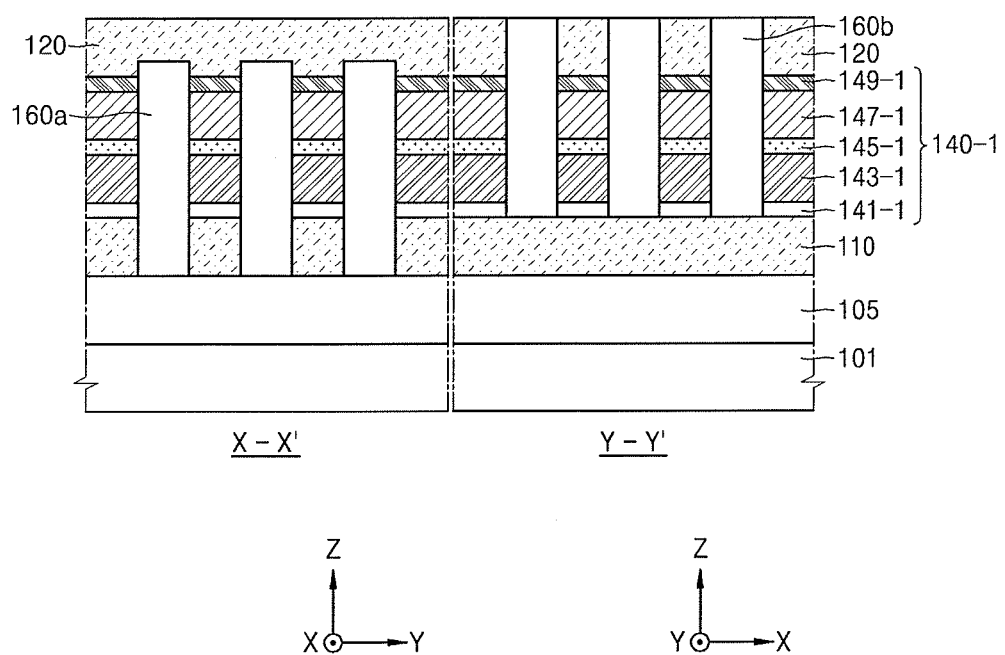

Referring to FIG. 20H, a gap-fill insulation layer that fills the plurality of second gaps G2 and covers the plurality of second conductive lines 120 may be formed after the second mask pattern 452 of FIG. 20 is removed. Next, the gap-fill insulation layer may be polished by a CMP process by using the plurality of second conductive lines 120 as a polishing stopper. Accordingly, a plurality of second insulating structures 160*b* that fills the plurality of second gaps G2 of FIG. 20G may be formed. Each second insulating structure 160*b* is formed between every two adjacent memory cells 140-1 from among a plurality of memory cells 140-1 arranged in a line in the first direction (the X direction). The second insulating structures 160*b* may extend in parallel in the second direction (the Y direction).

Figure 21A:
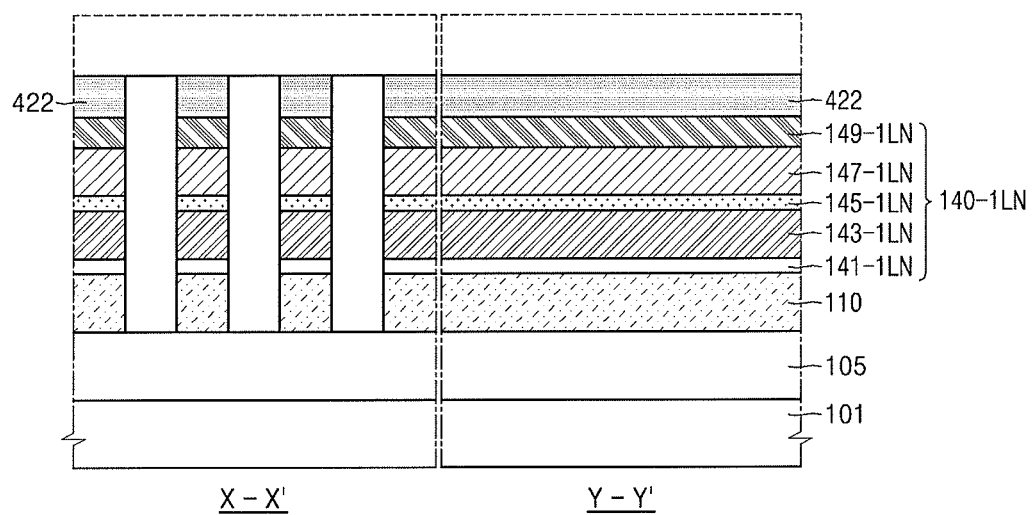
FIGS. 21A and 21B illustrate cross-sectional views of stages in a method of manufacturing a memory device according to a process sequence, according to another embodiment.
Figure 21B:
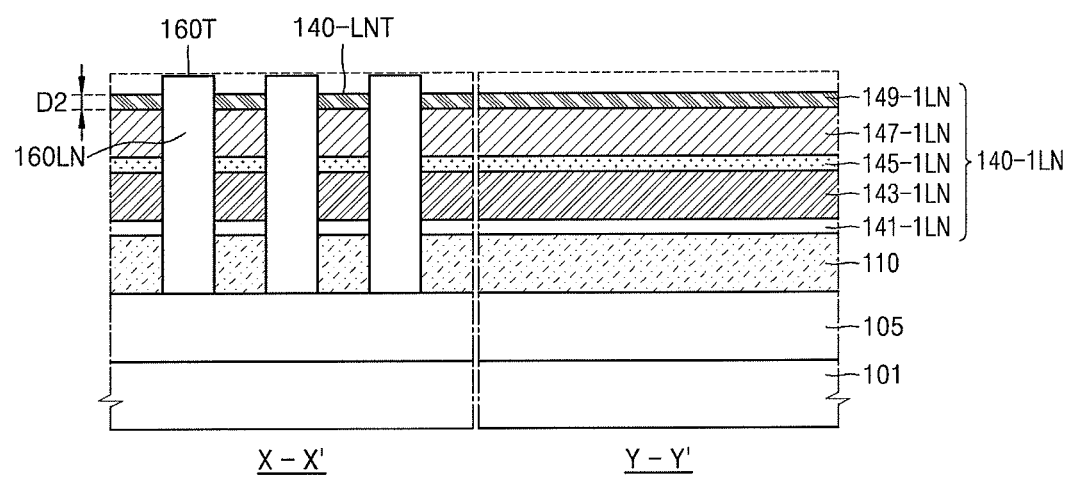

FIGS. 21A and 21B illustrate cross-sectional views for describing, according to a process sequence, a method of manufacturing the memory device 100*a*, according to another embodiment. The manufacturing method of FIGS. 21A and 21B is similar to the manufacturing method of FIGS. 20A to 20H, but is different from the manufacturing method of FIGS. 20A to 20H in a process of controlling a top surface 140-LNT of a top electrode line 149-1LN to be lower than a top surface 160T of an insulation line 160LN. Accordingly, the manufacturing method of FIGS. 21A and 21B may have process steps of FIGS. 20A to 20C as preceding steps, have process steps of FIGS. 21A and 21B as middle steps, and have process steps of FIGS. 20E to 20H as subsequent steps.

Referring to FIG. 21A, a CMP process may be performed until a first mask pattern 422 corresponding to the first mask pattern 422 of FIG. 20C is completely removed. Accordingly, the top surface 160T of the insulation line 160LN formed in a first gap and a top surface of a memory cell stack line 140-1LN may be exposed. Referring to FIG. 21B, only a top portion of the top electrode line 149-1LN may be selectively removed by using an etch selectivity difference between the gap-fill insulation layer 160LR and the top electrode line 149-1LN. In this case, wet etching or dry etching may be used as an etch process. As a result, the top surface 140-LNT of the top electrode line 149-1LN may be lower than the top surface 160T of the insulation line 160LN. Next, the memory device 100*a* may be manufactured by performing subsequent process steps described with reference to FIGS. 20E to 20H.

FIGS. 22A to 22D illustrate cross-sectional views of stages in a method of manufacturing the memory device 100*a*, according to another embodiment. The manufacturing method of FIGS. 22A to 22D is similar to the manufacturing method of FIGS. 20A to 20H, but is different from the manufacturing method of FIGS. 20A to 20H in a process of controlling a top surface 140-LNT of a top electrode line 149-1LN to be lower than a top surface 160T of an insulation line 160LN.

Figure 22A:
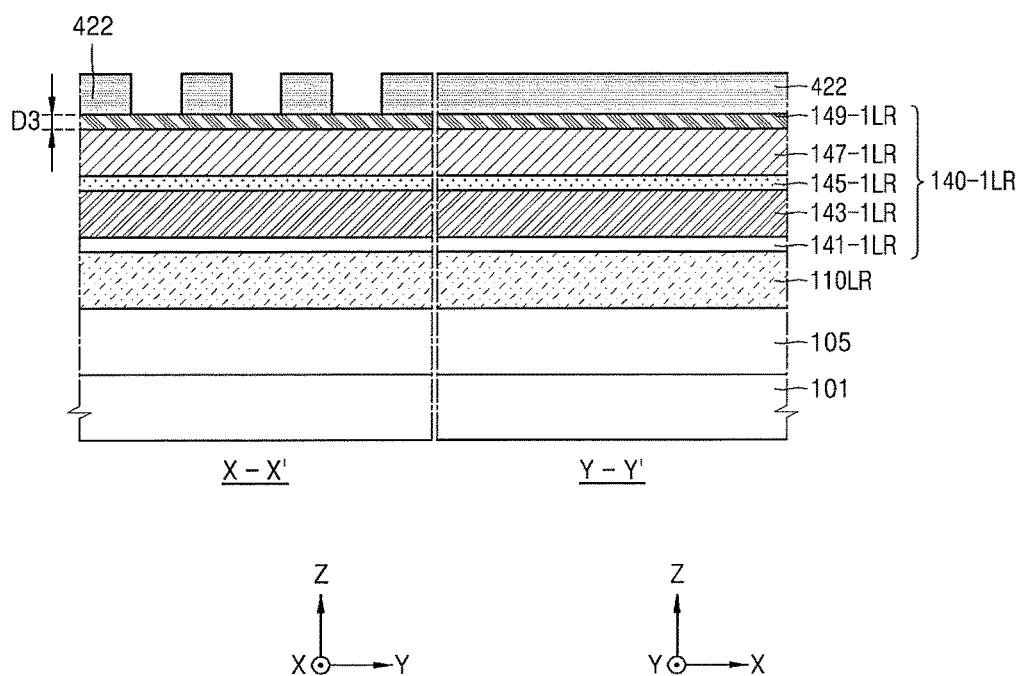
FIGS. 22A to 22D illustrate cross-sectional views of stages in a method of manufacturing a memory device according to a process sequence, according to another embodiment.

Referring to FIG. 22A, a memory cell stack structure 140-1LR is formed by sequentially stacking an interlayer insulation layer 105, a first conductive layer 110LR, a preliminary bottom electrode layer 141-1LR, a preliminary selection device layer 143-1LR, a preliminary middle electrode layer 145-1LR, a preliminary variable device layer 147-1LR, and a preliminary top electrode layer 149-1LR on a substrate 101 in this stated order. In this case, unlike in FIG. 20A, the preliminary top electrode layer 149-1LR may be formed to have a thickness T3 equal to those of the preliminary bottom electrode layer 141-1LR and the preliminary middle electrode layer 145-1LR. Next, a first mask pattern 422 may be formed on the memory cell stack structure 140-1LR.

Figure 22B:
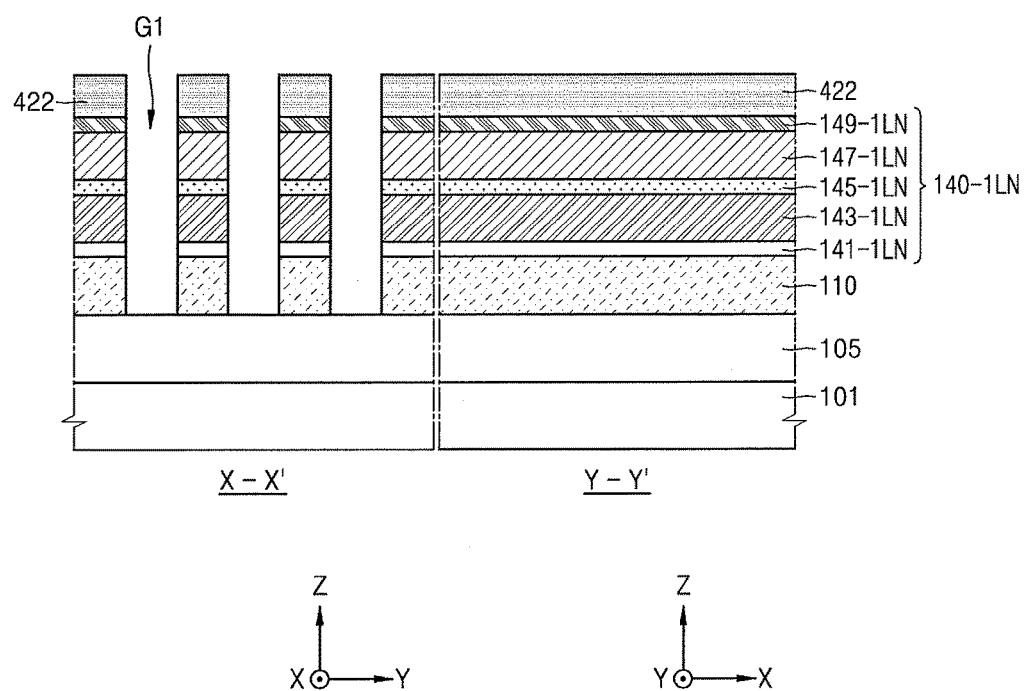

Referring to FIG. 22B, the memory cell stack structure 140-1LR and the first conductive layer 110LR of FIG. 22A may be sequentially etched by using the first mask pattern 422 as an etch mask. As a result, the memory cell stack structure 140-1LR of FIG. 22A may be divided into a plurality of memory cell stack lines 140-1LN, and the first conductive layer 110LR of FIG. 22A may be divided into a plurality of first conductive lines 110. Accordingly, a plurality of first gaps G1 may be respectively formed between every two adjacent first conductive lines 110 from among the plurality of first conductive lines 110 and also respectively formed between every two adjacent memory cell stack lines 140-1LN from among the plurality of memory cell stack lines 140-1LN.

Figure 22C:
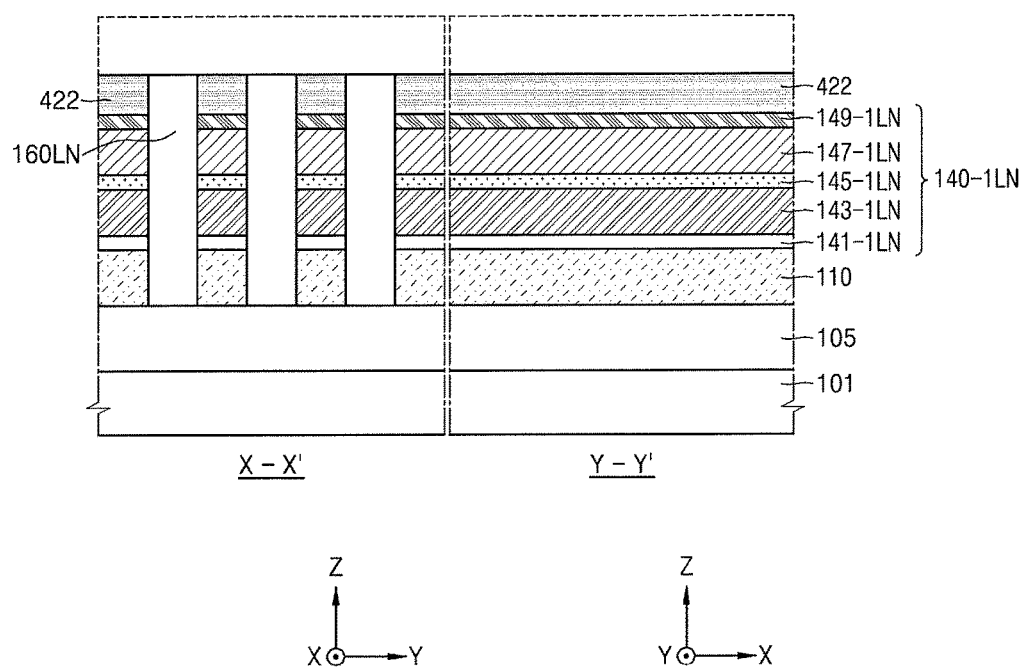

Referring to FIG. 22C, a gap-fill insulation layer 160LR may be formed to fill the plurality of first gaps G1 of FIG. 22B and cover the first mask pattern 422. The gap-fill insulation layer 160LR may correspond to a preceding structure of the insulating structure 160*a* of FIGS. 2 to 4A. Next, a CMP process may be performed until only portions of top portions of the gap-fill insulation layer 160LR and the first mask pattern 422 of FIG. 22C are removed. Accordingly a portion of the first mask pattern 422 may remain with a certain thickness on the memory cell stack line 140-1LN. In this case, the level of a top surface of the gap-fill insulation layer 160LR may be equal to that of a top surface of the first mask pattern 422.

Figure 22D:
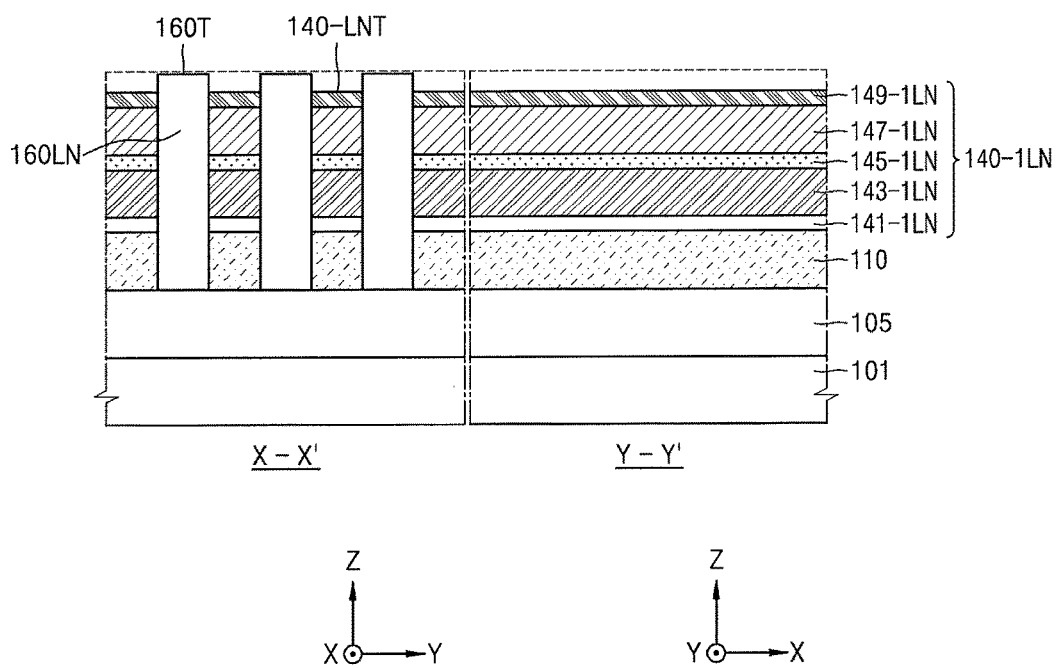

Referring to FIG. 22D, the first mask pattern 422 of FIG. 22C, which remains on the memory cell stack line 140-1LN, may be selectively removed by using an etch selectivity difference between the gap-fill insulation layer 160LR and the first mask pattern 422. In this case, wet etching or dry etching may be used as an etch process. As a result, the top surface 140-LNT of the top electrode line 149-1LN may be lower than the top surface 160T of the insulation line 160LN. Next, the memory device 100*a* may be manufactured by performing subsequent process steps described with reference to FIGS. 20E to 20H. Although different methods of manufacturing the memory device 100*a* of FIGS. 2 to 4A have been described with reference to FIGS. 20A to 22D, the memory device 100*b* of FIGS. 7 to 9 and the memory device 100*c* of FIGS. 10 to 12 may also be manufactured by using the manufacturing methods described with reference to FIGS. 20A to 22D.

FIGS. 23A to 23F illustrate cross-sectional views of stages in a method of manufacturing the memory device 200*a*, according to another embodiment. The manufacturing method of FIGS. 23A to 23F includes subsequent process steps in addition to including the process steps of FIGS. 20A to 20E as preceding process steps.

Figure 23A:
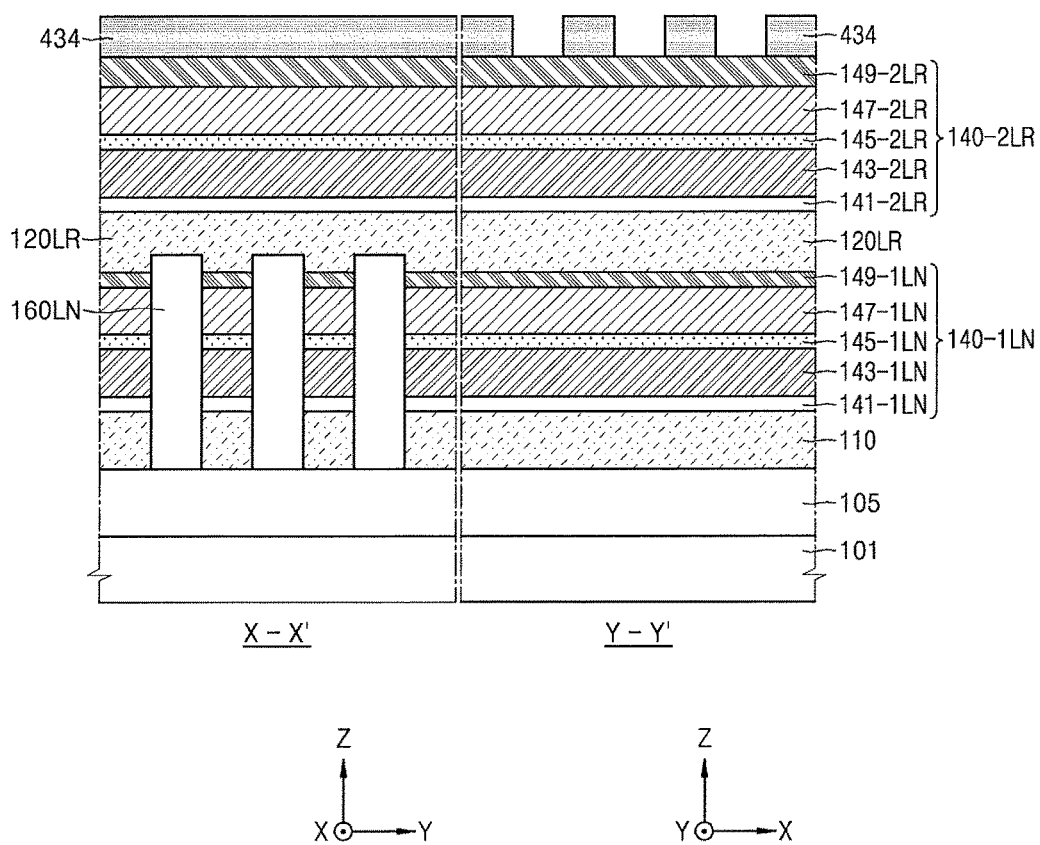
FIGS. 23A to 23F illustrate cross-sectional views of stages in a method of manufacturing a memory device according to a process sequence, according to another embodiment.

Referring to FIG. 23A, a second memory cell stack structure 140-2LR for forming a cross-point array may be formed by sequentially stacking a preliminary bottom electrode layer 141-2LR, a preliminary selection device layer 143-2LR, a preliminary middle electrode layer 145-2LR, a preliminary variable device layer 147-2LR, and a preliminary top electrode layer 149-2LR on a second conductive layer 120LR covering the plurality of memory cell stack lines 140-1LN and the insulation layer 160LN of FIG. 20E. Next, a second mask pattern 434 is formed on the second memory cell stack structure 140-2LR. The second mask pattern 434 may include a plurality of line patterns that extend in parallel in a second direction (the Y direction).

Figure 23B:
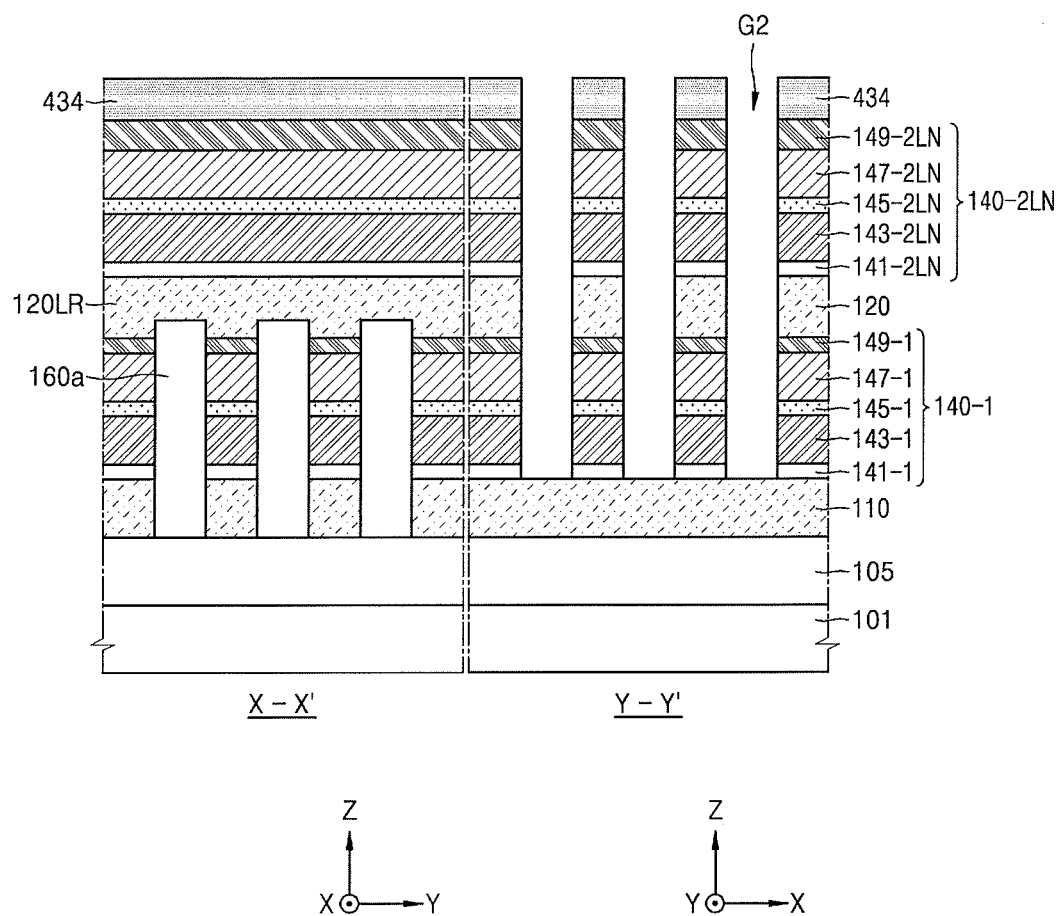

In FIGS. 23A and 23B, the second memory cell stack structure 140-2LR is stacked on the second conductive layer 120LR of FIG. 20E. The first memory cell stack line 140-1LN, the second conductive layer 120LR, and the second memory cell stack structure 140-2LR may be etched by using one mask pattern. In an implementation, a patterning process for the first memory cell stack line 140-1LN and a gap-fill process for a first insulating structure may be first performed, and a patterning process for the second memory cell stack structure 140-2LR and a gap-fill process for a second insulating structure are subsequently performed. Details will be described below.

Referring to FIG. 23B, the second memory cell stack structure 140-2LR, the second conductive layer 120LR, and the first memory cell stack line 140-1LN of FIG. 23A may be sequentially etched by using the second mask pattern 434 as an etch mask. As a result, the second memory cell stack structure 140-2LR of FIG. 23A may be divided into a plurality of second memory cell stack lines 140-2LN that extend in parallel in the second direction (the Y direction), and the second conductive layer 120LR of FIG. 23A may be divided into a plurality of second conductive lines 120. The first memory stack line 140-1LN may be divided into a plurality of first memory cells 140-1. Accordingly, a plurality of first gaps G2 extending in parallel in the second direction (the Y direction) may be respectively formed between every two adjacent second conductive lines 120 from among the plurality of second conductive lines 120 and also respectively formed between every two adjacent second memory cell stack lines 140-2LN from among the plurality of second memory cell stack lines 140-2LN. Each of the plurality of memory cell stack lines 140-2LN may have a structure where a bottom electrode line 141-2LN, a selection device line 143-2LN, a middle electrode line 145-2LN, a variable device line 147-2LN, and a top electrode line 149-2LN are stacked.

Figure 23C:
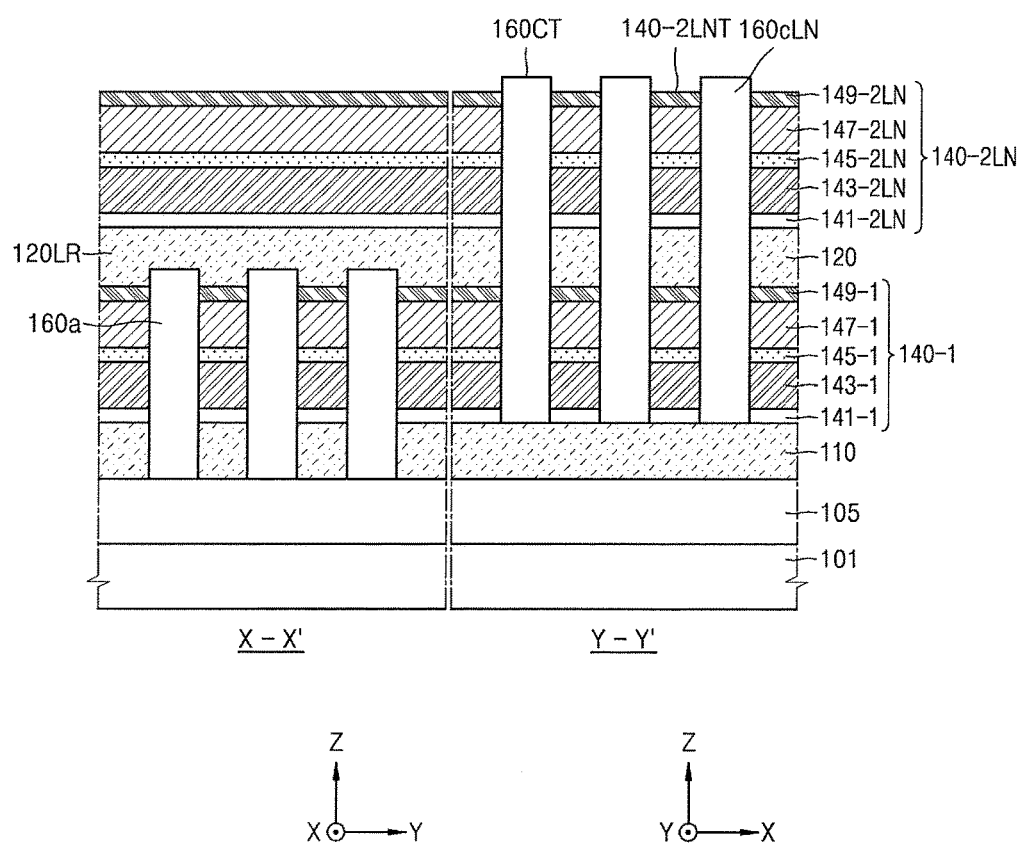

Referring to FIG. 23C, a gap-fill insulation layer may fill the plurality of second gaps G2 of FIG. 23B and cover the second mask pattern 434. Next, a top surface 140-2LNT of the top electrode line 149-2LN may be controlled to be lower than a top surface 160cT of an insulation line 160cLN by using the method described with reference to FIGS. 20A to 22D.

Figure 23D:
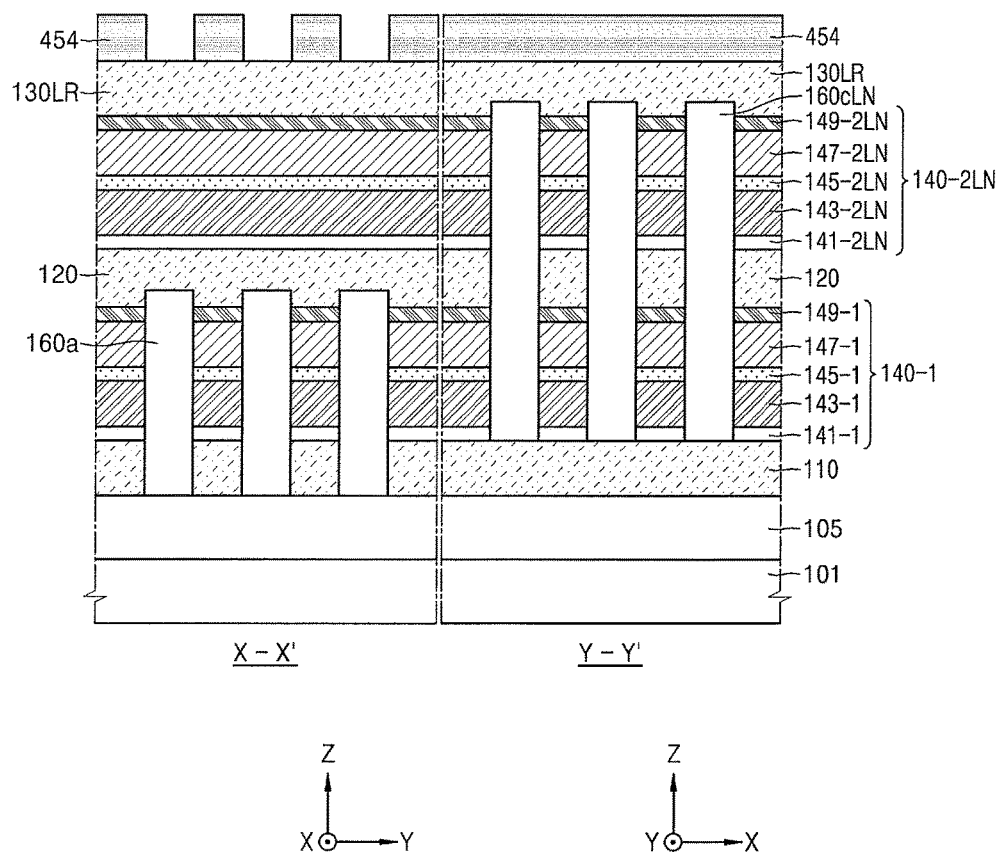

Referring to FIG. 23D, a third conductive layer 130LR may be formed on an exposed top surface of the top electrode line 149-2LN and protruding top surfaces of a plurality of insulating lines 160cLN. In this case, the top surface 140-2LNT of the top electrode line 149-2LN may be lower than the top surface 160cT of the insulation line 160cLN, and a bottom surface of the third conductive layer 130LR may include a plurality of convex portions and a plurality of concave portions. For example, the top surface 140-2LNT of the top electrode line 149-2LN may be connected to the convex portions of the bottom surface of the third conductive layer 130LR. In addition, the top surface 160cT of the insulation line 160cLN may be connected to the concave portions of the bottom surface of the third conductive layer 130LR. A level difference between the top surface 140-2LNT of the top electrode line 149-2LN and the top surface 160cT of the insulation line 160cLN may be used as a vertical axis path of a heat transmission path described with reference to FIGS. 14 and 15. Next, a third mask pattern 454 may be formed on the third conductive layer 130LR. The third mask pattern 434 may include a plurality of line patterns that extend in parallel in the first direction (the X direction). The third conductive layer 130LR, the plurality of memory cell stack lines 140-2LN, and the plurality of insulation lines 160LN may be etched by using the third mask pattern 454 as an etch mask to form a plurality of line patterns in the first direction (the X direction).

Figure 23E:
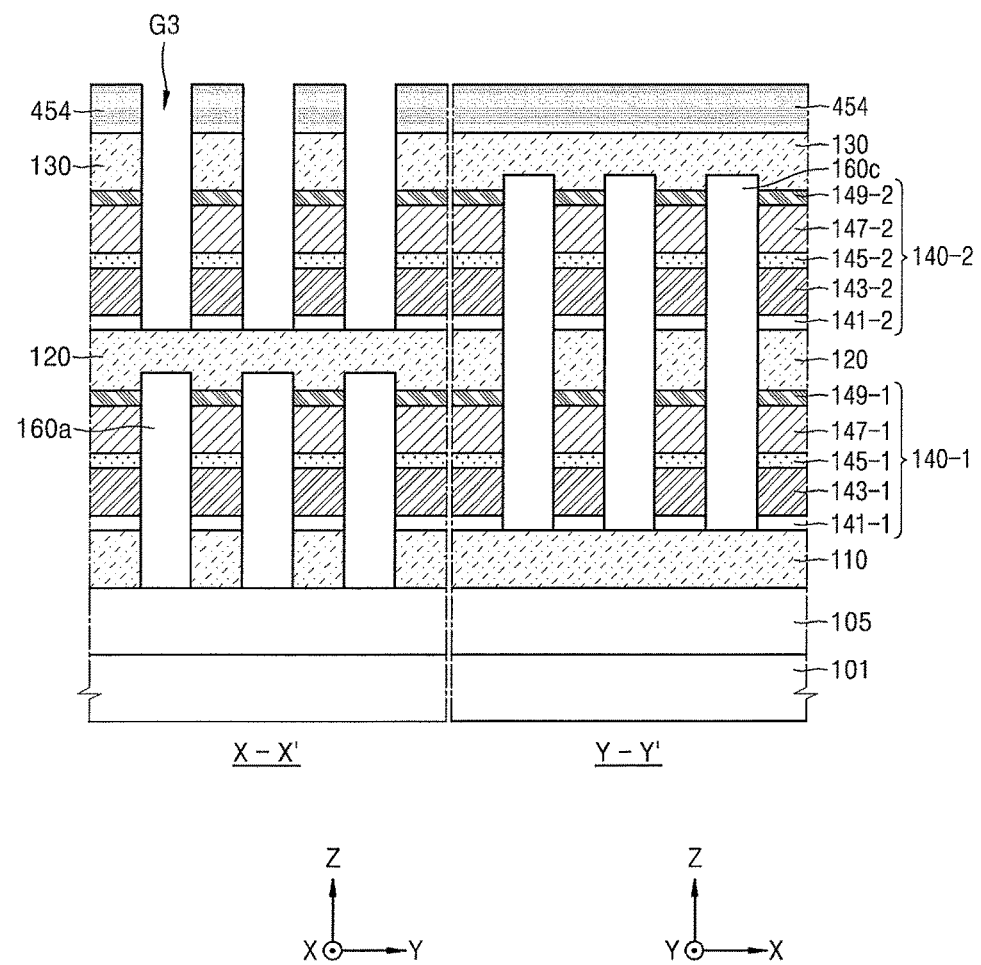

Referring to FIG. 23E, a plurality of third conductive lines 130 may be formed, and a plurality of memory cells 140-2 may be formed at a plurality of cross points between the plurality of second conductive lines 120 and the plurality of third conductive lines 130. A plurality of third gaps G3 may be respectively formed between every two adjacent memory cells 140-1 from among the plurality of memory cells 140-1 arranged in a line in the first direction (the X direction), and also respectively formed between every two third conductive lines from among the plurality of third conductive lines 120 arranged in a line in the first direction (the X direction).

Figure 23F:
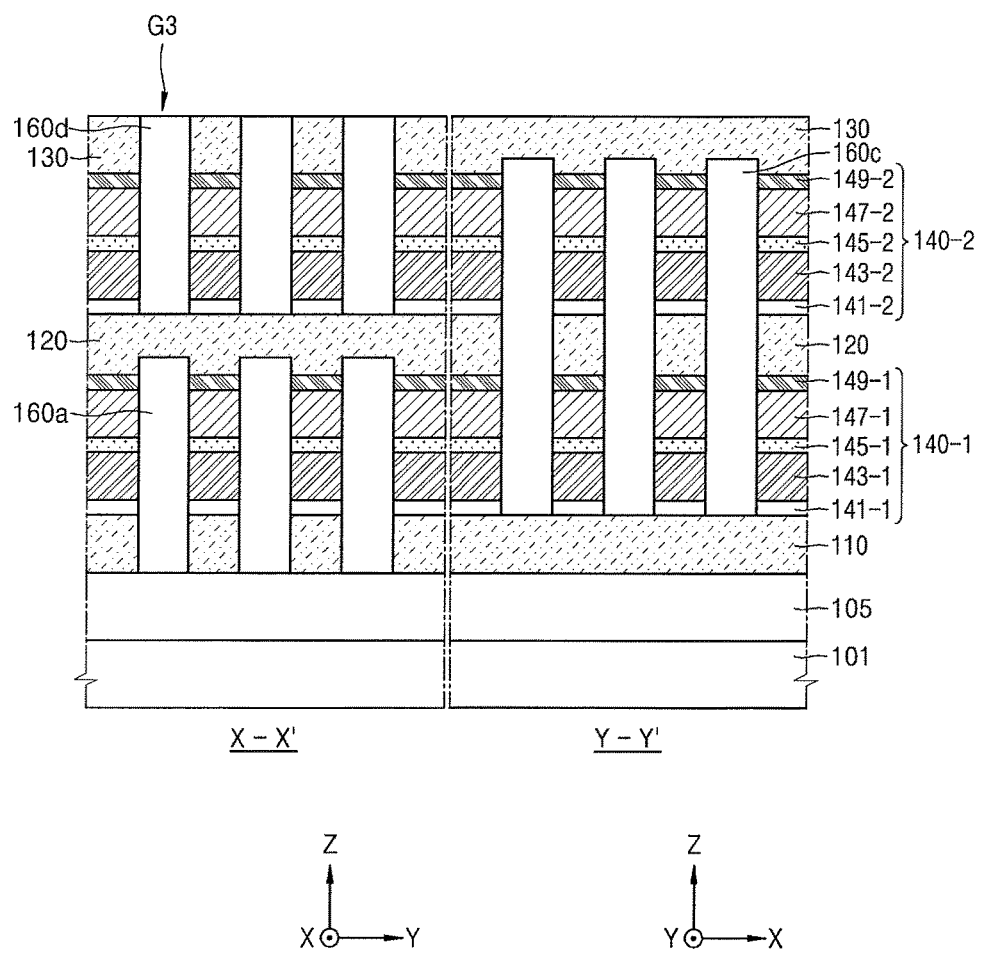

Referring to FIG. 23F, a gap-fill insulation layer that fills the plurality of third gaps G3 of FIG. 23E and covers the plurality of third conductive lines 130 may be formed. Next, the gap-fill insulation layer may be polished by a CMP process by using the plurality of third conductive lines 130 as a polishing stopper. Accordingly, a plurality of third insulating structures 160d that fills the plurality of third gaps G3 of FIG. 23E may be formed. Each of the third insulating structures 160d may be formed between every two adjacent memory cells 140-2 from among the plurality of memory cells 140-2 arranged in a line in the first direction (the X direction). The third insulating structures 160d may extend in parallel in the first direction (the X direction). Accordingly, the memory device 200a shown in FIGS. 14 to 15 may be manufactured. As described above, in FIGS. 23A and 23B, in an implementation, the first memory cell 140-1and the second memory cell stack line 140-2LN may be etched by using one mask pattern.

In an implementation, as in FIGS. 20E to 20H, a mask pattern may be directly formed on the second conductive layer 120LR of FIG. 20E, and the first memory cells 140-1 may be first formed at cross points between the first conductive lines 110 extending in parallel in the first direction (the X direction) and the second conductive lines 120 extending in parallel in the second direction (the Y direction). Next, a lower structure of the second insulating structure 160c of FIG. 14 may be formed by filling a plurality of gaps between the second conductive lines 120. Next, the second memory cell stack structure 140-2LR, in which the preliminary bottom electrode layer 141-2LR, the preliminary selection device layer 143-2LR, the preliminary middle electrode layer 145-2LR, the preliminary variable device layer 147-2LR, and the preliminary top electrode layer 149-2LR are stacked in this stated order, may be formed on the second conductive layer 120 and the lower structure of the second insulating structure 160d of FIG. 14

A mask pattern may be formed on the second memory cell stack structure 140-2LR, and a plurality of gaps extending in the second direction (the Y direction) may be formed. A top structure of the second insulating structure 160c of FIG. 14 may be formed by filling the plurality of gaps. Before the formation of the second conductive layer 120LR, a mask pattern may be directly formed on the first memory cell stack line 140-1LN and the plurality of first memory cells 140-1 may be first formed. In this case, the second conductive layer 120LR and the second memory cell stack structure 140-2LR may be etched by using one mask pattern. Next, the memory device 200a may be formed through subsequent process steps as shown in FIGS. 23C to 23F. Although the method of manufacturing the memory device 200a of FIGS. 14 and 15 has been described with reference to FIGS. 23A to 23F, the memory device 200b of FIGS. 16 and 17 and the memory device 200c of FIGS. 18 and 19 may also be manufactured by using the manufacturing method described with reference to FIGS. 23A to 23F.

Figure 24:
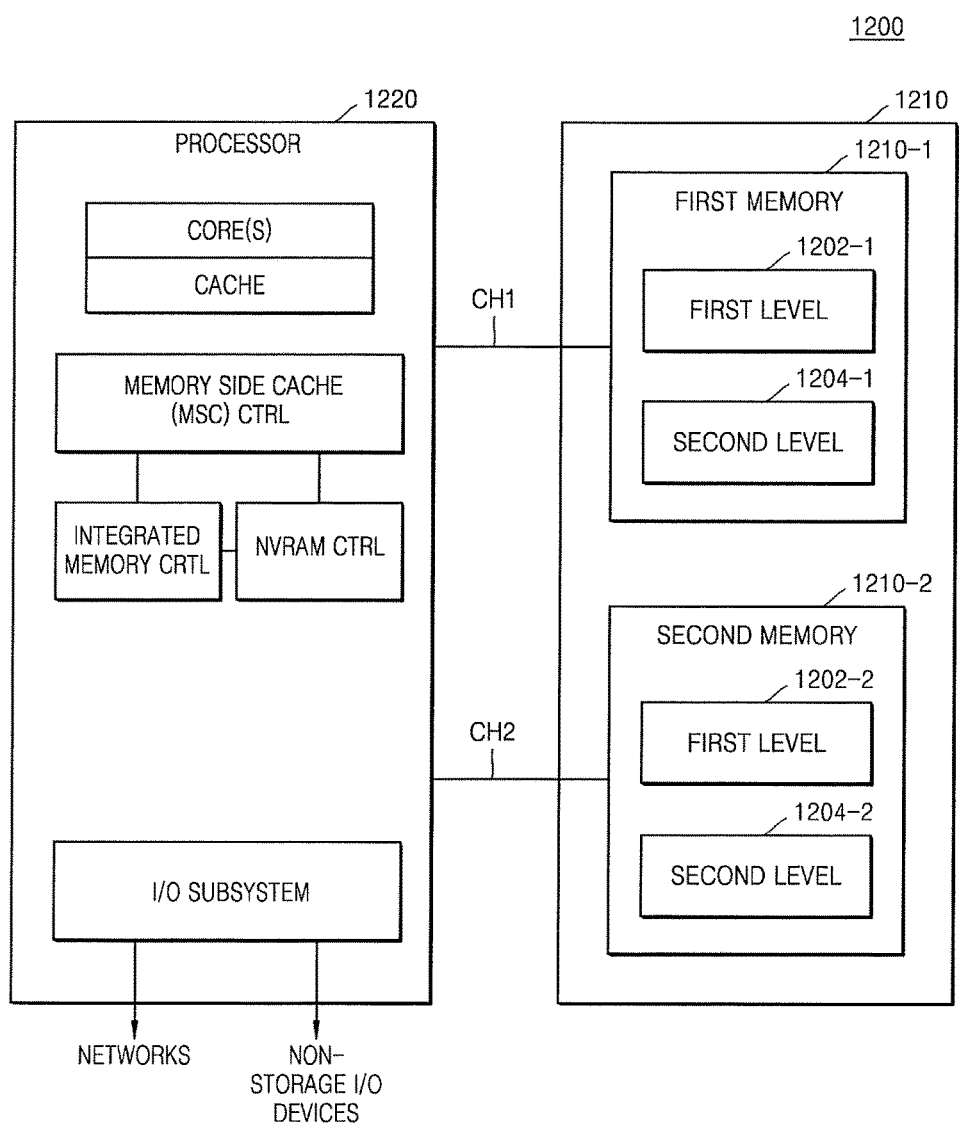
FIG. 24 illustrates a block diagram of a computer system according to an embodiment.

FIG. 24 illustrates a block diagram of a computer system according to an embodiment.

Referring to FIG. 24, a computer system 1200 may include a processor 1220 and a memory system 1210. The processor 1220 may include a plurality of cores, which execute commands and process data, and one or more processor caches for storing the commands and the data. Also, the processor 1220 may include a memory controller for controlling memories of the memory system 1210 and a cache. For example, the processor 1220 may include a memory side cache (MSC) controller, a nonvolatile RAM controller, and an integrated memory controller. Also, the processor 1220 may include an I/O subsystem, and in this case, the processor 1220 may communicate with an external network and/or non-storage I/O devices through the I/O subsystem. The memory system 1210 may include a first memory device 1210-1 and a second memory device 1210-2. The first memory device 1210-1 and the second memory device 1210-2 may be distinguished depending on channels connected to the processor 220. The first memory device 1210-1 may be connected to the processor 1220 through a first channel CH1. The first memory device 1210-1 may internally include two kinds of memories. For example, the first memory device 1210-1 may include a first level memory 1202-1 and a second level memory 1204-1. The first level memory 1202-1 may have a first operation speed, for example, a first read access speed and a first write access speed. The second level memory 1204-1 may have a second operation speed, for example, a second read access speed and a second write access speed. Here, the first operation speed may be faster than the second operation speed. The first level memory 1202-1 which is relatively faster in operation may be used for a command or data stored in the second level memory 1204-1. The second memory device 1210-2 may be connected to the processor 1220 through a second channel CH2. Also, the second memory device 1210-2 may internally include two kinds of memories. For example, the second memory device 1210-2 may include a first level memory 1202-2 and a second level memory 1204-2. The first level memory 1202-2 may have the first operation speed, and the second level memory 1204-2 may have the second operation speed. Even in the second memory device 1210-2, the first level memory 1202-2, which has relatively faster operation speed, may be used for a command or data stored in the second level memory 1204-2. The first level memories 1202-1 and 1202-2 may each include, for example, DRAM. Also, the second level memories 1204-1 and 1204-2 may each include, for example, nonvolatile RAM. Examples of the nonvolatile RAM may include, e.g., phase-change random access memory (PRAM), resistive random access memory (Re-RAM), magnetoresistive random access memory (MRAM), etc. Also, the nonvolatile RAM may include at least one of the memory device 100, 100a, 100a', 100a1, 100a2, 100a3, 100a4, 100b, 100c, 200, 200a, 200b, and 200c illustrated in FIGS. 1 to 4A and 5A to 19.

By way of summation and review, due to the greater downscaling of the cross-point stack memory device, it may be desirable to reduce a dimension of each layer in the memory device. Accordingly, suppression of cross-talk between adjacent cells to secure the reliability of the memory device may be desirable.

The embodiments may provide a resistance change memory device having a three-dimensional (3D) cross-point structure.

The embodiments may provide a memory device in which thermal cross-talk between adjacent memory cells may be suppressed and thus the reliability of the memory device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a plurality of first conductive lines on a substrate, the first conductive lines being spaced apart from each other and extending in a first direction;
a plurality of second conductive lines on the plurality of first conductive lines, the second conductive lines being spaced apart from each other and extending in a second direction that is different from the first direction;
a plurality of first memory cells respectively arranged at a plurality of cross points between the plurality of first conductive lines and the plurality of second conductive lines, each of the first memory cells having a structure that includes a first selection device layer, a first middle electrode layer, a first variable resistance layer, and a first top electrode layer sequentially stacked in this stated order; and
a plurality of first insulating structures arranged alternately with the plurality of first memory cells in the second direction under the plurality of second conductive lines,
wherein:
each of the first insulating structures has a top surface that is higher than a top surface of the first top electrode layer,
each of the second conductive lines has a structure that includes a plurality of convex portions and a plurality of concave portions, the plurality of convex portions being connected to the top surface of the first top electrode layer and the plurality of concave portions accommodating the first insulating structures between the plurality of convex portions, and
a thickness of the first top electrode layer is greater than a thickness of the first middle electrode layer.

2. The memory device as claimed in claim 1, wherein:
each of the first insulating structures includes a first base portion lower than a level of an interface between the first variable resistance layer and the first top electrode layer and a first hill portion higher than the level of the interface between the first variable resistance layer and the first top electrode layer,
the first base portion overlaps a side surface of the first variable resistance layer, and the first hill portion overlaps a side surface of the first top electrode layer and side surfaces of the convex portions and extends in the concave portions.

3. The memory device as claimed in claim 2, wherein a height of the first hill portion is about 50 Å to about 500 Å.

4. The memory device as claimed in claim 2, wherein a height of the first hill portion is about 500 Å to about 1,000 Å.

5. The memory device as claimed in claim 1, wherein a width of each of the convex portions is equal to a width of the first top electrode layer.

6. The memory device as claimed in claim 1, further comprising:
a plurality of third conductive lines on the plurality of second conductive lines, the third conductive lines being spaced apart from each other and extending in a third direction that is different from the second direction;
a plurality of second memory cells respectively arranged at a plurality of cross points between the plurality of second conductive lines and the plurality of third conductive lines, each of the plurality of second memory cells having a structure that includes a second selection device layer, a second middle electrode layer, a second variable resistance layer, and a second top electrode layer sequentially stacked in this stated order; and
a plurality of second insulating structures arranged alternately with the plurality of second memory cells in the third direction under the plurality of third conductive lines.

7. The memory device as claimed in claim 6, wherein:
each of the second insulating structures has a top surface higher than a top surface of the second top electrode layer, and
each of the third conductive lines has a structure that includes a plurality of convex portions and a plurality of concave portions, wherein the plurality the convex portions are connected to the top surface of the second top electrode layer, and the plurality of concave portions accommodate the second insulating structures between the plurality of convex portions.

8. The memory device as claimed in claim 7, wherein a thickness of the second top electrode layer is greater than a thickness of the second middle electrode layer.

9. The memory device as claimed in claim 6, wherein a thickness of the second top electrode layer is greater than a thickness of the second middle electrode layer.

10. The memory device as claimed in claim 6, wherein the second insulating structures overlap side surfaces of the first and second memory cells.

11. The memory device as claimed in claim 1, wherein the first variable resistance layer has any one selected from a single layer structure, a multilayer structure, and a super lattice structure that includes a plurality of layers repeatedly stacked on one another.

12. The memory device as claimed in claim 11, wherein the super lattice structure includes a first layer including germanium-tellurium and a second layer including antimony-tellurium, the first layer and the second layer being repeatedly stacked on each other.

13. The memory device as claimed in claim 1, wherein the first variable resistance layer includes a chalcogenide-based material.

14. The memory device as claimed in claim 1, wherein the first variable resistance layer includes at least one selected from germanium-antimony-tellurium, indium-antimony-tellurium, and bismuth-antimony-tellurium.

15. The memory device as claimed in claim 1, wherein the first top electrode layer includes a carbon-based conductive material.

16. The memory device as claimed in claim 1, wherein the first variable resistance layer has any one selected from a pillar structure, a horn structure, an L-type structure, and a dash structure.

17. The memory device as claimed in claim 1, wherein the first selection device layer includes any one selected from an ovonic threshold switching device, a diode, and a transistor.

18. The memory device as claimed in claim 1, wherein the first selection device layer includes arsenic (As) and at least two of silicon (Si), germanium (Ge), antimony (Sb), tellurium (Te), selenium (Se), indium (In), and tin (Sn), or includes Se and at least two of Si, Ge, Sb, Te, As, In, and Sn.

19. The memory device as claimed in claim 1, further comprising an integrated circuit layer on the substrate under a first electrode line layer.

20. A memory device, comprising:
a plurality of first conductive lines on a substrate, the first conductive lines being spaced apart from each other and extending in a first direction;
a plurality of second conductive lines on the plurality of first conductive lines, the second conductive lines being spaced apart from each other and extending in a second direction different from the first direction; and
a plurality of first memory cells respectively arranged at a plurality of cross points between the plurality of first conductive lines and the plurality of second conductive lines, each of the plurality of first memory cells having a structure that includes a first selection device layer, a first middle electrode layer, a first variable resistance layer, and a first top electrode layer sequentially stacked in this stated order,
wherein a thickness of the first top electrode layer is greater than a thickness of the first middle electrode layer.

21. The memory device as claimed in claim 20, wherein the thickness of the first top electrode layer is about 50 Å to about 500 Å.

22. The memory device as claimed in claim 20, further comprising:
a plurality of third conductive lines on the plurality of second conductive lines, the third conductive lines being spaced apart from each other and extending in a third direction perpendicular to the second direction; and
a plurality of second memory cells respectively arranged at a plurality of cross points between the plurality of second conductive lines and the plurality of third conductive lines, each of the plurality of second memory cells having a structure that includes a second selection device layer, a second middle electrode layer, a second variable resistance layer, and a second top electrode layer sequentially stacked in this stated order.

23. The memory device as claimed in claim 22, wherein a thickness of the second top electrode layer is greater than a thickness of the second middle electrode layer.

24. The memory device as claimed in claim 23, wherein:
the memory device further includes a plurality of second insulating structures arranged alternately with the plurality of second memory cells in the third direction under the plurality of third conductive lines, each of the second insulating structures having a top surface that is higher than a top surface of the second top electrode layer, and
each of the third conductive lines has a structure that includes a plurality of convex portions and a plurality of concave portions, the plurality of convex portions being connected to the top surface of the second top electrode layer, and the plurality of concave portions accommodating the second insulating structures between the plurality of convex portions.

25. The memory device as claimed in claim 22, wherein: the memory device further includes a plurality of second insulating structures arranged alternately with the plurality of second memory cells in the third direction under the plurality of third conductive lines, each of the second insulating structures having a top surface higher than a top surface of the second top electrode layer, and each of the third conductive lines has a structure that includes a plurality of convex portions and a plurality of concave portions, the plurality of convex portions being connected to the top surface of the second top electrode layer, and the plurality of concave portions accommodating the second insulating structures between the plurality of convex portions.

26. A memory device, comprising:
a plurality of first conductive lines on a substrate, the first conductive lines being spaced apart from each other and extending in a first direction;
a plurality of second conductive lines on the plurality of first conductive lines, the second conductive lines being spaced apart from each other and extending in a second direction that is different from the first direction;
a plurality of first memory cells respectively arranged at a plurality of cross points between the plurality of first conductive lines and the plurality of second conductive lines, each of the first memory cells having a structure that includes a first selection device layer, a first middle electrode layer, a first variable resistance layer, and a first top electrode layer sequentially stacked in this stated order; and
a plurality of first insulating structures arranged alternately with the plurality of first memory cells in the second direction under the plurality of second conductive lines,
wherein a distance, in a third direction, from the substrate to distal surfaces of the first insulating structures is greater than a distance from the substrate to an interface between the first variable resistance layer and the first top electrode layer, and
wherein a thickness of the first top electrode layer is greater than a thickness of the first middle electrode layer.

27. The memory device as claimed in claim 26, wherein each of the second conductive lines has a structure that includes a plurality of convex portions and a plurality of concave portions, the plurality of convex portions being connected to a top surface of the first top electrode layer and the plurality of concave portions accommodating the first insulating structures between the plurality of convex portions.

* * * * *